United States Patent
Ishigaki et al.

(10) Patent No.: US 6,831,852 B2
(45) Date of Patent: Dec. 14, 2004

(54) SEMICONDUCTOR MEMORY DEVICE HAVING A LATCH CIRCUIT AND STORAGE CAPACITOR

(75) Inventors: Yoshiyuki Ishigaki, Hyogo (JP); Tsuyoshi Koga, Hyogo (JP); Yasuhiro Fujii, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/442,439

(22) Filed: May 22, 2003

(65) Prior Publication Data

US 2004/0120179 A1 Jun. 24, 2004

(30) Foreign Application Priority Data

Dec. 20, 2002 (JP) ........................ 2002-370446

(51) Int. Cl.[7] .......................... G11C 11/24; G11C 7/00
(52) U.S. Cl. .................. 365/149; 365/189.05
(58) Field of Search .................. 365/149, 154, 365/103, 102, 104, 189.05, 230.08

(56) References Cited

U.S. PATENT DOCUMENTS

| | | | |
|---|---|---|---|
| 5,805,494 A | * | 9/1998 | El-Kareh et al. ........... 365/149 |
| 6,236,598 B1 | * | 5/2001 | Chou .................... 365/189.06 |
| 6,271,569 B1 | * | 8/2001 | Ishigaki et al. ............. 365/154 |

FOREIGN PATENT DOCUMENTS

| | | |
|---|---|---|
| JP | 63-285794 | 11/1988 |
| JP | 3-34191 | 2/1991 |
| JP | 6-216345 | 8/1994 |

* cited by examiner

*Primary Examiner*—Thong Q. Le
(74) *Attorney, Agent, or Firm*—McDermott Will & Emery LLP

(57) ABSTRACT

A semiconductor device includes: a capacitor: an access transistor with impurity regions, controlling input/output of charge stored in the capacitor, one of the impurity regions being electrically connected to the capacitor; a latch circuit located above a silicon substrate, and storing the potential of a storage node of the capacitor; and a bit line connected to the other of the impurity regions of the access transistor T6. At least a portion of the latch circuit is formed above the bit line.

17 Claims, 52 Drawing Sheets

SEMICONDUCTOR MEMORY DEVICE HAVING A LATCH CIRCUIT AND STORAGE CAPACITOR

BACKGROUND OF THE INVENTION

1. Field of the Invention

The present invention relates to a semiconductor memory device and a semiconductor device. Particularly, the present invention relates to a semiconductor device including a latch circuit.

2. Description of the Background Art

Conventionally, a DRAM (Dynamic Random Access Memory) is known as one type of semiconductor memory device. Also, a SRAM (Static Random Access Memory) is known as another type of semiconductor memory device. (Refer to Document 1 (Japanese Patent Laying-Open No. 3-34191) and Document 2 (Japanese Patent Laying-Open No. 63-285794).)

In such conventional DRAMs, the charge stored in a capacitor will leak from a storage node to a semiconductor substrate through a well at an elapse of a predetermined period of time, whereby the charge in the capacitor is lost. Leakage and loss of charge implies that information is lost. To prevent such loss, a refresh operation to restore the charge of a capacitor is effected at a predetermined cycle before the charge is completely lost in a DRAM. This requirement for a refresh operation of the circuitry as well as the requirement for constant operation to retain the storage even in a standby state has become the major factor of increasing the power consumption in a DRAM. A "standby state" implies a state where no access is made from an external source and only power supply is applied to the memory cell.

The SRAM is known as a semiconductor memory device that does not require the above-described refresh operation. However, a SRAM is disadvantageous in that six transistors per one memory cell must be formed on a silicon substrate. There was a problem that the memory size is extremely larger than that of a DRAM.

The conventional SRAM is also disadvantageous in that the charge capacity of the storage node is small, susceptible to soft errors. "Soft error" is a phenomenon in which alpha particles entering the silicon substrate generate of electron-hole pairs to alter the stored charge in the storage node, resulting in loss of stored data.

SUMMARY OF THE INVENTION

An object of the present invention is to provide a semiconductor device that does not require a refresh operation.

Another object of the present invention is to provide a semiconductor device of high reliability, more tolerant to the above-described soft error phenomenon in a semiconductor device.

According to an aspect of the present invention, a semiconductor memory device includes: a capacitor storing charge according to a logic level of binary information, located above a semiconductor substrate, and having a storage node; an access transistor controlling input/output of charge stored in the capacitor, located at the surface of the semiconductor substrate, and having a pair of impurity regions, one of the pair of impurity regions being connected to the capacitor; a latch circuit retaining the potential of the storage node of the capacitor, located on the semiconductor substrate; and a bit line connected to the other of the pair of impurity regions of the access transistor. At least a portion of the latch circuit is provided above the bit line.

In the semiconductor memory device of the above-described structure, a latch circuit to retain the potential of the storage node of the capacitor is provided. It is no longer necessary to conduct a refresh operation since the potential of the capacitor is retained by the latch circuit. Since the charge corresponding to a logic level of binary information is held by a capacitor, resistance to soft error caused by alpha particles is improved as compared to a semiconductor device having charge stored in the storage node as in a conventional SRAM.

Furthermore, the provision of at least a portion of the latch circuit above the bit line allows the semiconductor to be reduced in size.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
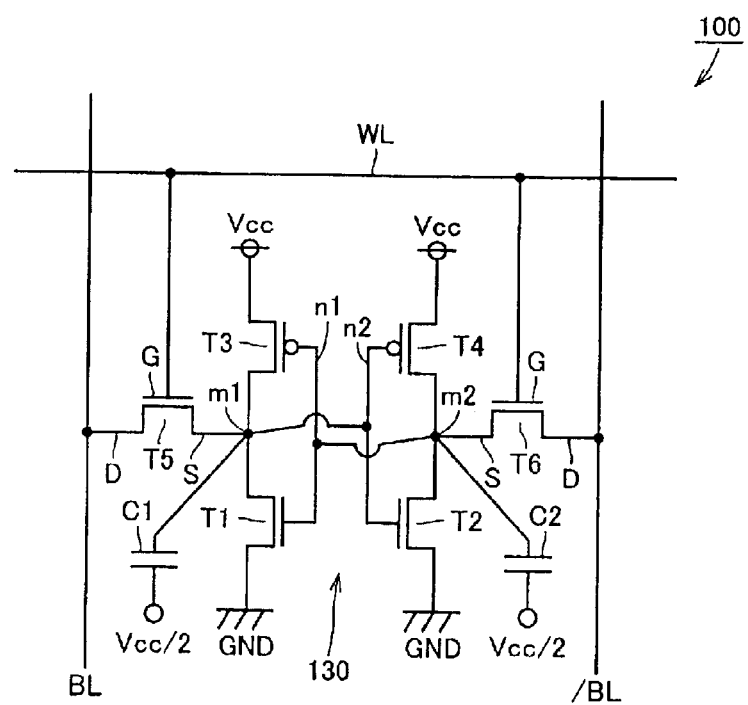
FIG. 1 is an equivalent circuit diagram of a semiconductor device according to a first embodiment of the present invention.

Embodiments of the present invention will be described hereinafter with reference to the drawings. In the following, the same or corresponding components have the same reference characters allotted, and description thereof will not be repeated.

First Embodiment

Referring to FIG. 1, a semiconductor device 100 configured as a semiconductor memory device according to a first embodiment of the present invention includes a pair of bit lines BL and /BL, a word line WL, and a latch circuit 130.

Each pair of bit lines BL and /BL is connected to a pair of access transistors T5 and T6. Access transistor T5 has its drain region D connected to bit line BL, its source region S connected to a capacitor C1, and a gate electrode G connected to word line WL.

Access transistor T6 has its drain region D connected to bit line /BL, its source region S connected to a capacitor C2, and a gate electrode G connected to word line WL.

Access transistor T5 and capacitor C1 correspond to a memory cell in the DRAM. Access transistor T6 and capacitor C2 correspond to a memory cell in the DRAM. The power supply of potential Vcc is connected to p channel type load transistors T3 and T4. Driver transistors T1 and T2 are connected to load transistors T3 and T4. A storage node n1 is shared by driver transistor T1 and load transistor T3. A storage node n2 is shared by driver transistor T2 and load transistor T4.

Load transistor T3 and driver transistor T1 form one of a CMOS (Complementary Metal Oxide Semiconductor) inverter, whereas driver transistor T2 and load transistor T4 form the other CMOS inverter. These two CMOS inverters constitute a flip-flop circuit, which is a latch circuit 130 for the memory cells of the DRAM. Latch circuit 130 is formed at the surface of a semiconductor substrate and over an interlayer insulation film.

Figure 2:
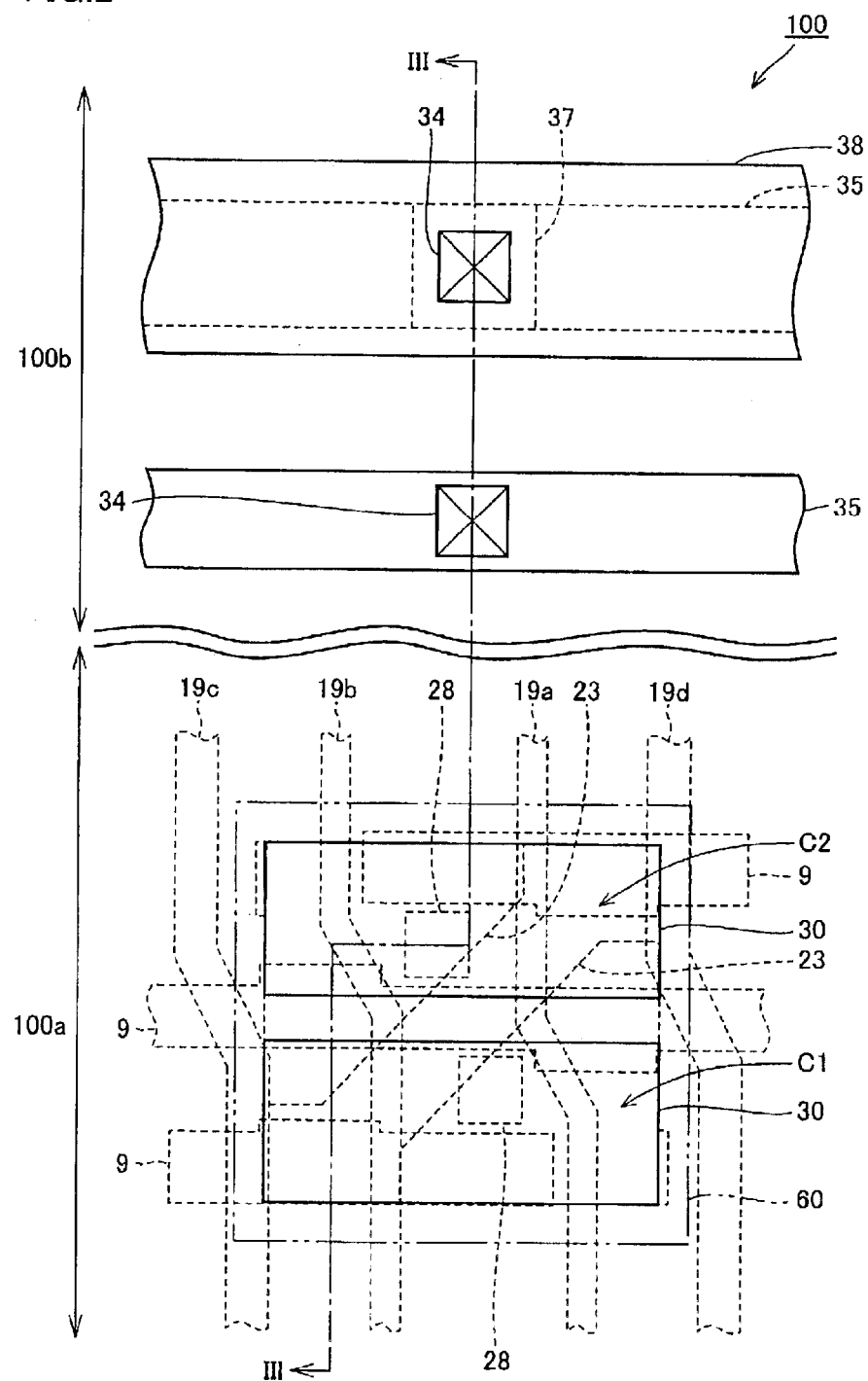
FIG. 2 is a plan view of the semiconductor device of the first embodiment.
Figure 3:
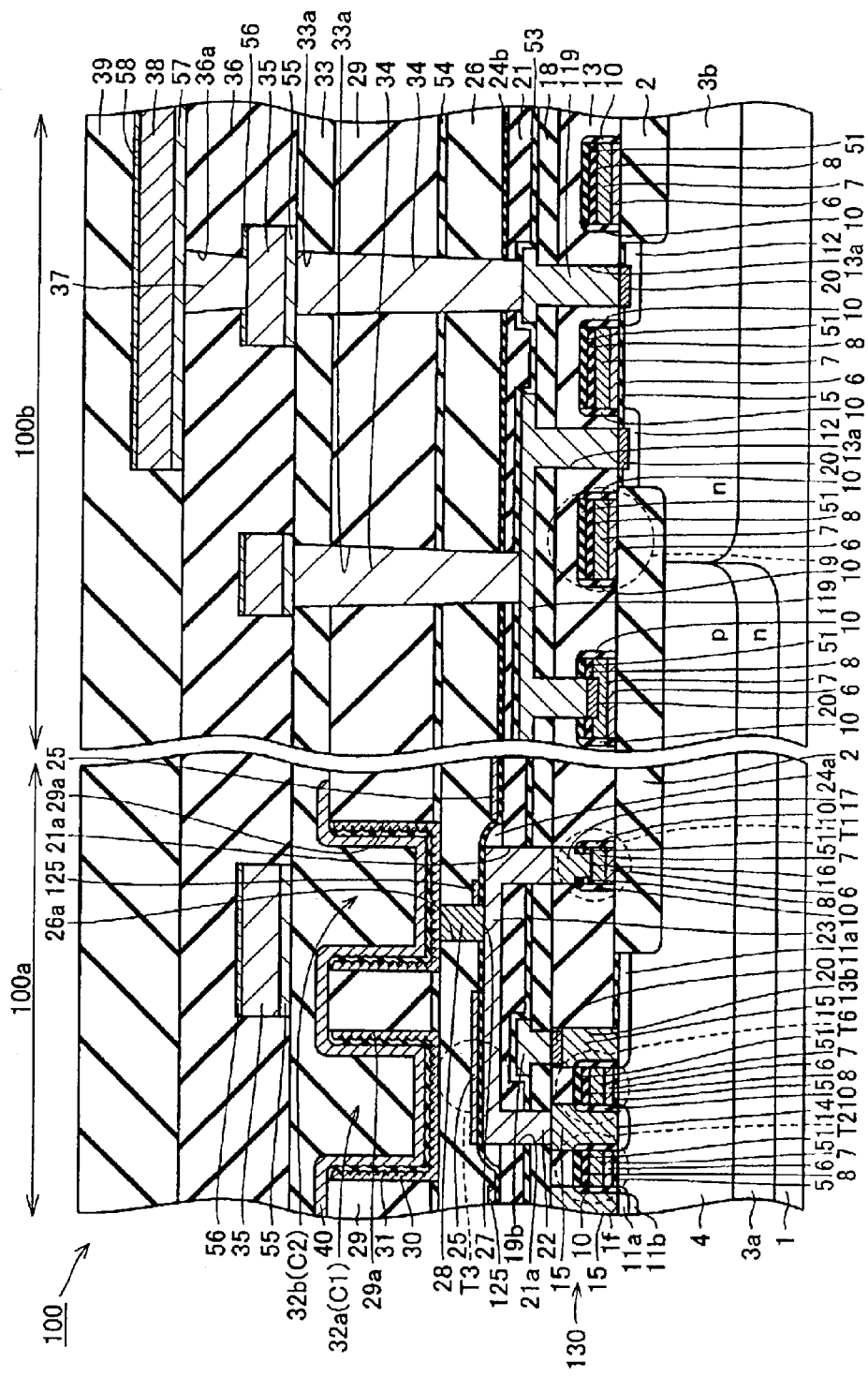
FIG. 3 is a sectional view of the semiconductor device of FIG. 2 taken along line III—III.

Referring to FIGS. 2 and 3, an element isolation region 2 isolating respective element regions is provided on a silicon substrate 1 identified as a semiconductor substrate. A bottom n type well region 3a, an n type well region 3b and a p type well region 4 are provided in silicon substrate 1 below the element region. Also, a gate oxide film 5 identified as a gate insulation film is provided so as to form contact with silicon substrate 1 where the transistor is formed. A doped polysilicon layer 6 is located on gate oxide film 5. A tungsten silicide layer 7 is located on doped polysilicon layer 6. Furthermore, a silicon oxide film 8 and a silicon nitride film 51 are stacked on tungsten silicide layer 7 in a contacting manner. A gate electrode 9 includes doped polysilicon layer 6 and tungsten silicide layer 7. At the sidewall of gate electrode 9, a sidewall insulation film 10 is provided to insulate gate electrode 9. The top plane of gate electrode 9 is insulated by silicon oxide film 8 and silicon nitride film 51.

In p type well region 4, there are arranged a low concentration impurity region 11a identified as source and drain regions having low concentration of n type impurities, and a high concentration impurity region 11b identified as source and drain regions having high concentration of n type impurities. Also, an impurity region 12 identified as source and drain regions including p type impurities is arranged in n type well region 3b.

An interlayer insulation film 13 formed of a silicon oxide film is disposed so as to cover these impurity regions and the well region. A plurality of contact holes 13a are formed in interlayer insulation film 13.

At the bottom of some of contact holes 13a, a buried contact 20 is formed in contact with silicon substrate 1. A polypad 15 is provided on a buried contact 14.

A polypad 17 is arranged as a conduction path on gate electrode 9 so as to conduct with tungsten silicide layer 7 of gate electrode 9. The contacting portion between polypad 17 and gate electrode 9 is identified as a buried contact 22. On buried contact 22 is provided an electrode for a thin film transistor (TFT), i.e., a TFT gate electrode 23 as a TFT electrode. This TFT gate electrode 23 functions as the gate electrode of a load transistor in an inverter forming a flip-flop circuit identified as a latch circuit.

An interlayer insulation film 18 formed of a silicon oxide film is disposed so as to cover the upper faces of buried contact 14 on silicon substrate 1 and polypad 15 on silicon substrate 1. Tungsten interconnection 119, bit line 19b and buried contact 20 of tungsten silicide are arranged vertically through interlayer insulation film 18 so as to form contact with the underlying impurity region. A silicon nitride film 53 and an interlayer insulation film 21 formed of a silicon oxide film are stacked so as to cover the same.

TFT gate electrode 23 pierces silicon nitride film 53 and interlayer insulation film 21, and further extends vertically. At the sidewall of TFT gate electrode 23, a sidewall insulation film 24a is disposed. A TFT gate oxide film 24b is disposed above and in contact with TFT gate electrode 23. Additionally, TFT polycrystalline silicons 25 and 125 are disposed thereon. Therefore, the (bulk) transistor located at the surface of silicon substrate 1 and the above-described thin film transistor are arranged opposite to each other in the vertical direction.

An interlayer insulation film 26 formed of a silicon oxide film and a silicon nitride film 54 are provided so as to cover these TFTs. A buried contact 27 and a polypad 28 are disposed so as to conduct with TFT gate electrode 23 and so as to fill contact hole 26a located in interlayer insulation film 26. Buried contact 27 indicates the region where polypad 28 is brought into contact with TFT gate electrode 23.

A silicon nitride film 54 and an interlayer insulation film 29 are disposed on interlayer insulation film 26. A hole 29a is provided in interlayer insulation film 29 formed of a silicon oxide film. Cylindrical capacitors 32a (C1) and 32b (C2) are formed in hole 29a. A storage node 30 is provided in a continuous manner on top of polypad 28. A capacitor film 31 formed of a dielectric is deposited on storage node 30.

A cell plate 40 identified as a capacitor electrode is located on capacitor film 31. The potential of cell plate 40 is set to Vcc/2 in order to improve the reliability of the capacitor insulation film. In the case where the reliability of an insulation film is of no problem, the potential of cell plate 40 may be fixed to the potential of 0V, Vcc or another level.

It is desirable that storage node 30 is subjected to a roughening process in order to increase the capacitance of the capacitor. However, this roughening process is dispensable. An interlayer insulation film 33 formed of a silicon oxide film is provided so as to cover cell plate 40 and interlayer insulation film 29 identified as the upper electrode of the capacitor.

A contact hole 33a is formed so as to pierce interlayer insulation film 21, TFT gate oxide film 24b, interlayer insulation film 26, silicon nitride films 53 and 54, and interlayer insulation films 29 and 33. Contact hole 33a is filled with a metal contact 34. A metal interconnection 35 is provided on metal contact 34. Barrier layers 55 and 56 are provided above and below metal interconnection 35. Metal interconnection 35 is covered with an interlayer insulation film 36 formed of a silicon oxide film. A contact hole 36a is formed in interlayer insulation film 36. A metal contact 37 is formed so as to fill contact hole 36a. A barrier layer 57 is provided above and in contact with metal contact 37. A metal interconnection 38 and a barrier layer 58 are provided on barrier layer 57. A passivation film 39 is provided so as to cover metal interconnection 38 and barrier layer 58.

In the above-described structure, access transistor T6 is formed at the surface of silicon substrate 1. Capacitor 32b (C2) is formed above silicon substrate 1. Access transistor T6 has its gate electrode formed in interlayer insulation film 13 in contact with silicon substrate 1 with gate oxide film 5 therebetween. Interlayer insulation film 13 is termed "a lower interlayer insulation film". Interlayer insulation film 29 forming the capacitor is termed "an upper interlayer insulation film". Interlayer insulation film 26 located between the lower interlayer insulation film and the upper interlayer insulation film is termed "an intermediate interlayer insulation film".

Impurity region 11a identified as the source and drain regions of access transistor T6 and storage node 30 of capacitor 32b (C2) are electrically connected through buried contact 14, polypad 15, buried contact 22, TFT gate electrode 23, buried contact 27 and polypad 28. They form a conduction path. The terminal of the flip-flop circuit is connected to this conduction path. The potential of the storage node is maintained at a predetermined constant level. Driver transistor T2 and load transistor T3 that is a thin film transistor have their gate electrodes connected through buried contact 16 and polypad 17. Buried contact 16 on the gate electrode corresponds to the contacting portion between gate electrode 9 and polypad 17.

Semiconductor device 100 includes capacitors 32a (C1) and 32b (C2) located above silicon substrate 1. Capacitors 32a (C1) and 32b (C2) include a storage node 30 to retain charge corresponding to the logic level of binary information. Semiconductor device 100 further includes an access transistor T6 located at the surface of silicon substrate 1. Access transistor T6 includes a pair of impurity regions 11a to control the input/output of charge stored in capacitor 32b (C2). One of impurity regions 11a is electrically connected to capacitor 32b (C2). Semiconductor device 100 further includes a latch circuit (flip-flop circuit) 130 located on silicon substrate 1 to retain the potential of storage node 30 of capacitor 32b (C2), and a bit line 19b connected to the other of impurity regions 11a. Load transistor T3 which is a portion of latch circuit 130 is provided above bit line 19b. In other words, the distance from the main surface 1f of silicon substrate 1 to load transistor T3 is greater than the distance from main surface 1f to bit line 19b.

Latch circuit 130 is a flip-flop circuit including load transistor T3. Load transistor T3 is formed of a thin film transistor, and provided above bit line 19b.

Semiconductor device 100 further includes driver transistors T1 and T2 provided on silicon substrate 1, and first interlayer insulation film 13 covering driver transistors T1 and T2. Bit line 19*b* is provided on first interlayer insulation film 13. On interlayer insulation films 13 and 18 identified as the first interlayer insulation film is deposited an interlayer insulation film 21 identified as a second interlayer insulation film so as to cover bit line 19*b*.

Semiconductor device 100 further includes ground lines 19*c* and 19*d* connected to latch circuit 130. Ground lines 19*c* and 19*d* are fabricated in the same step as bit lines 19*a* and 19*b*. Ground lines 19*c* and 19*d* and bit lines 19*a* and 19*b* are formed of the same conductive layer located at substantially the same height from main surface 1*f*.

Semiconductor device 100 further includes an interlayer insulation film 29 with a hole 29*a*, covering silicon substrate 1. Capacitors 32*a* (C1) and 32*b* (C2) are provided in hole 29*a*. Capacitors 32*a* (C1) and 32*b* (C2) are provided above latch circuit 130. Accordingly, the degree of freedom of the designs of capacitors 32*a* (C1) and 32*b* (C2) increases. Also, semiconductor device 100 can be further reduced in size.

Capacitors 32*a* (C1) and 32*b* (C2) are overlapped with two bit lines 19 and 19*b* in plane.

Capacitors 32*a* (C1) and 32*b* (C2) have a capacitance of at least 6fF.

Semiconductor device 100 includes latch circuit 130 located on silicon substrate 1, access transistor T6 located at the surface of silicon substrate 1, including a pair of impurity regions 11*a*, one of which is connected to latch circuit 130, and bit line 19*b* connected to the other of impurity regions 11*a* of access transistor T6. At least a portion of latch circuit 130 is located above bit line 19*b*.

The reading and writing operation of a signal in the above-described memory cell circuit will be described hereinafter with reference to FIG. 1.

The above-described memory cell has a bit line BL and a complementary bit line /BL connected. In a writing mode, opposite signals are applied to bit line BL and complementary bit line /BL with the potential of word line WL set at, for example, a super Vcc level (at least Vcc+threshold voltage of driver transistors T1 and T2). For example, when a high potential (for example, potential Vcc) is applied to bit line BL, the potential of a connection node m1 attains a high level. Accordingly, capacitor C1 is charged. A minus potential or zero potential is applied to a connection node m2 from complementary bit line /BL. Therefore, connection node m2 attains the potential level of Low, so that capacitor C2 is not charged. In the flip-flop circuit, connection node m1 attains the level of internal potential Vcc whereas connection node m2 attains the level of zero potential or ground potential. Although leakage will occur at the junction or at driver transistor T1 and access transistor T5, the potential at connection node m1 will not be reduced since charge is supplied from load transistor T3. Therefore, connection node m1 is maintained at the potential level of High stably.

In a reading mode, the potential difference between bit lines BL and complementary bit line /BL is detected by a sense amplifier to have data read out. In the data reading mode, the present invention employs the scheme set forth below to prevent data from being destroyed. First, bit lines BL and /BL are precharged with the potential at Vcc. Then, word line WL is rendered active with the potential of word line WL at the super Vcc level. When word line WL is rendered active, the precharging of bit line pair BL and /BL is turned off. It is to be noted that the rise in potential of the storage node that has the lower potential (Low side) may cause the transistor of the inverter at the high side (opposite side) to be turned on, resulting in the possibility of the data being destroyed. In the present invention, the provision of large capacitors C1 and C2 suppresses any sudden rise in potential. Therefore, the potential of the storage node of the Low side will not become higher than the threshold voltage Vth of the driver transistor.

Since the potentials of connection nodes m1 and m2 are held at a predetermined potential level, leakage from capacitors C1 and C2 can be prevented. Therefore, a refresh operation is not required.

Referring to FIG. 3, driver transistors T1 and T2 are driver transistors of a CMOS inverter. Load transistor T3 is a load transistor of that CMOS inverter. Transistors T1 and T3 have their gate electrodes (storage node n1) electrically connected to each other. TFT gate electrode 23 is connected to source region S (impurity region 11*a*) of access transistor T6 via polypad 15 and buried contact 14. Polypad 28 is connected to storage node 30 of capacitor 32*b* (C2). Cell plate 40 that is the other electrode of capacitor C2 is set at the potential of Vcc/2.

Load transistor T4 that is the other thin film transistor is connected to the other capacitor C1 (32*a*) through a plug contact that is not visual in the cross section of FIG. 3.

Load transistors T3 and T4 that are the above-described thin film transistors are formed in a three dimensional manner above driver transistors T1 and T2. Therefore, semiconductor device 100 can be reduced drastically in size.

Figure 4:
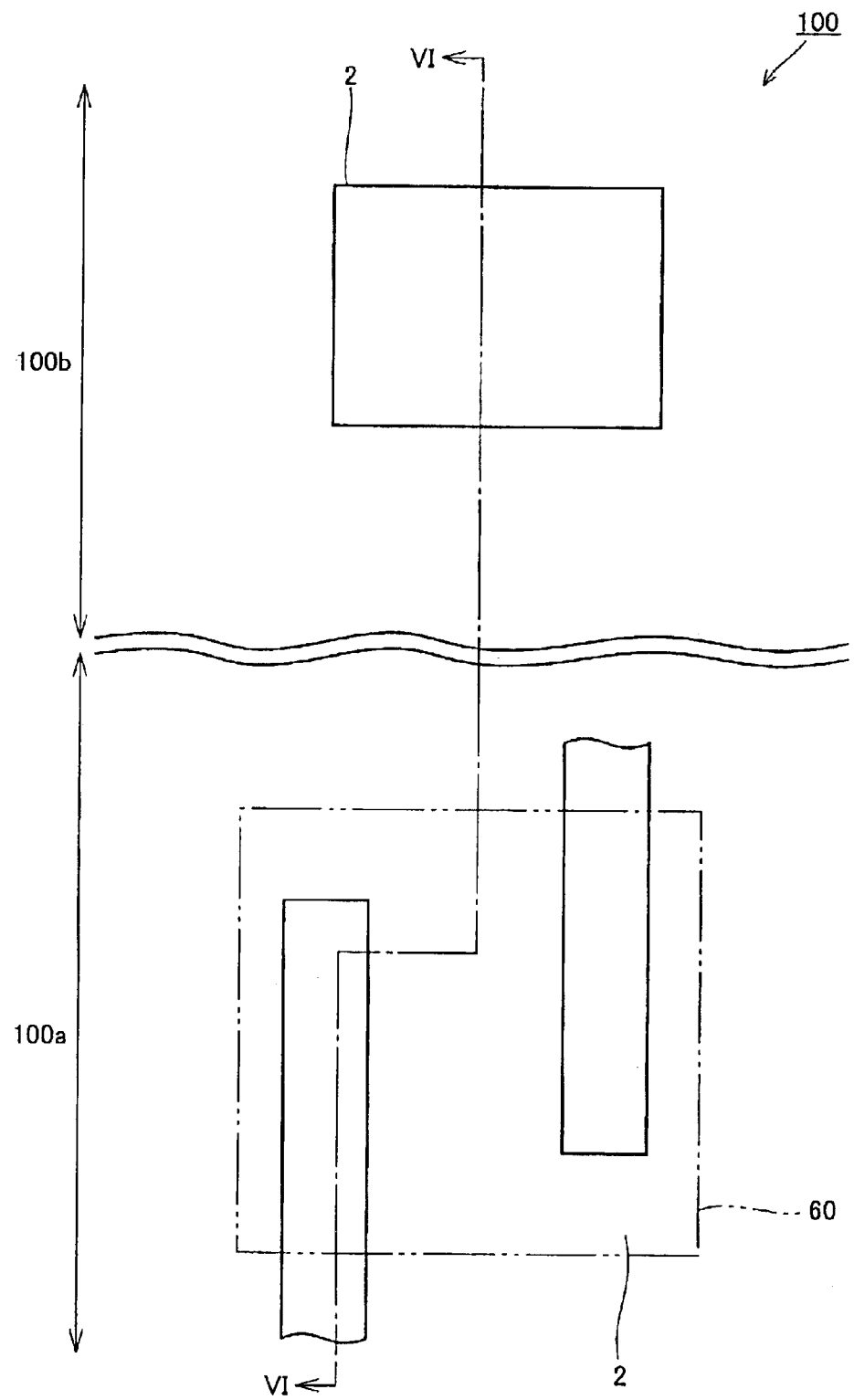
FIG. 4 is a plan view of the semiconductor device of FIGS. 1–3 corresponding to a first step of a fabrication method thereof
Figure 5:
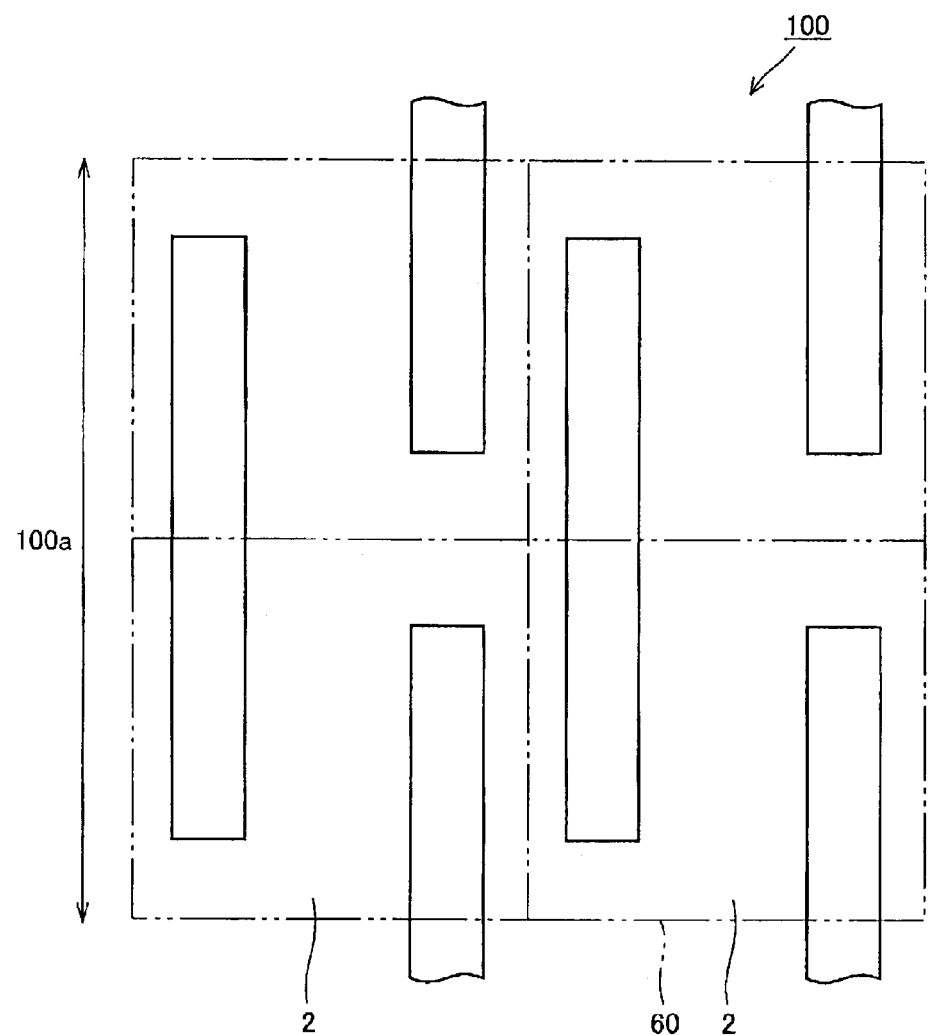
FIG. 5 is a plan view of a memory cell region of FIG. 4.
Figure 6:
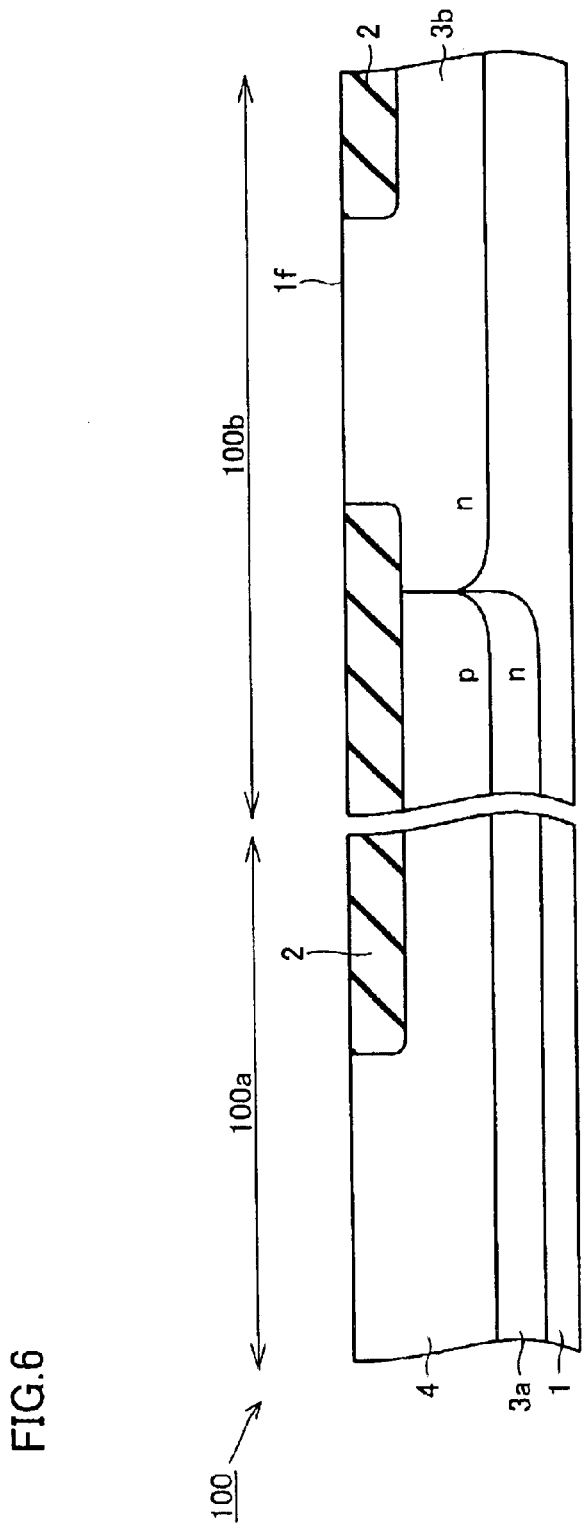
FIG. 6 is a sectional view of the memory cell region of FIG. 4 taken along line VI—VI.

A method of fabricating the semiconductor device of FIGS. 1–3 will be described hereinafter. Referring to FIGS. 4–6, an element isolation region 2 is formed selectively on silicon substrate 1. In the present embodiment, element isolation by STI (Shallow Trench isolation) is employed. Then, a bottom n type well region 3*a* is formed at a region deep in silicon substrate 1 through ion implantation. Then, ion implantation is employed to formed n type well region 3*b* in the region where a pMOS transistors is to be formed and a p type well region 4 in the region where an nMOS transistor is to be formed. Bottom n type well region 3*a* is not necessarily required, and may be dispensed with. As shown in FIGS. 4 and 5, element isolation region 2 is formed in one memory cell 60. As shown in FIG. 5, a plurality of memory cells 60 are provided to form a memory cell region 100*a*.

Figure 7:
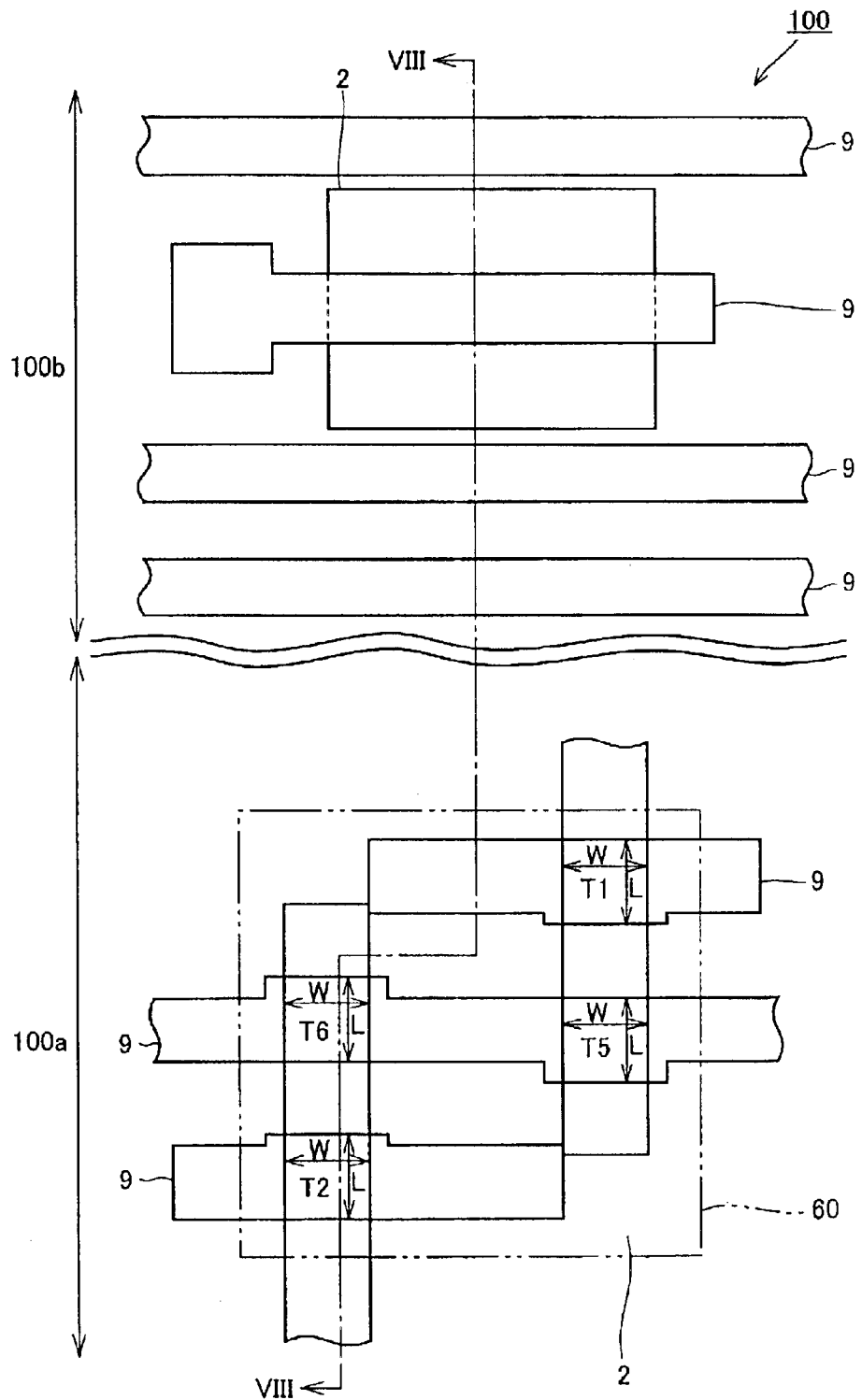
FIG. 7 is a plan view of the semiconductor device of FIGS. 1–3 corresponding to a second step of a fabrication method thereof.
Figure 8:
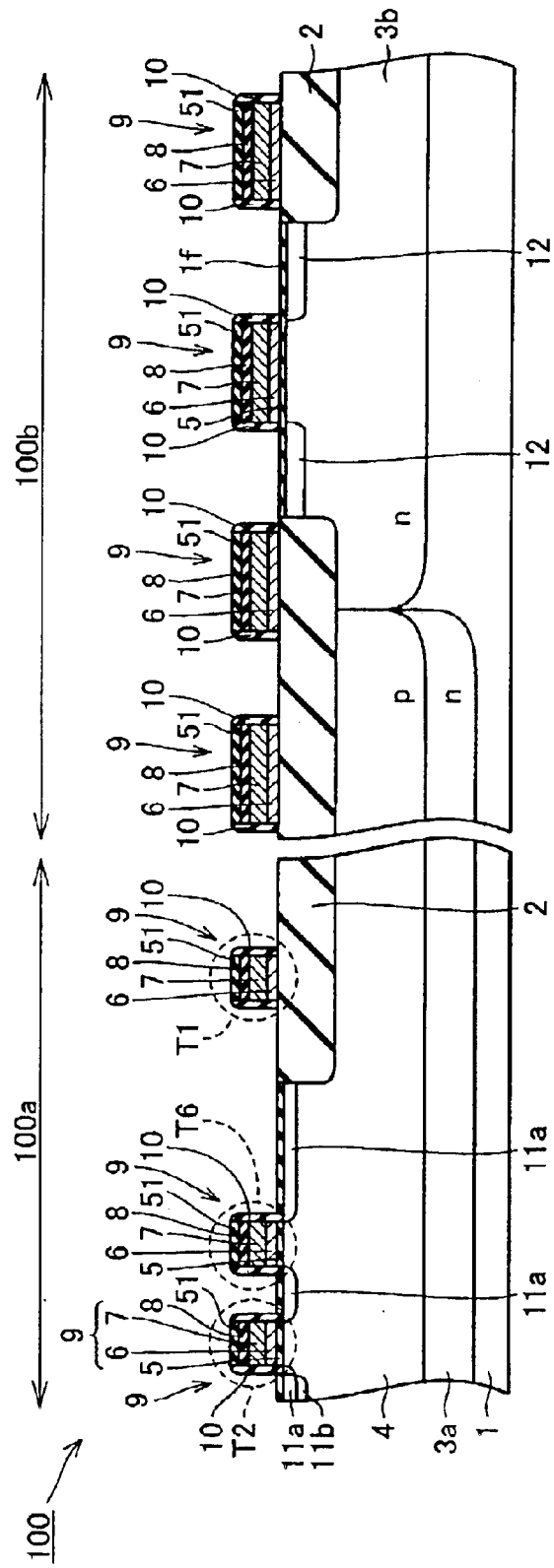
FIG. 8 is a sectional view of the semiconductor device of FIG. 7 taken along line VIII—VIII.

Referring to FIGS. 7 and 8, gate oxide film 5, doped polysilicon layer 6, tungsten silicide layer 7, silicon oxide film 8 and silicon nitride film 51 are vapor-deposited, and then etched to form gate electrode 9. Next, arsenic or phosphorus ions are implanted into silicon substrate 1 at the dosage of approximately at least $5\times10^{12}$ cm$^{-2}$ to $1\times10^{14}$ cm$^{-2}$ to form n type impurity region 1*a*. Although n type impurity region 1*a* is deposited only at the nMOS region in the drawing, n type impurity region 11*a* may be formed at the pMOS region by ion implantation all over. As shown in FIG. 7, the gate length L of access transistors T5 and T6, the gate width W of access transistors T5 and T6, the gate length L of driver transistors T1 and T2, and the gate width W of driver transistors T1 and T2 are substantially equal. By setting the gate length and the gate width of respective transistors substantially equal, semiconductor device 100 can be fabricated in the minimum dimension.

By implanting arsenic ions into the nMOS region so as to attain high concentration (for example, at least $1\times10^{20}$ cm$^{-3}$), impurity region 11*b* identified as n type high concentration source and drain regions is formed for driver transistor T2 that is an n type transistor. For the sake of stabilizing the GND potential, an impurity region of high concentration is formed only at the source side of driver transistor T2 to reduce the resistance. However, the high concentration impurity region may be formed at the drain of driver transistor T2, at another memory cell, or at the nMOS region in the peripheral region. On the contrary, a high concentration impurity region does not have to be formed in the memory cell region. Then, impurity region 12 that is p type source and drain regions of high concentration is formed.

Figure 9:
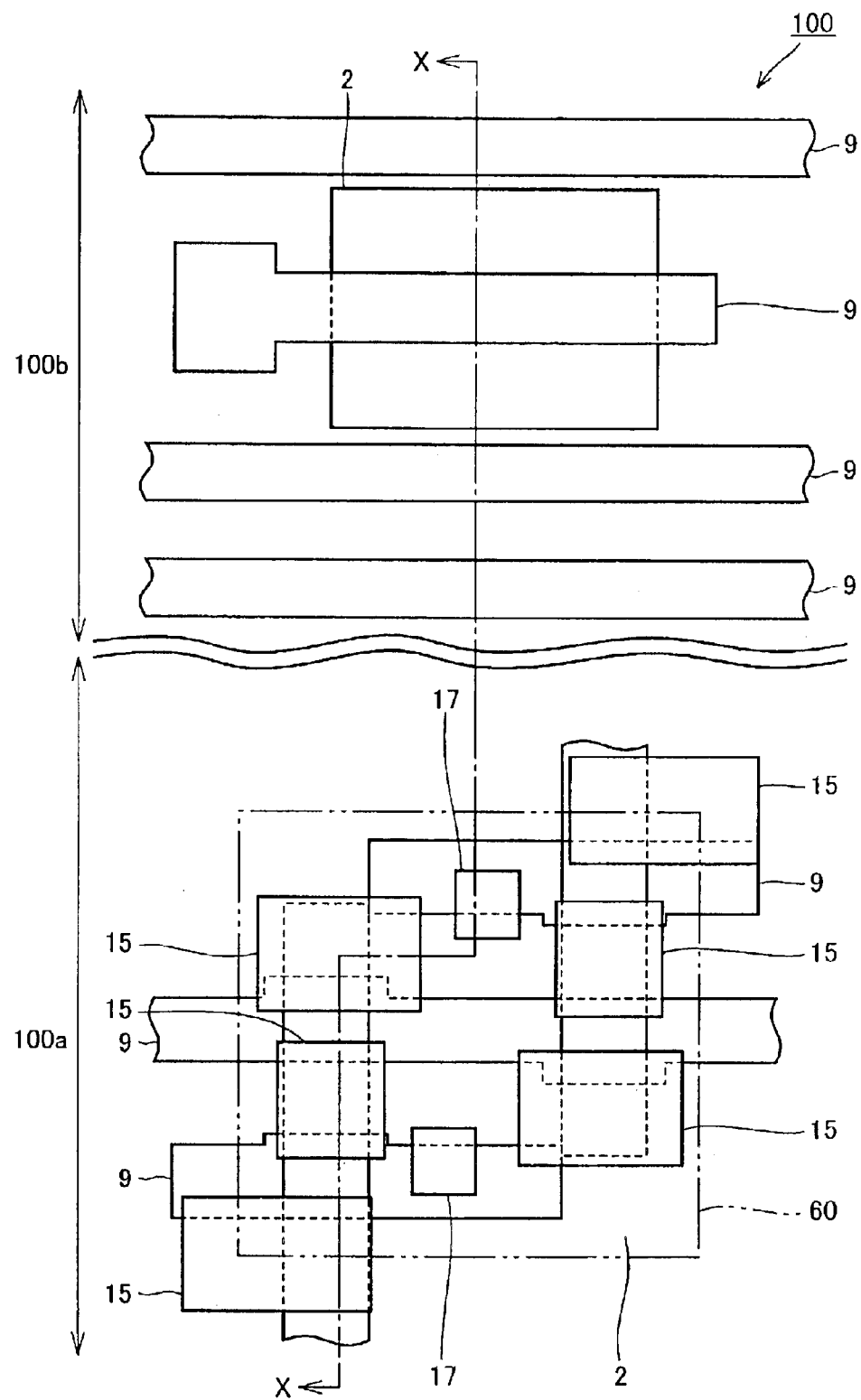
FIG. 9 is a plan view of the semiconductor device of FIGS. 1–3 corresponding to a third step of a fabrication method thereof.
Figure 10:
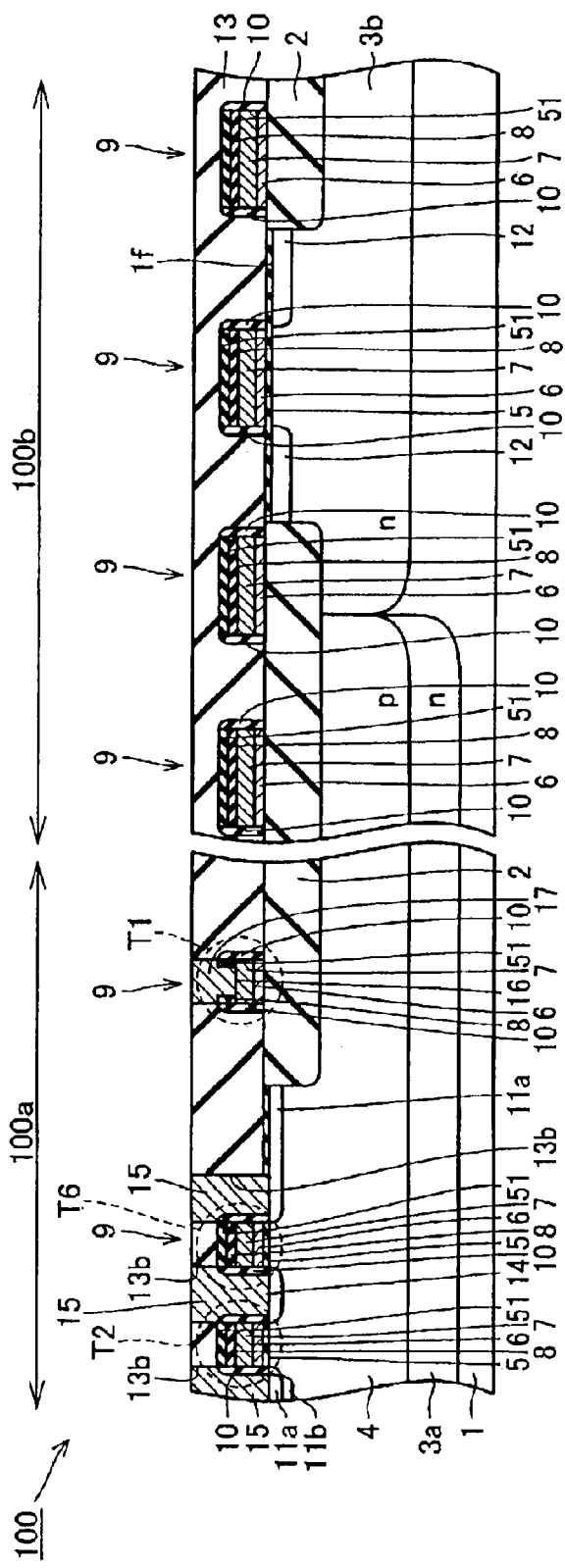
FIG. 10 is a sectional view of the semiconductor device of FIG. 9 taken along line X—X.

Referring to FIGS. 9 and 10, interlayer insulation film 13 is formed on main surface If Contact hole 13b is formed by etching interlayer insulation film 13 partially. Doped polysilicon is vapor-deposited so as to fill contact hole 13b. This doped polysilicon layer polysilicon is etched back all over or subjected to CMP (Chemical Mechanical Polishing), whereby polypad 17 is formed. At the same time, buried contact 14 that is the contacting region between polypad 17 and underlying impurity region 11a is formed. Also, buried contact 16 corresponding to the contacting region between tungsten silicide layer 7 and polypad 17 is formed.

Figure 11:
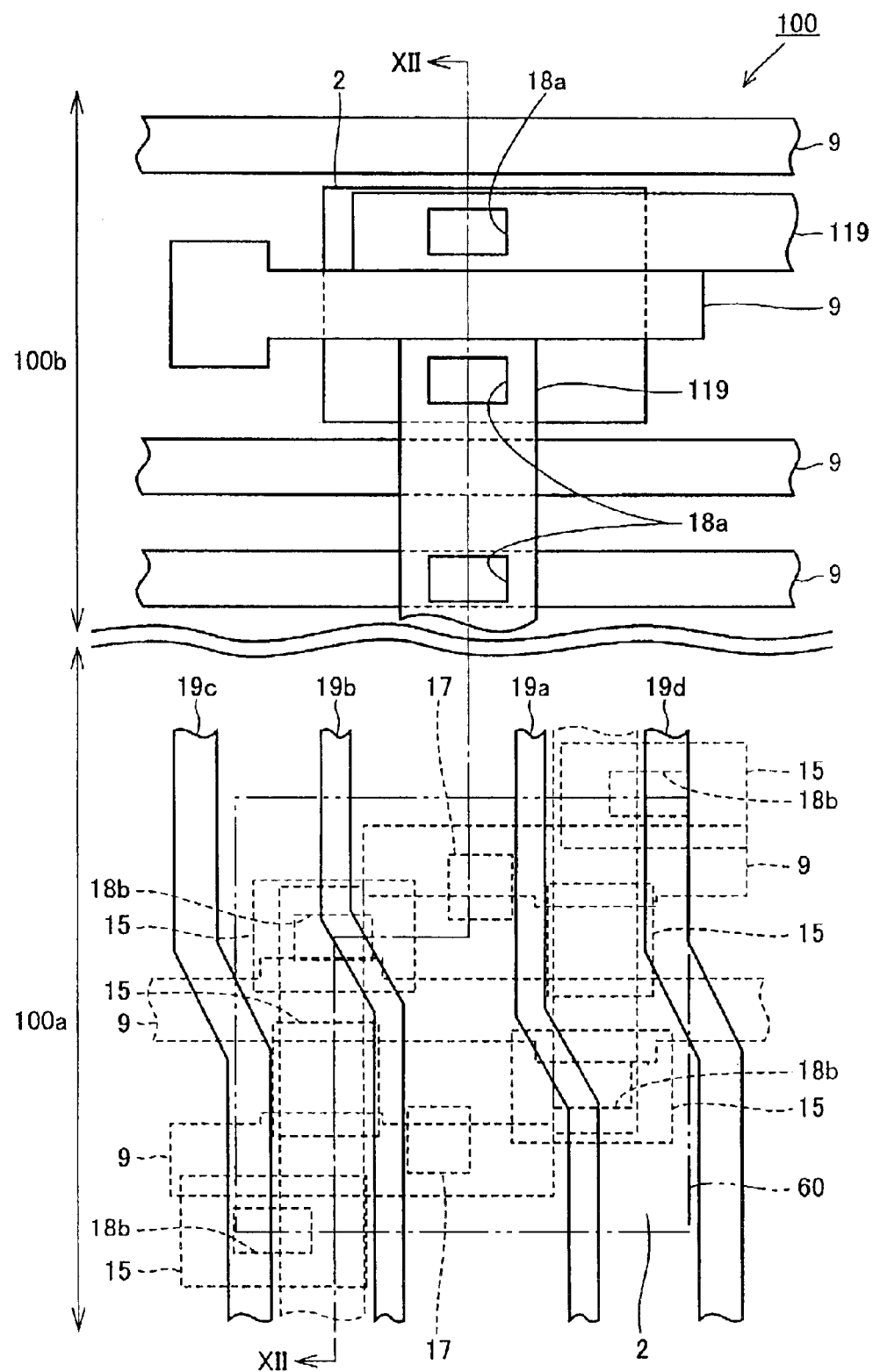
FIG. 11 is a plan view of the semiconductor device of FIGS. 1–3 corresponding to a fourth step of a fabrication method thereof.
Figure 12:
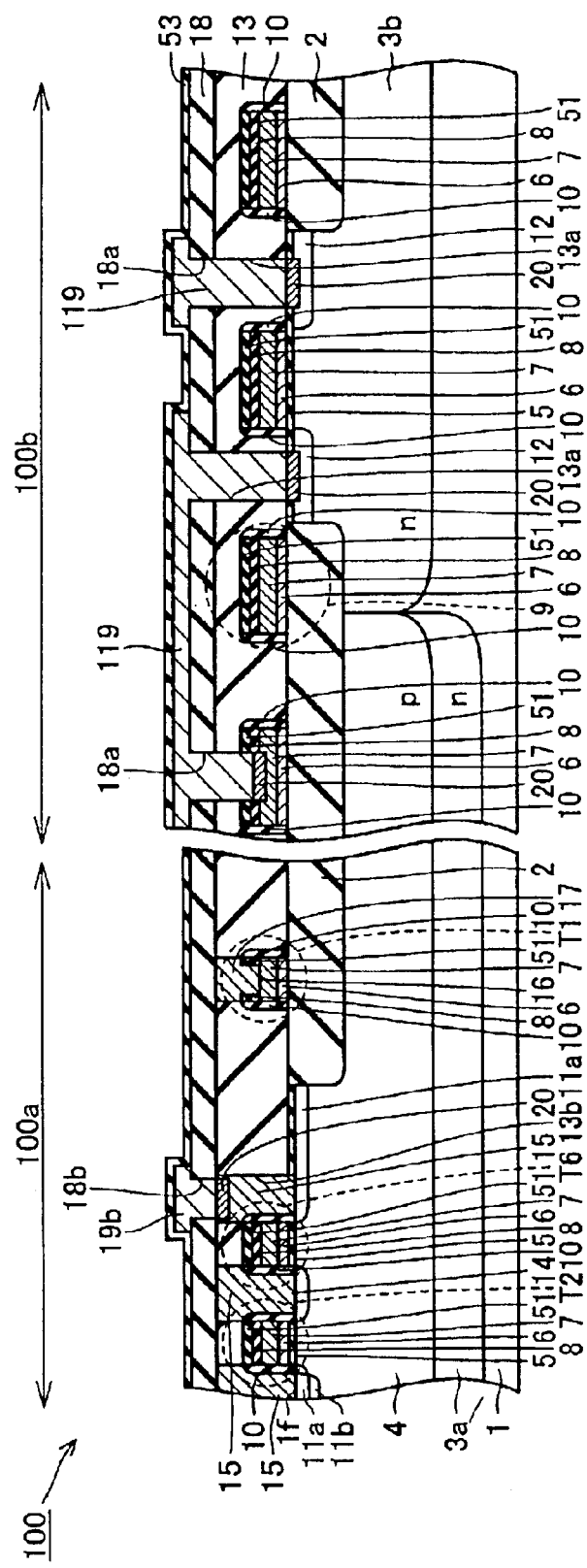
FIG. 12 is a sectional view of the semiconductor device of FIG. 11 taken along line XII—XII.

Referring to FIGS. 11 and 12, interlayer insulation film 18 is formed. By etching away interlayer insulation film 18 partially, contact hole and 18b are formed. Contact hole 18a is located in peripheral circuit region 100b, and extends to silicon substrate 1 or gate electrode 9. Contact hole 18b extends to polypad 15. A refractory metal film such as titanium, titanium nitride (TiN) or tungsten, and the like is vapor-deposited to fill contact holes 18a and 18b so as to be used as a ground line, bit line and metal contact pad. By selectively patterning the refractory metal, bit line 19b and tungsten interconnection 119 are formed. Silicon nitride film 51 is formed so that cover tungsten interconnection 119 and bit line 19b.

Figure 13:
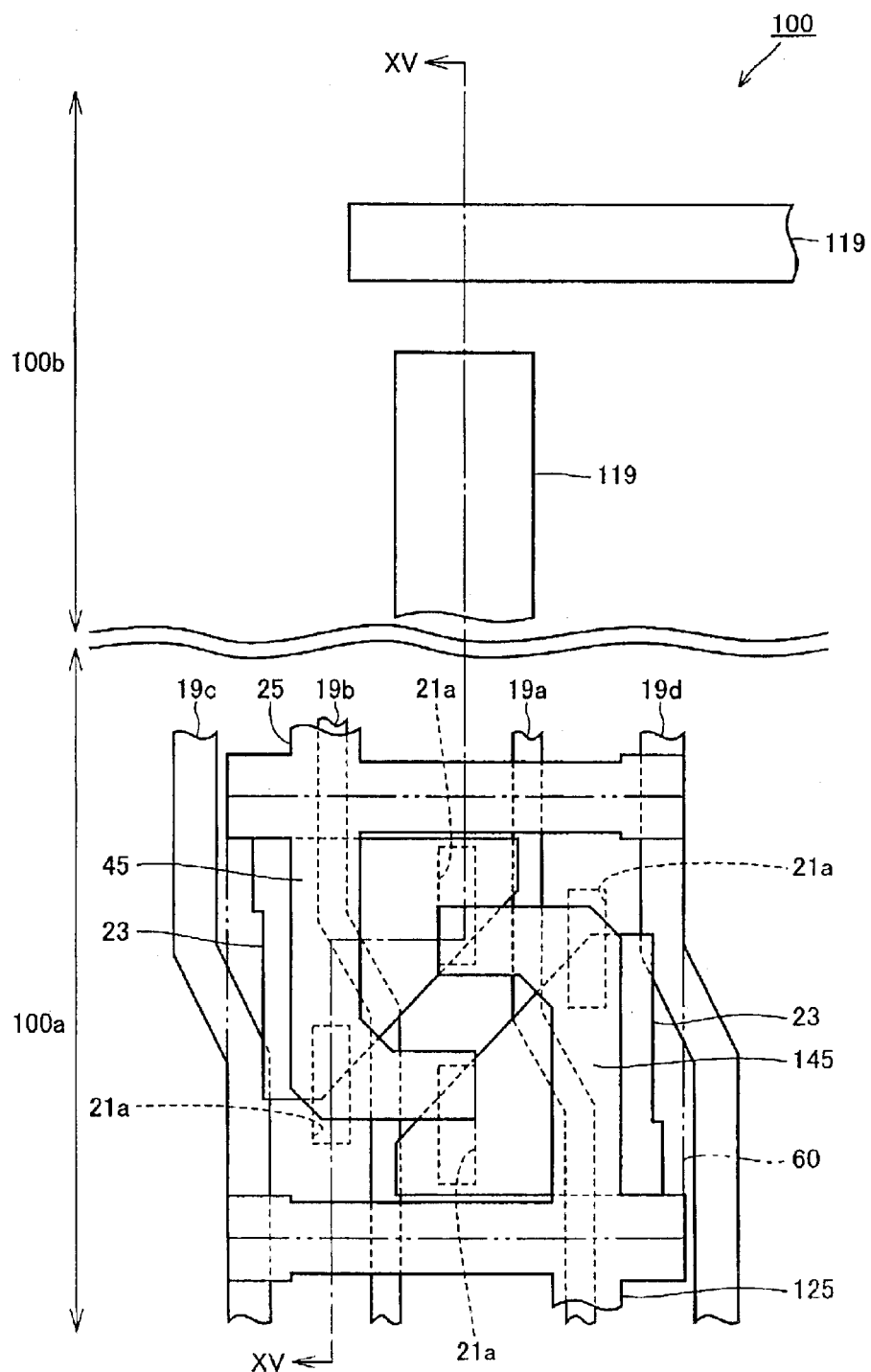
FIG. 13 is a plan view of the semiconductor device of FIGS. 1–3 corresponding to a fifth step of a fabrication method thereof.
Figure 14:
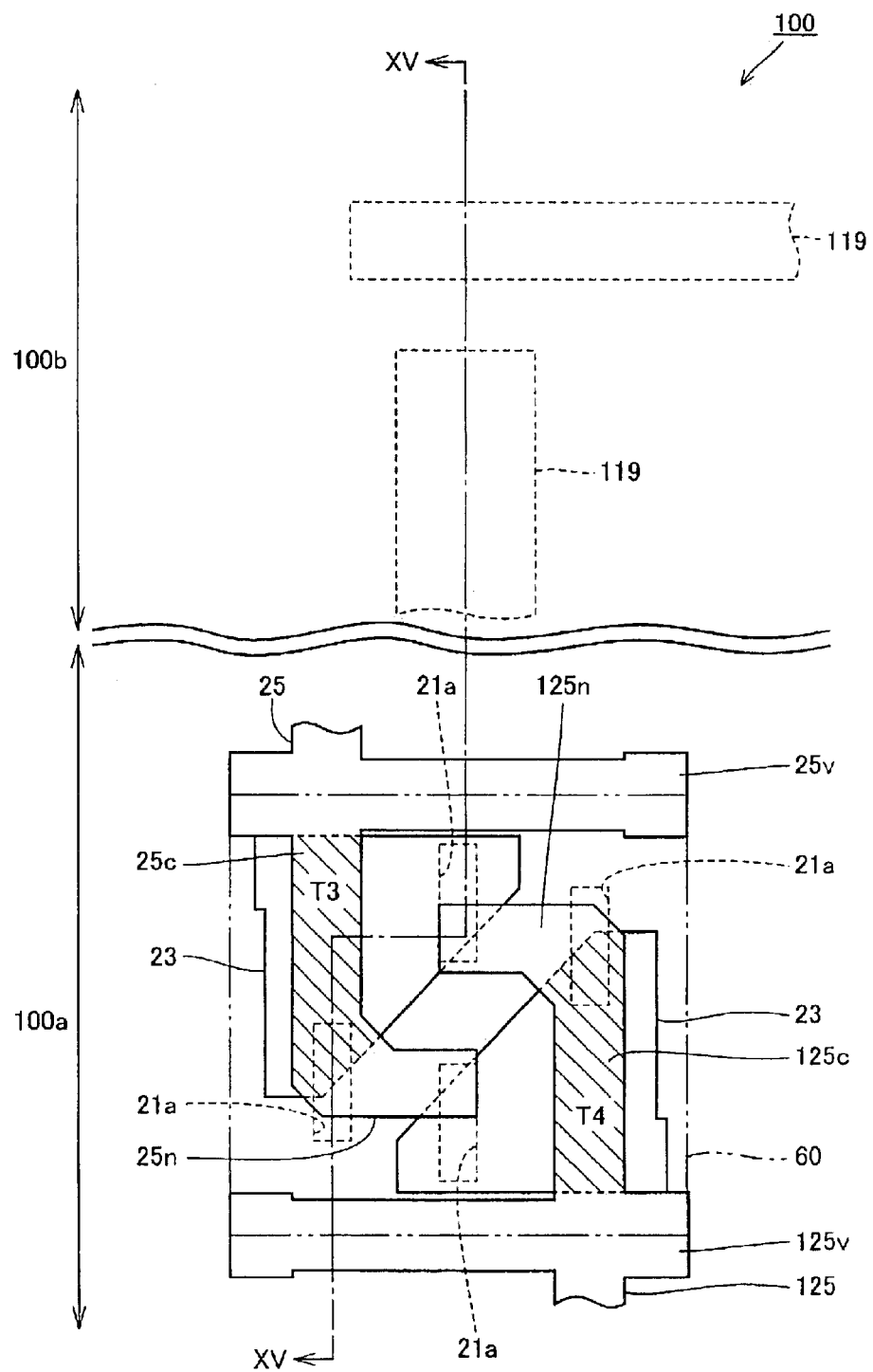
FIG. 14 is a plan view of load transistors T3 and T4 of FIG. 13.
Figure 15:
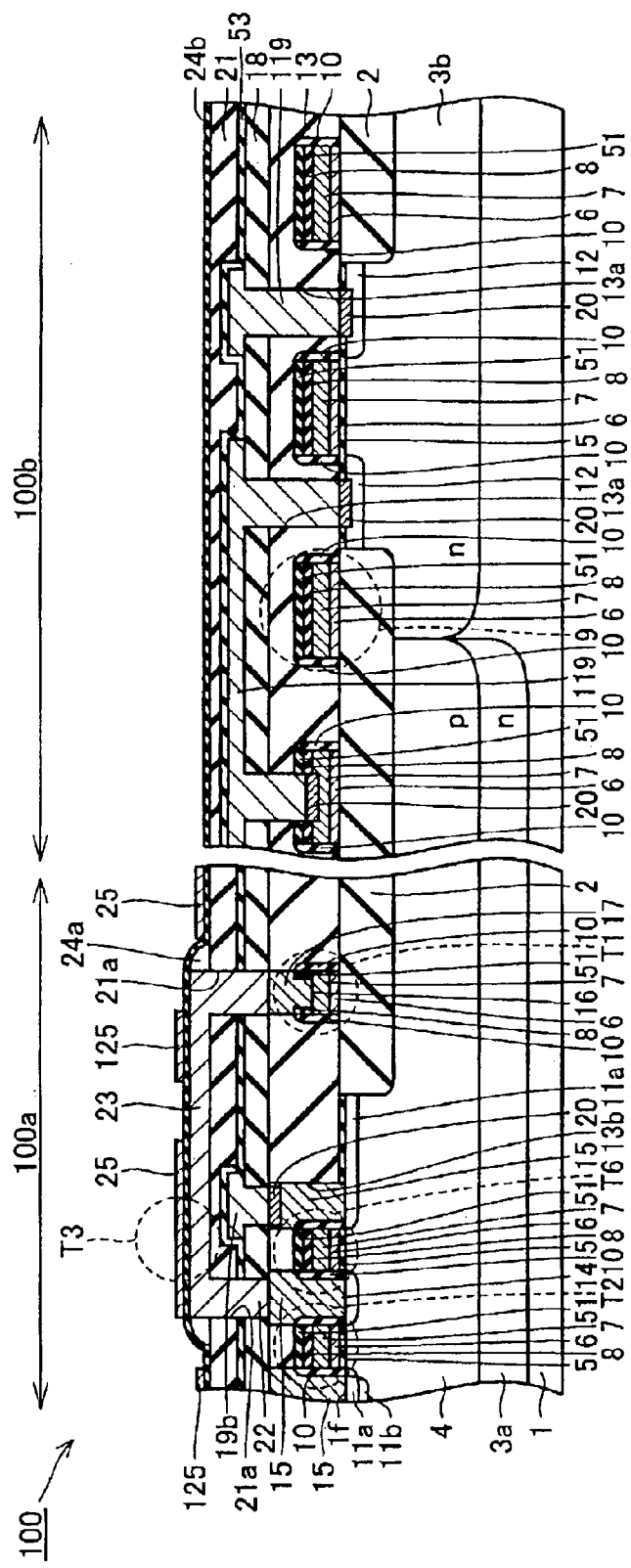
FIG. 15 is a sectional view of the semiconductor device of FIG. 13 taken along line XV—XV.

Referring to FIGS. 13–15, interlayer insulation film 21 formed of a silicon oxide film is deposited on silicon nitride film 53. Formation of this silicon nitride film 53 is advantageous in that oxidation of bit line 19b and tungsten interconnection 119 formed of tungsten can be prevented in a subsequent process to suppress increase of the resistance of the interconnection. In the case where influence on the process in a subsequent step is not discernible, silicon nitride film 53 does not have to be formed.

Interlayer insulation films 18 and 21 and silicon nitride film 53 are etched to form contact hole 21a for the connection with polypads 15 and 17. A silicon nitride film can be vapor-deposited in contact hole 21a and then etched to reduce the diameter of contact hole 21a.

Then, TFT gate electrode 23 is formed so as to fill contact hole 21a and so as to cover the surface of interlayer insulation film 21 partially. TFT gate electrode 23 is formed of doped polysilicon. Then, a silicon oxide film is vapor-deposited on the entire surface and then etched to form sidewall insulation film 24a. In the present embodiment, this sidewall insulation film 24a is provided for the purpose of preventing any etching residue in a subsequent step or to cope with shadowing of ion implantation in the channel doping process or high concentration p type formation in a subsequent step. However, sidewall region 24a is dispensable.

Then, a silicon oxide film is vapor-deposited to form TFT gate oxide film 24b. Amorphous polysilicon is vapor-deposited on TFT gate oxide film 24. Then, annealing and etching are applied to dispose TFT polycrystalline silicons 25 and 125 identified as the TFT body constituting the channel, source, and drain regions of a TFT. At this stage, boron and phosphorus for channel doping may be implanted into TFT polycrystalline silicons 25 and 125 in order to set the TFT at a predetermined threshold voltage of Vth. Then, for the sake of forming the source and drain regions of the TFT, boron ions are selectively implanted into TFT polycrystalline silicons 25 and 125 to form Vcc regions 25b and 125b, storage node regions 25n and 125n, and channel regions 25c and 125c, which are p+ regions (refer to FIG. 14). Vcc regions 25c and 125c are set at power supply potential Vcc. Storage node regions 25n and 125n are connected to storage nodes n1 and n2. Channel regions 25c and 125c are the channel regions of load transistors T3 and T4.

Figure 16:
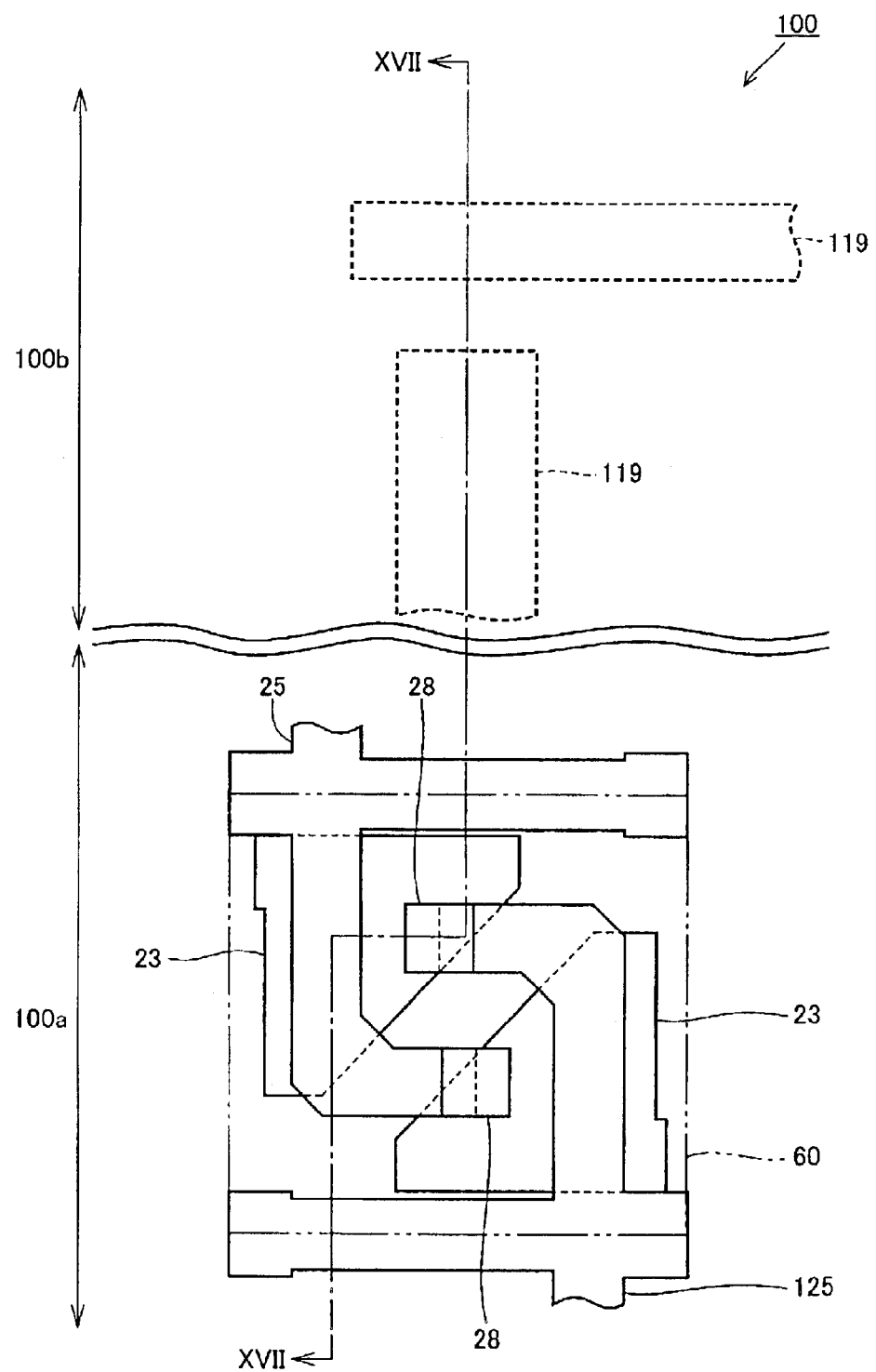
FIG. 16 is a plan view of the semiconductor device of FIGS. 1–3 corresponding to a sixth step of a fabrication method thereof.
Figure 17:
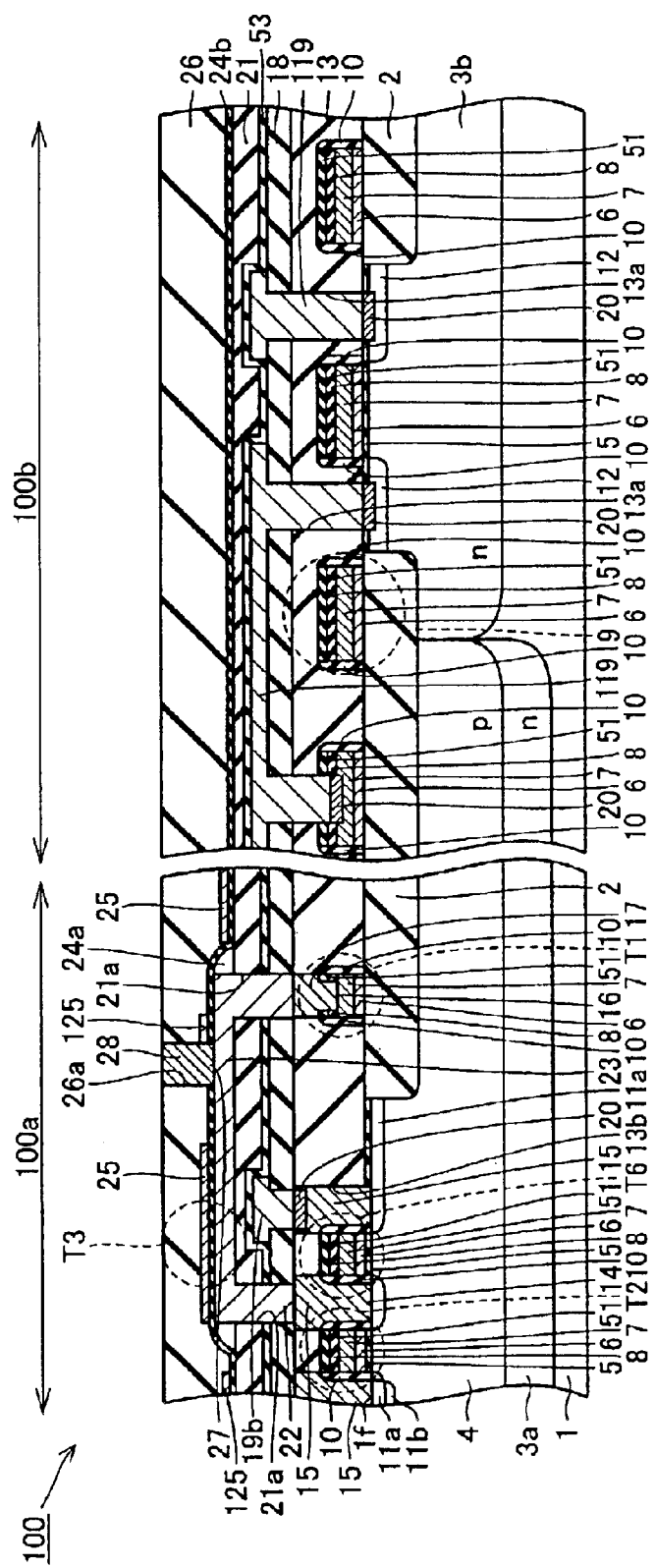
FIG. 17 is a sectional view of the semiconductor device of FIG. 16 taken along line XVII—XVII.

Referring to FIGS. 16 and 17, interlayer insulation film 26 is vapor-deposited. Then, interlayer insulation film 26, TFT polycrystalline silicon 125, and TFT gate oxide film 24b are etched to form contact hole 26a. Contact hole 26a is filled with polypad 28 formed of polysilicon having n type impurities such as phosphorus doped. Accordingly, buried contact 27 is formed between polypad 28 and TFT gate electrode 23.

Figure 18:
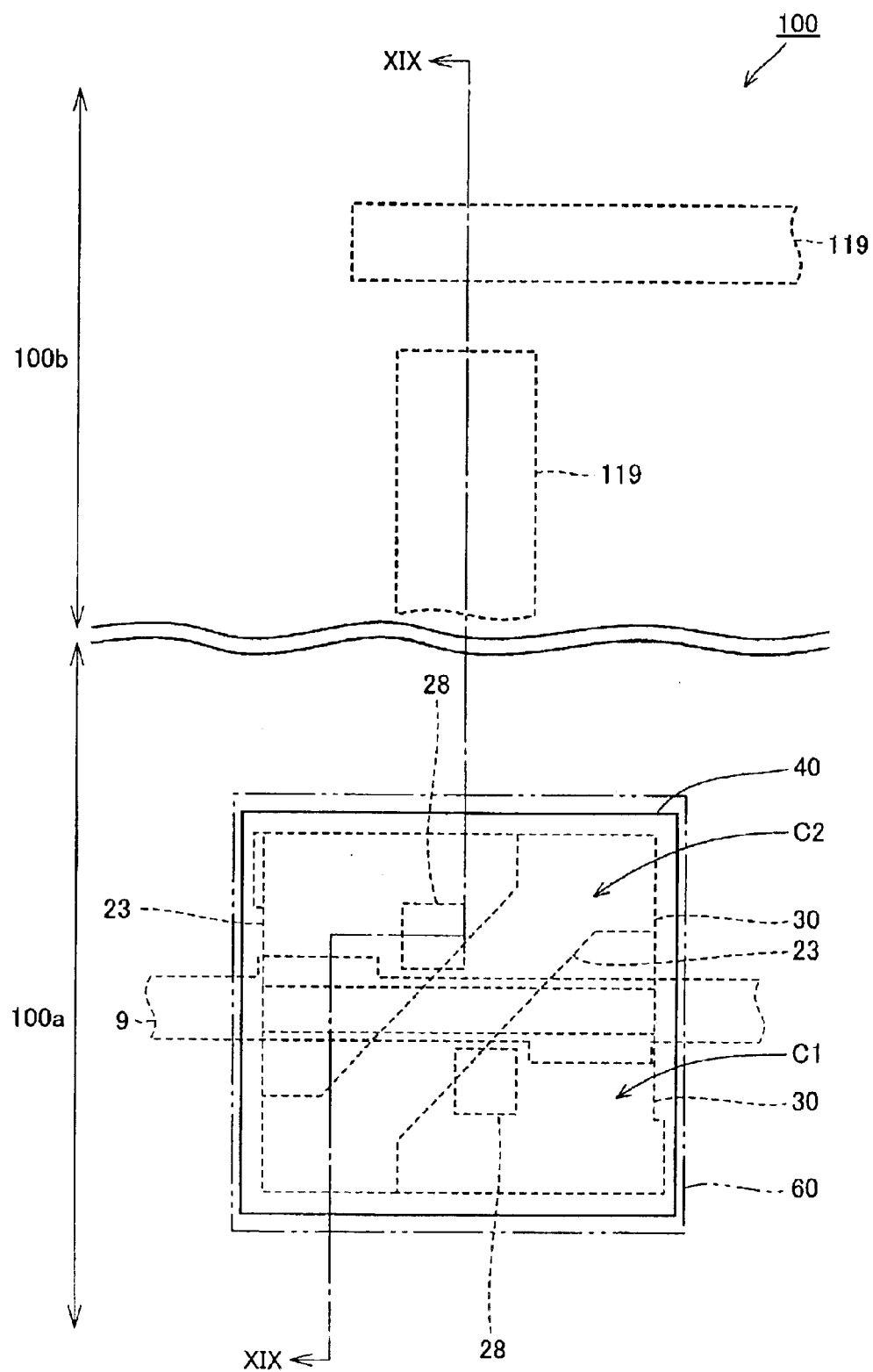
FIG. 18 is a plan view of the semiconductor device of FIGS. 1–3 corresponding to a seventh step of a fabrication method thereof.
Figure 19:
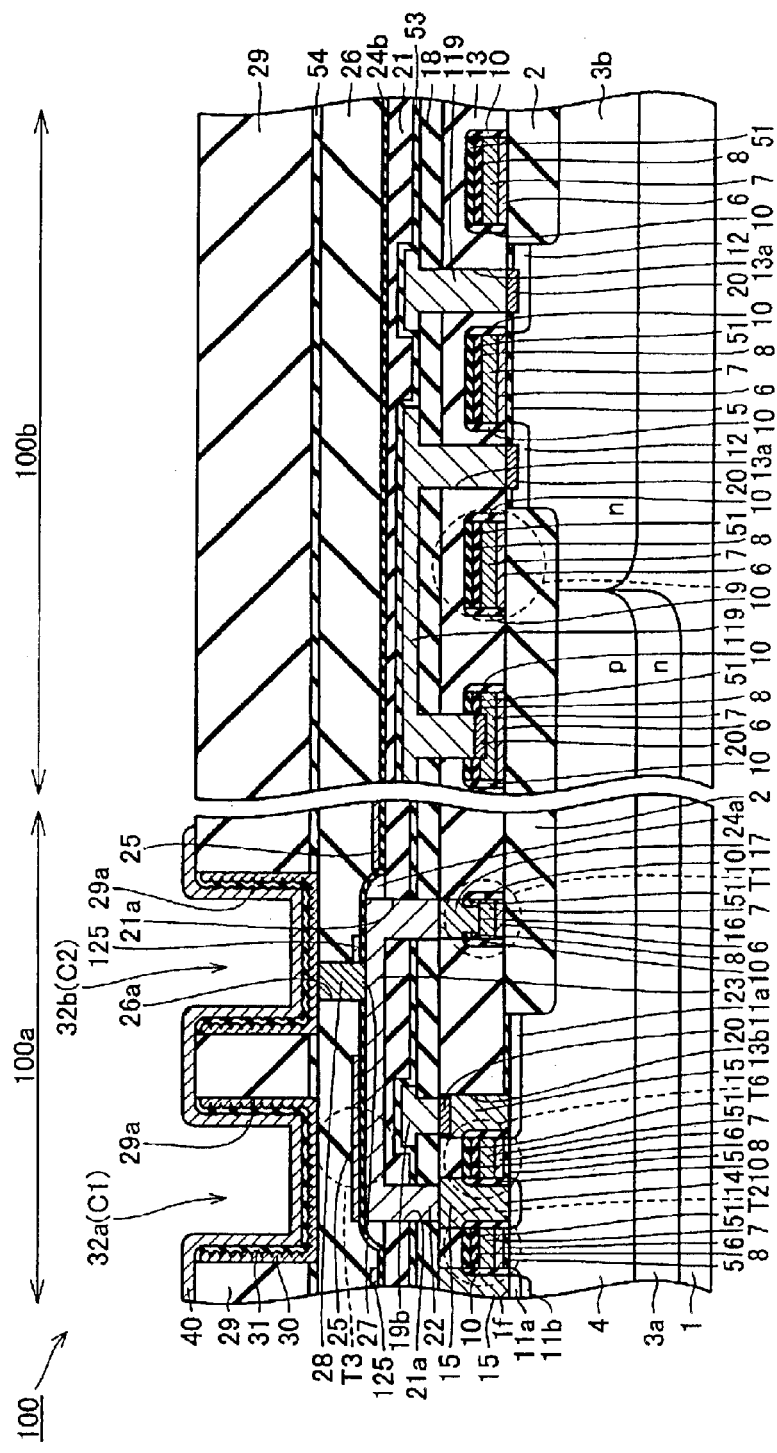
FIG. 19 is a sectional view of the semiconductor device of FIG. 18 taken along line XIX—XIX.

Referring to FIGS. 18 and 19, the fabrication step proceeds to formation of a cylindrical capacitor that has a larger capacitor area. Silicon nitride film 54 and interlayer insulation film 25 are vapor-deposited and then selectively etched to form a hole 29a. Silicon nitride film 54 is used as a stopper in an etching step.

Then, doped polysilicon and amorphous silicon are vapor-deposited on the surface of hole 29a. The surface is roughened to form storage node 30. Capacitor film 31 of a dielectric is formed by vapor-depositing and then oxidizing a silicon nitride film, for example, at the surface of storage node 30. By vapor-depositing and etching doped amorphous silicon at the surface of capacitor film 31, cell plate 40 is formed. Accordingly, cylindrical capacitors 32a (C1) and 32b (C2) are formed. As shown in FIG. 18, the two capacitors 32a (C1) and 32b (C2) are formed substantially symmetrical about gate electrode 9 identified as a word line.

Figure 20:
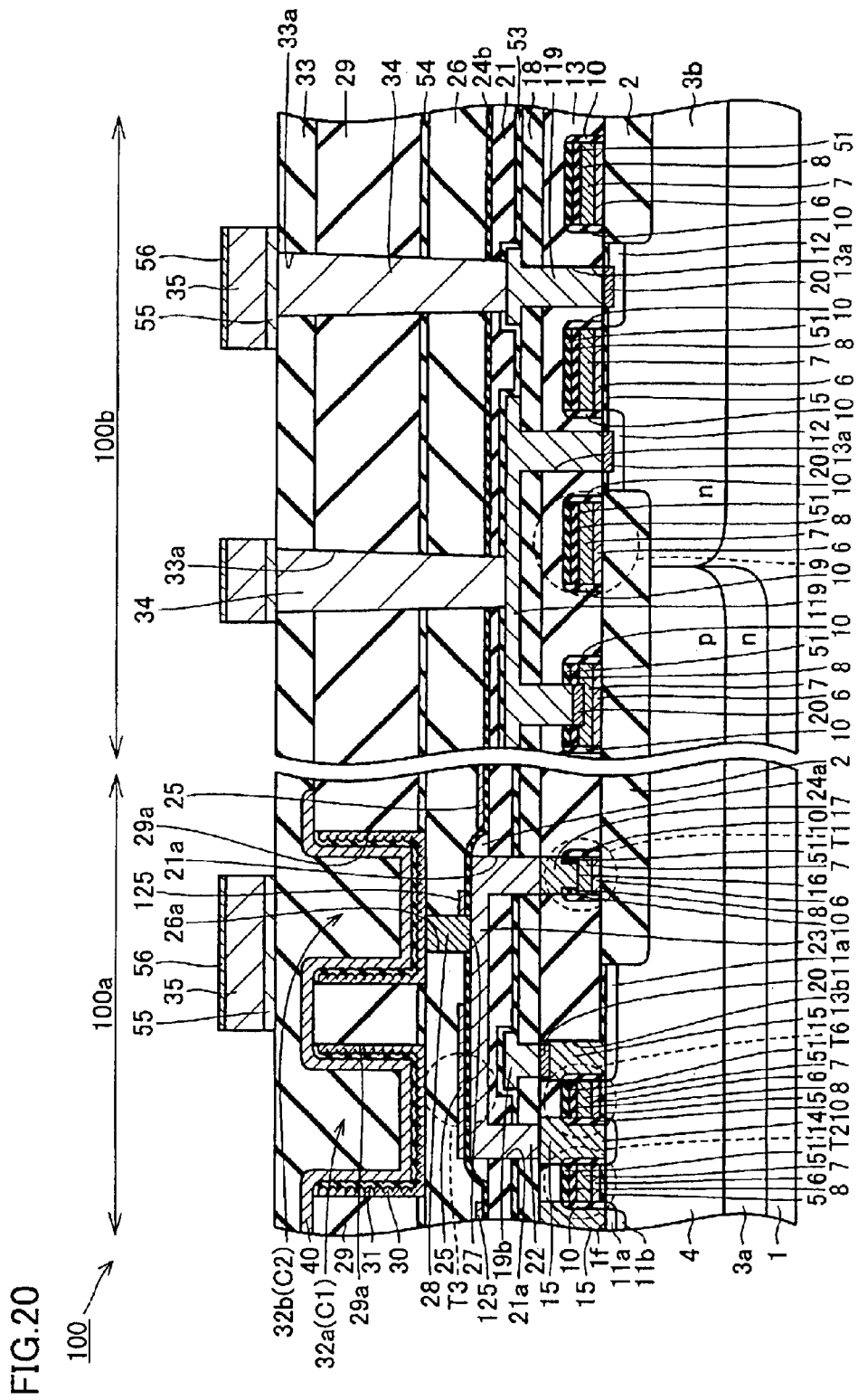
FIG. 20 is a sectional view of the semiconductor device of FIGS. 1–3 corresponding to an eighth step of a fabrication method thereof.

Referring to FIG. 20, interlayer insulation film 33 is formed. Contact hole 33a is formed so as to pierce interlayer insulation films 33, 29, 26 and 21, silicon nitride film 54 and TFT gate oxide film 24b. Metal contact 31 is formed so as to fill contact hole 33a. Then, a barrier layer 55 formed of a titanium nitride film or tungsten film, a metal interconnection 35 formed of aluminum-copper alloy, and a barrier layer 56 formed of titanium nitride are deposited. Specifically, films are deposited by sputtering, followed by etching.

Referring to FIG. 3, interlayer insulation film 36 formed of a silicon nitride film is deposited so as to cover metal interconnection 35. By etching interlayer insulation film 36 partially, contact hole 36a is formed. Contact hole 36a is filled with metal contact 37. Then, titanium nitride and tungsten are vapor-deposited to form barrier layer 57. Metal interconnection 38 formed of aluminum-copper alloy is deposited thereon. Barrier layer 58 formed of titanium nitride is deposited thereon. Then, a plasma silicon oxide film and a polyimide film are deposited as a passivation film 39. Etching is applied thereon to form a scribe line and a bonding pad. Accordingly, the semiconductor device of FIGS. 1–3 can be obtained.

The above-described fabrication method includes the step of forming a latch circuit 130 configured by a flip-flop circuit including a thin film transistor as a load transistor in a conventional step of forming an access transistor and capacitor constituting a DRAM memory cell. The above-described fabrication method can be realized by slightly modifying the conventional DRAM fabrication line. Therefore, a semiconductor memory device corresponding to the circuitry shown in FIG. 1 can be fabricated based on the steps shown in FIGS. 4–20.

In the above-described embodiment, capacitor C1 is formed above load transistor T3. Storage node 30 (cell plate 40) of capacitor C1 is connected to storage node n2 and connection node m1, and differs in potential from TFT gate electrode 23 connected to storage node n1 and connection node m2. Therefore, interlayer insulation film 26 is made thicker than TFT gate oxide film 24b to prevent erroneous operation of load transistor T3 by storage node 30 located above. For example, TFT gate oxide film 24b has a thickness of approximately 5–50 nm whereas interlayer insulation film 26 has a thickness of approximately 50 to 500 nm.

It is apparent from FIG. 15 that the channel region of load transistor T3 overlaps bit line 19b. However, TFT gate electrode 23 provided therebetween functions as a shield therebetween. Thus, erroneous operation of load transistor T3 caused by bit line 19b (/BL) can be prevented. There is a possibility of temporal overlapping in the case where the mask is misaligned. Therefore, interlayer insulation film 21 between TFT gate electrodes 23 is preferably made thicker than TFT gate oxide film 24b to prevent erroneous operation of load transistor T3 caused by bit line 19b (/BL). For example, the thickness of TFT gate oxide film 24b is set to approximately 5–50 nm whereas the thickness of interlayer insulation film 21 is set to approximately 50–500 nm.

Figure 21:
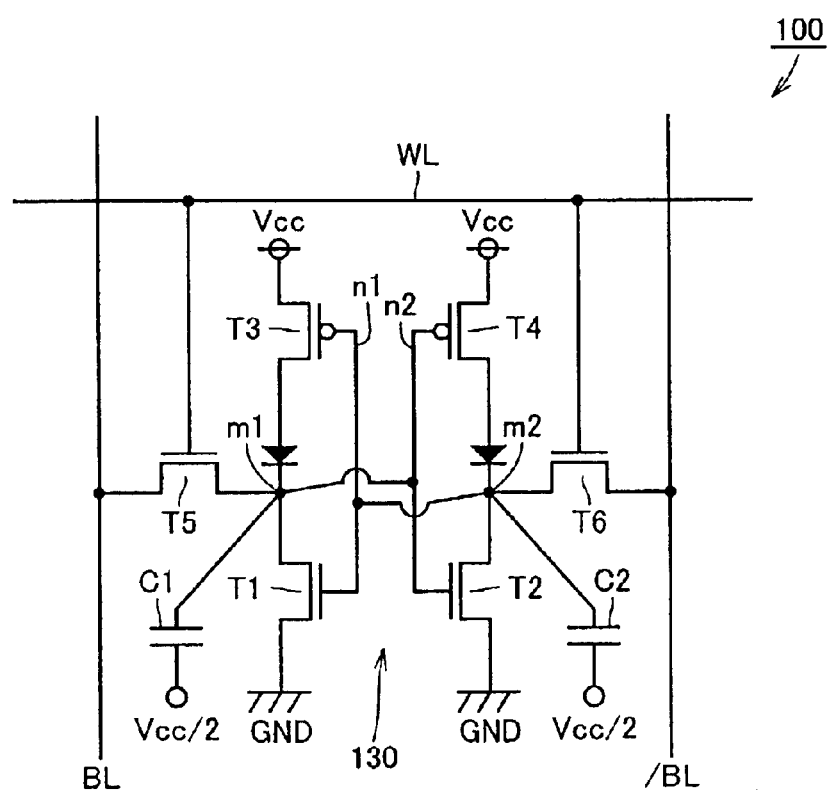
FIG. 21 is an equivalent circuit diagram of another semiconductor device according to the first embodiment of the present invention.

In the present embodiment, polysilicon doped with phosphorus is employed for polypad 28. It is to be noted that pn junction is formed at the connection between TFT polycrystalline silicon 25 and polypad 28. By the effect of the built-in potential (Vbi) at the junction, the potentials of storage nodes n1 and n2 will rise only up to the level of Vcc–Vbi in a data storage state. This is represented by the circuit diagram of FIG. 21. In view of the foregoing, formation of pn junction may be prevented by using metal such as tungsten or titanium nitride instead of phosphorus-doped polysilicon for polypad 28.

In the present embodiment, the concentration of phosphorus in the doped polysilicon forming polypad 28 is set lower than the concentration for polypad 15 on the substrate and polypad 17 on gate electrode 9. For example, the phosphorus concentration in polypad 28 is set to $5 \times 10^{19}$–$2 \times 10^{20}$ cm$^{-3}$ whereas the phosphorus concentration in polypads 15 and 17 is set to $2.5 \times 10^{20}$–$7.0 \times 10^{20}$ cm$^{-3}$. As a result, diffusion of phosphorus (n type impurity) from the connecting region between TFT polycrystalline silicon 25 and polypad 28 towards the TFT channel can be prevented. The effect on the conductivity type of a storage node that is a p type impurity region is reduced. There is an advantage that the TFT performance is stabilized.

In the above-described embodiment, ground lines 19c and 19d are formed thicker than bit lines 19a (BL) and 19b (/BL), as shown in FIG. 11. This provides the advantage that the resistance of the ground line is reduced to allow stable cell operation.

On the contrary, bit lines 19a and 19b may be made thicker than ground lines 19c and 19d (not shown). In this case, the bit line propagation delay is reduced to allow higher access speed.

Referring to FIGS. 3 and 18, capacitors C1 and C2 are arranged axially symmetrical to gate electrode 9 identified as a word line. The potential of one of capacitors C1 and C2 is constantly high whereas the other is constantly low. By this axially symmetrical arrangement of capacitors C1 and C2 with respect to gate electrode 9, the parasitic capacitance of gate electrode 9 and the capacitor is constant irrespective of the data in the memory cell. Therefore, operation failure caused by variation in the parasitic capacitance can be prevented.

Referring to FIGS. 3 and 18, capacitors C1 and C2 are arranged axially symmetrical to bit lines 19a and 19b. Therefore, the parasitic capacitance of bit line 19a (BL) and the capacitor as well as the parasitic capacitance of bit line 19b (/BL) and the capacitor are constant irrespective of the memory cell data. Thus, operation failure caused by variation in the parasitic capacitance can be prevented.

It is appreciated from FIG. 11 that two bit line contacts are provided independently within one memory cell 60, which are not shared with another cell. Specifically, bit line 19b is connected to silicon substrate 1 via contact hole 18b, whereas bit line 19a is connected to silicon substrate 1 via another contact hole 18b. Therefore, the connection resistance between the access transistor and bit line contact can be reduced to allow stable cell operation.

Second Embodiment

Figure 22:
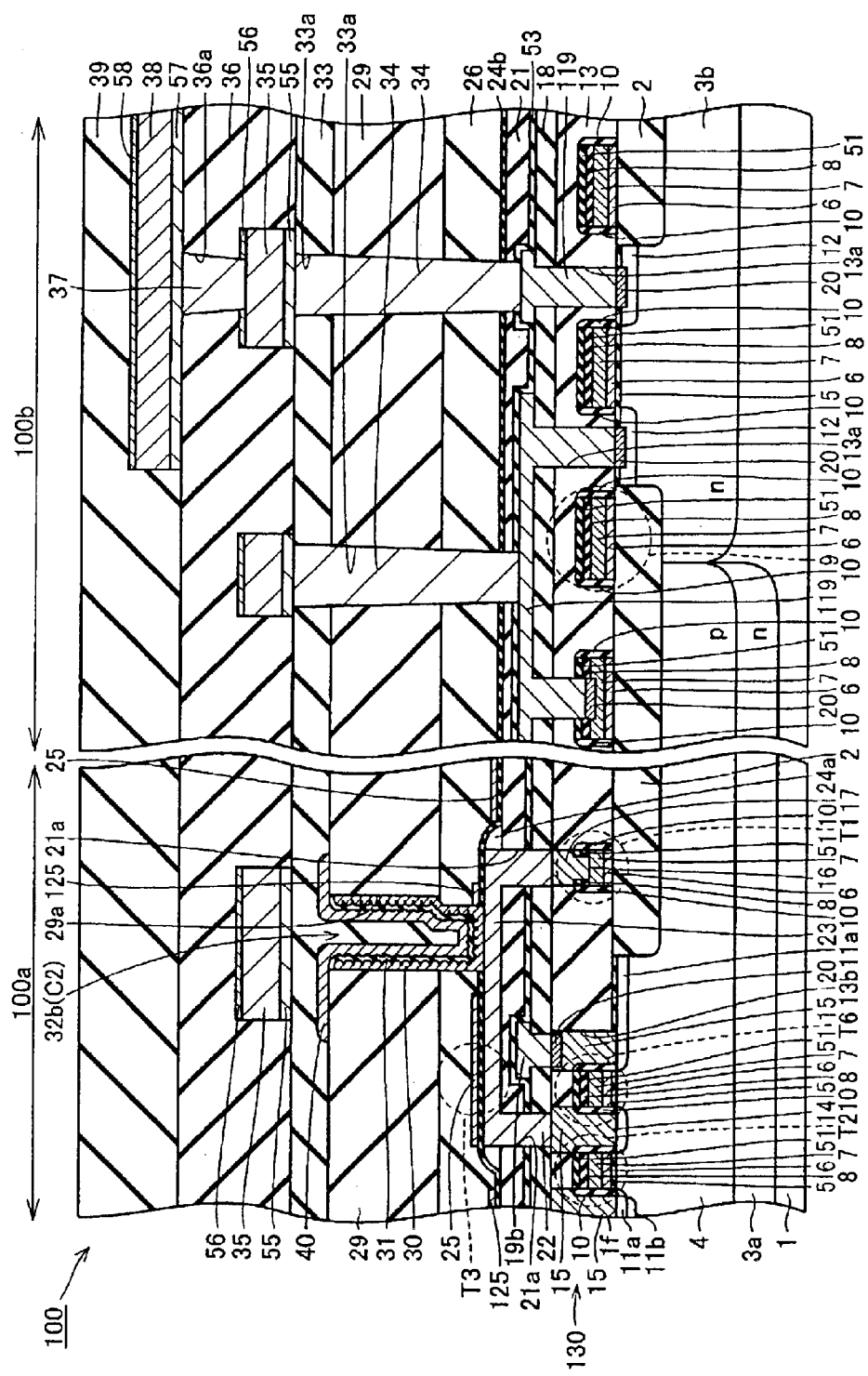
FIG. 22 is a sectional view of a semiconductor device according to a second embodiment of the present invention.

Referring to FIG. 22, a semiconductor device 100 according to a second embodiment of the present invention differs from semiconductor device 100 of the first embodiment in that hole 29a identified as a contact hole extends to TFT gate electrode 23, and a capacitor 32b (C2) is formed in hole 29a.

The method of fabricating capacitor 32b (C2) is similar to that of the first embodiment.

Such a semiconductor device no longer requires formation of polypad 28 and the like, as compared to the semiconductor device of the first embodiment. The semiconductor device of the second embodiment is advantageous in that the process is further simplified to allow reduction of the fabrication cost.

Third Embodiment

Figure 23:
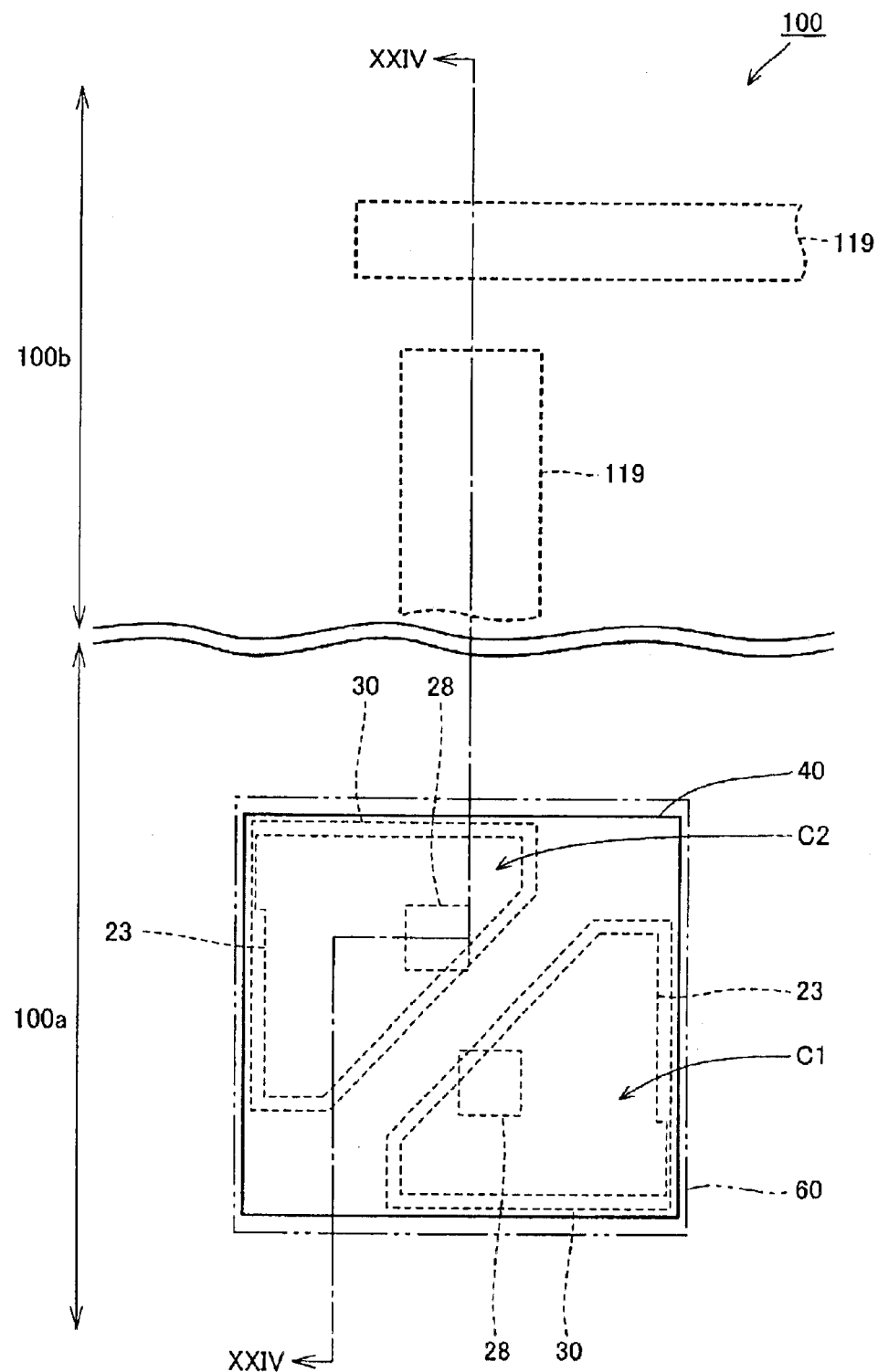
FIG. 23 is a plan view of a semiconductor device according to a third embodiment of the present invention.
Figure 24:
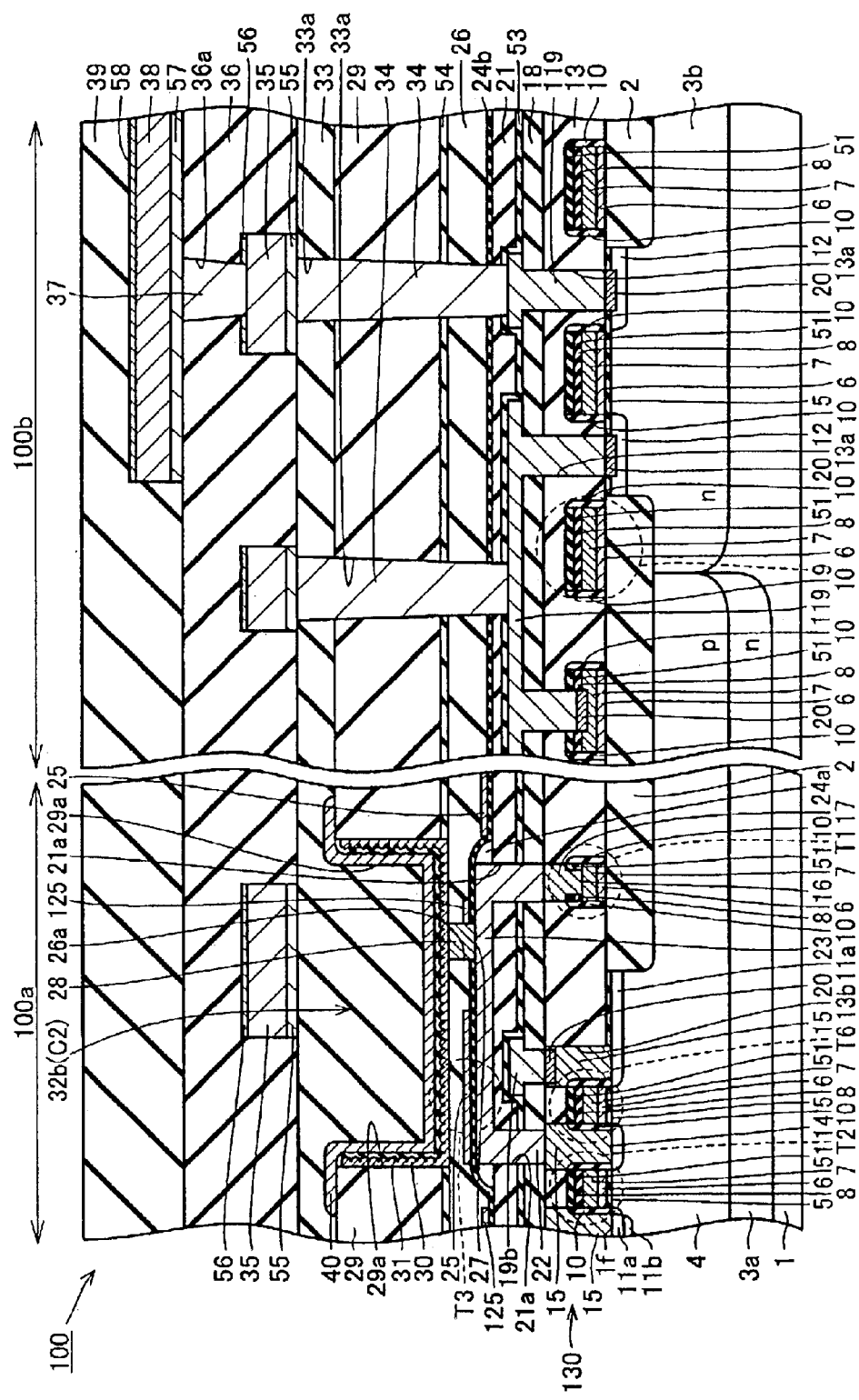
FIG. 24 is a sectional view of the semiconductor device of FIG. 23 taken along line XXIV—XXIV of FIG. 23.

Referring to FIGS. 23 and 24, semiconductor device 100 according to a third embodiment of the present invention differs from the semiconductor device of the first embodiment in the position of storage node 30. In the third embodiment, storage node 30 of capacitors 32b (C2) having a potential identical to that of TFT gate electrode 23 and cell plate 40 are arranged above load transistor T3. As shown in FIG. 23, storage node 30 and TFT gate electrode 23 have the same layout. In this case, load transistor T3 formed of a TFT has a double gate structure with upper and lower gate electrodes. This is advantageous in that the TFT property is improved. Furthermore, TFT gate electrode 23 and storage node 30 can be fabricated using the same mask. Therefore, reduction in the cost for a mask can be expected. Although the thickness of interlayer insulation film 26 should be set substantially equal to that of TFT gate oxide film 24b, differing from the first embodiment, the effect of storage node 30 functioning as an upper gate electrode can be achieved even if made thick as shown in FIG. 24.

Fourth Embodiment

Figure 25:
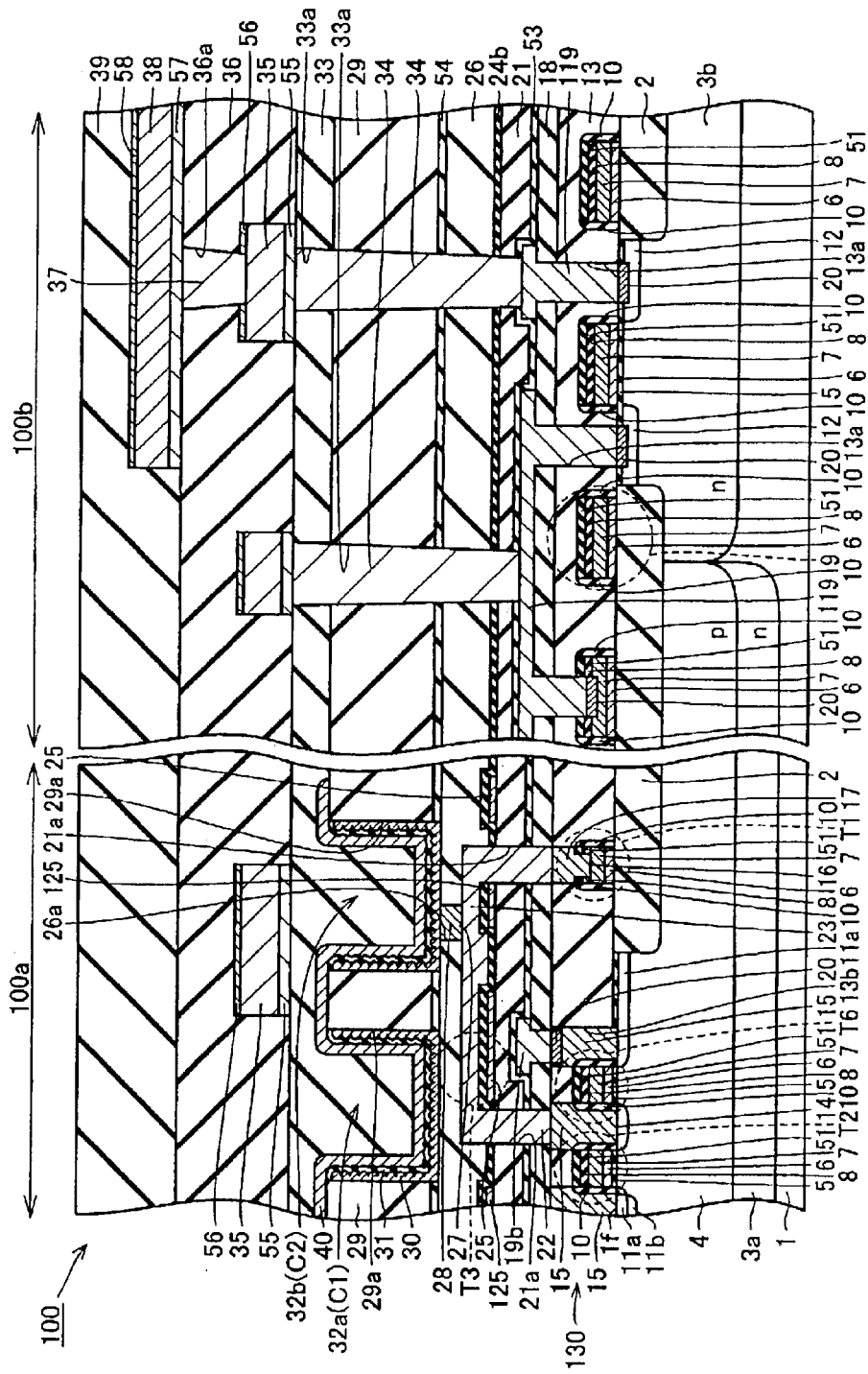
FIG. 25 is a sectional view of a semiconductor device according to a fourth embodiment of the present invention.

Referring to FIG. 25, a semiconductor device according to a fourth embodiment of the present invention differs from semiconductor device 100 of the first embodiment in that the vertical relationship of the arrangement of TFT gate electrode 23 and TFT polycrystalline silicon 25 is set opposite to that of FIG. 3. Specifically, access transistor T6 and driver transistor T2 are formed on silicon substrate 1, with capacitor 32b (C2) formed thereon, as shown in FIG. 25. Connection between impurity region 1a identified as the source and drain regions of access transistor T6 and storage node 30 of capacitor 32b (C2) is established by polypad 28, TFT gate electrode 23, and polypads 15 and 17 piercing interlayer insulation films 13, 18 and 21, TFT gate oxide film 24b, silicon nitride films 53 and 54, and interlayer insulation film 26. Gate electrode 9 of driver transistor T1 is connected to TFT polycrystalline silicon 25 through polypad 17.

Driver transistors T1 and T2, access transistor T5, bit line 19b and load transistor T3 are sequentially formed from main surface if.

The method of fabricating the semiconductor device of FIG. 25 will be described hereinafter. The steps of FIGS. 4–12 described in the first embodiment can also be employed in the present embodiment.

Figure 26:
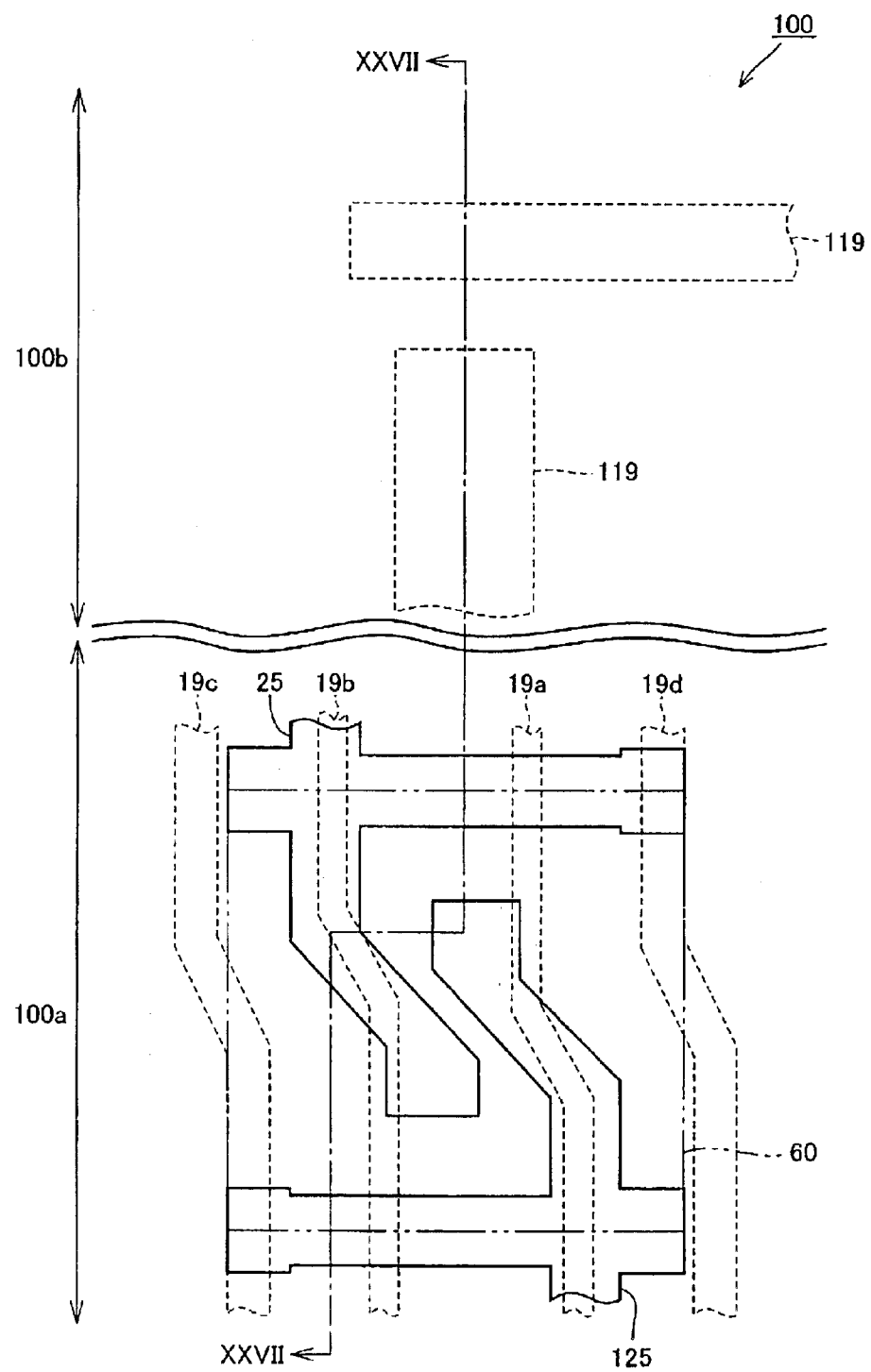
FIG. 26 is a plan view of the semiconductor device of FIG. 25 corresponding to a first step of a fabrication method thereof.
Figure 27:
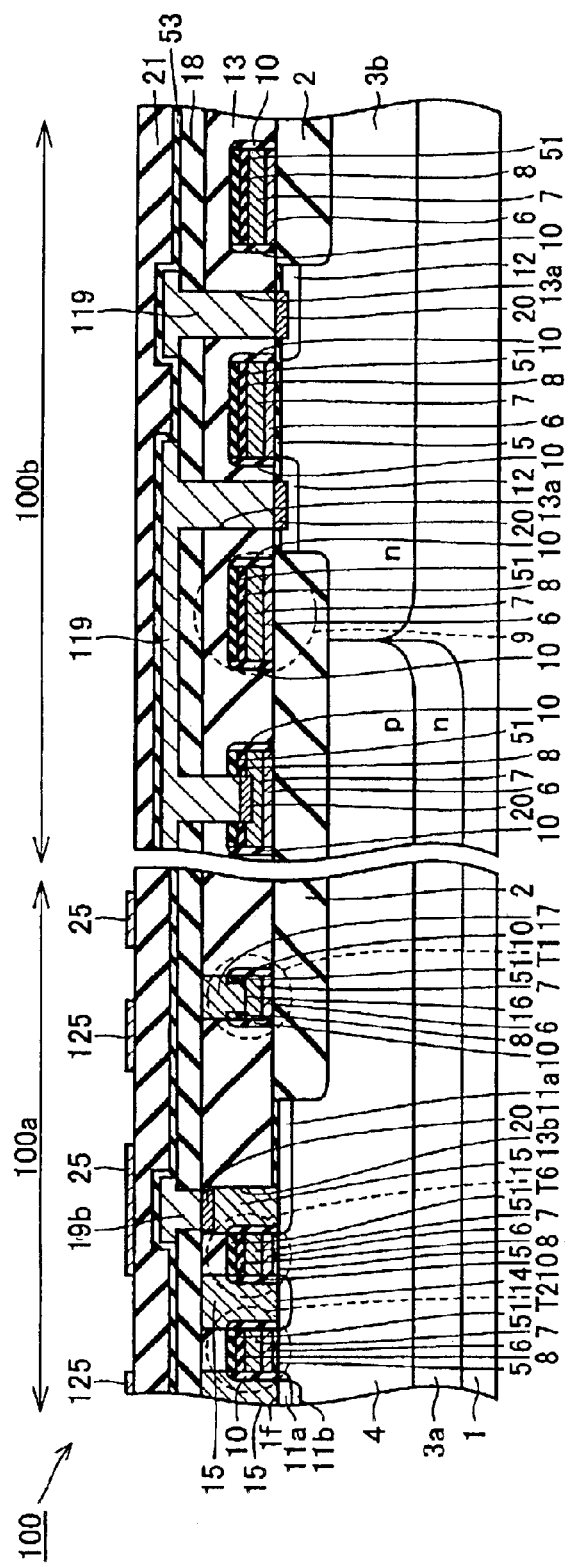
FIG. 27 is a sectional view of the semiconductor device of FIG. 26 taken along line XXVII—XXVII.

Referring to FIGS. 26 and 27, silicon nitride film 53 and interlayer insulation film 21 are disposed. Amorphous polysilicon is vapor-deposited on interlayer insulation film 21, and then subjected to annealing and etching to form TFT polycrystalline silicon 25 corresponding to the channel, source, and drain regions of a TFT. At this step, boron or phosphorus can be implanted for channel doping to set the TFT at a predetermined threshold voltage Vth. TFT polycrystalline silicons 25 and 125 have conductivity.

Figure 28:
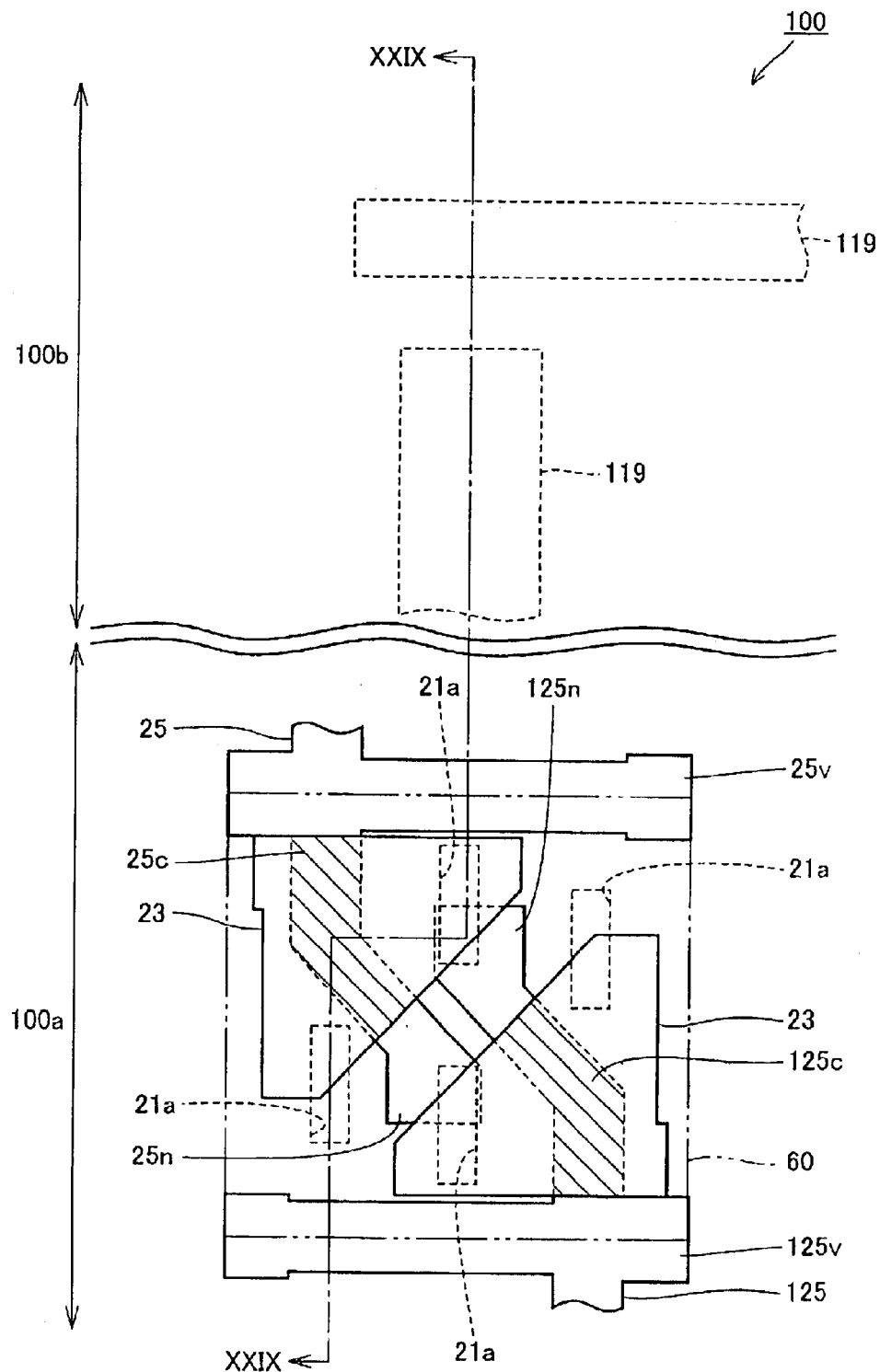
FIG. 28 is a plan view of the semiconductor device of FIG. 25 corresponding to a second step of a fabrication method thereof.
Figure 29:
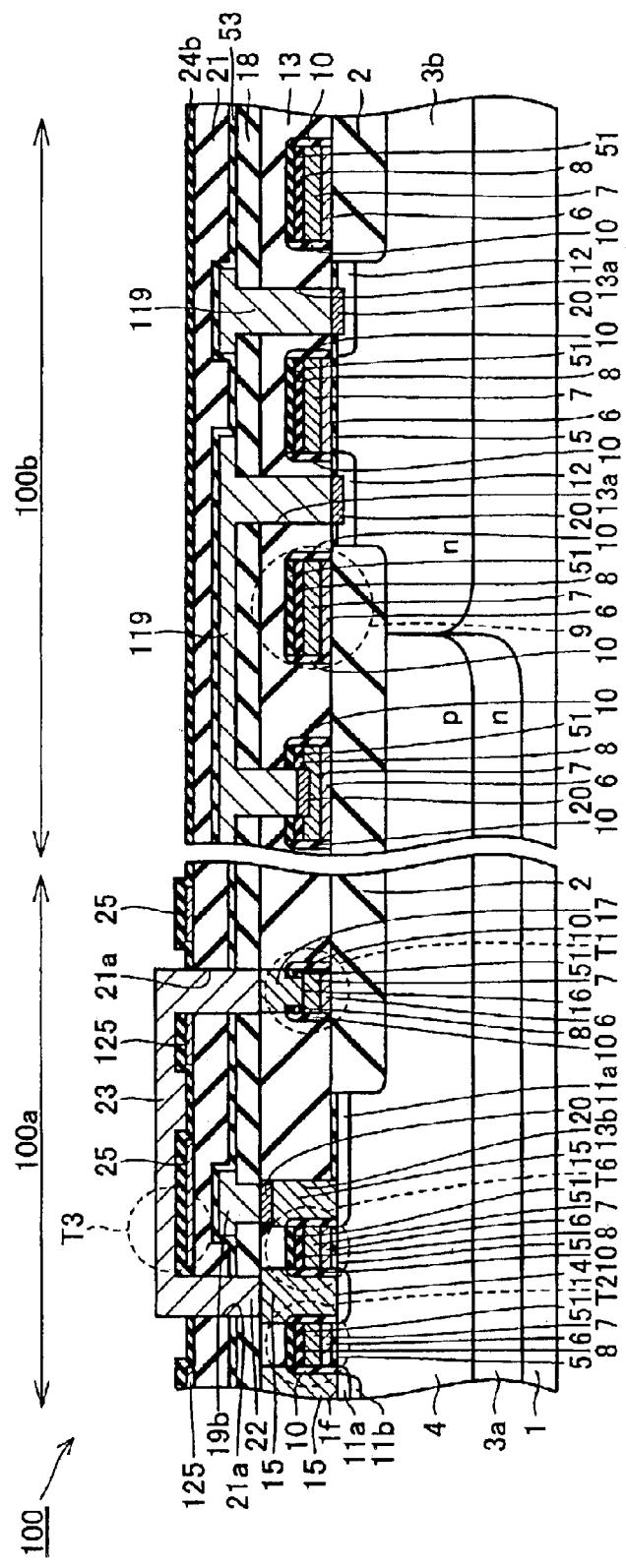
FIG. 29 is a sectional view of the semiconductor device of FIG. 28 taken along line XXIX—XXIX.

Referring to FIGS. 28 and 29, TFT gate oxide film 24b is vapor-deposited on TFT polycrystalline silicons 25 and 125. Then, TFT gate oxide film 24b, interlayer insulation films 21 and 23, and silicon nitride film 53 are etched to form contact hole 21a. A doped polysilicon layer is vapor-deposited to fill contact hole 21a and so as to cover the surface of TFT gate oxide film 24b, and then etched to form TFT gate electrode 23. For purpose of forming the source and drain regions of a TFT, boron ions are selectively implanted to TFT polycrystalline silicon 25 to form Vcc regions 25b and 125b as well as storage node regions 25n and 125n, corresponding to p+ regions (p type impurity region of high concentration). Inverter load transistors T3 and T4 are formed. Load transistors T3 and T4 are formed of thin film transistors, indicated by the hatched region in FIG. 28.

Figure 30:
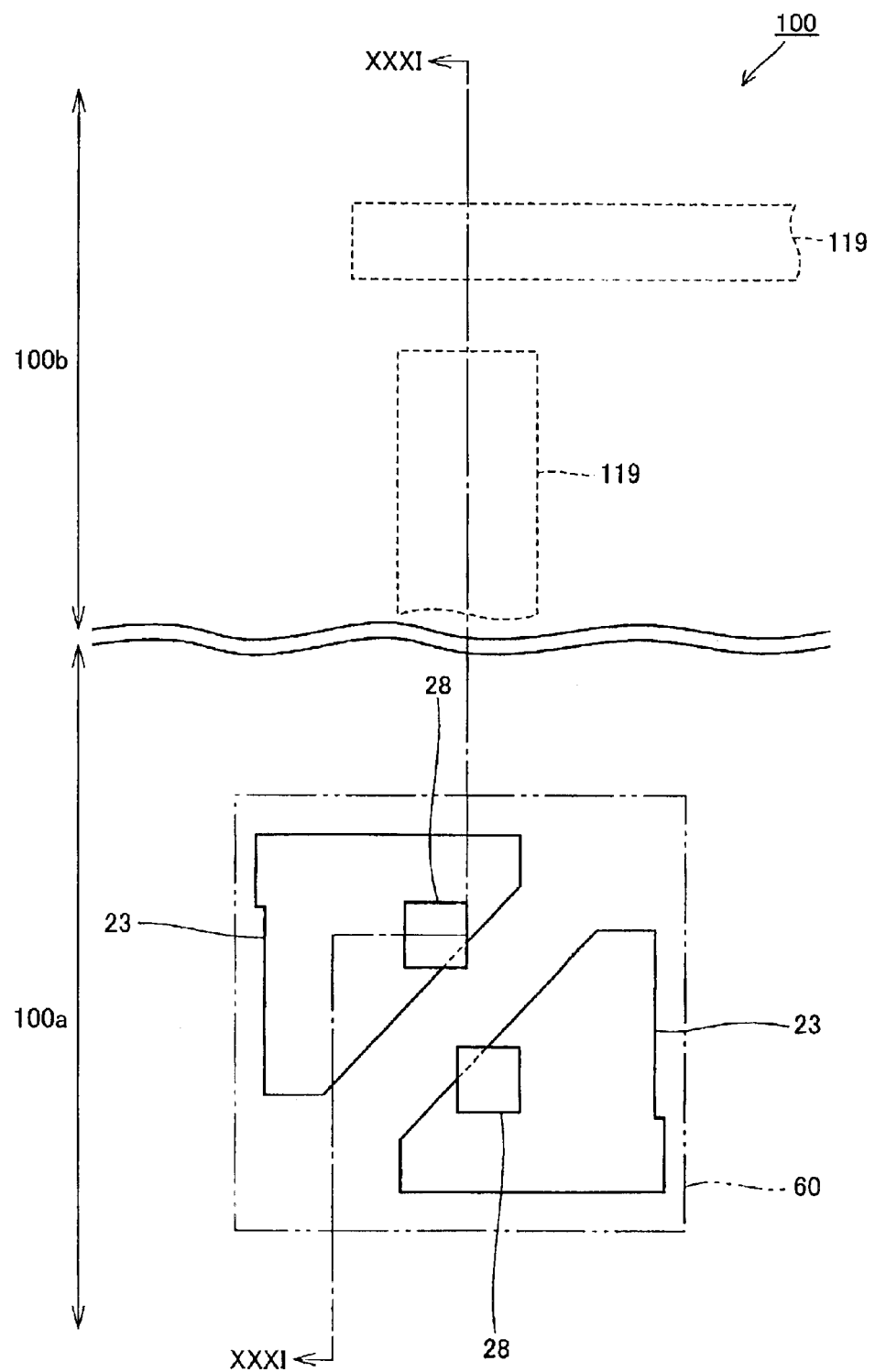
FIG. 30 is a plan view of the semiconductor device of FIG. 25 corresponding to a third step of a fabrication method thereof.
Figure 31:
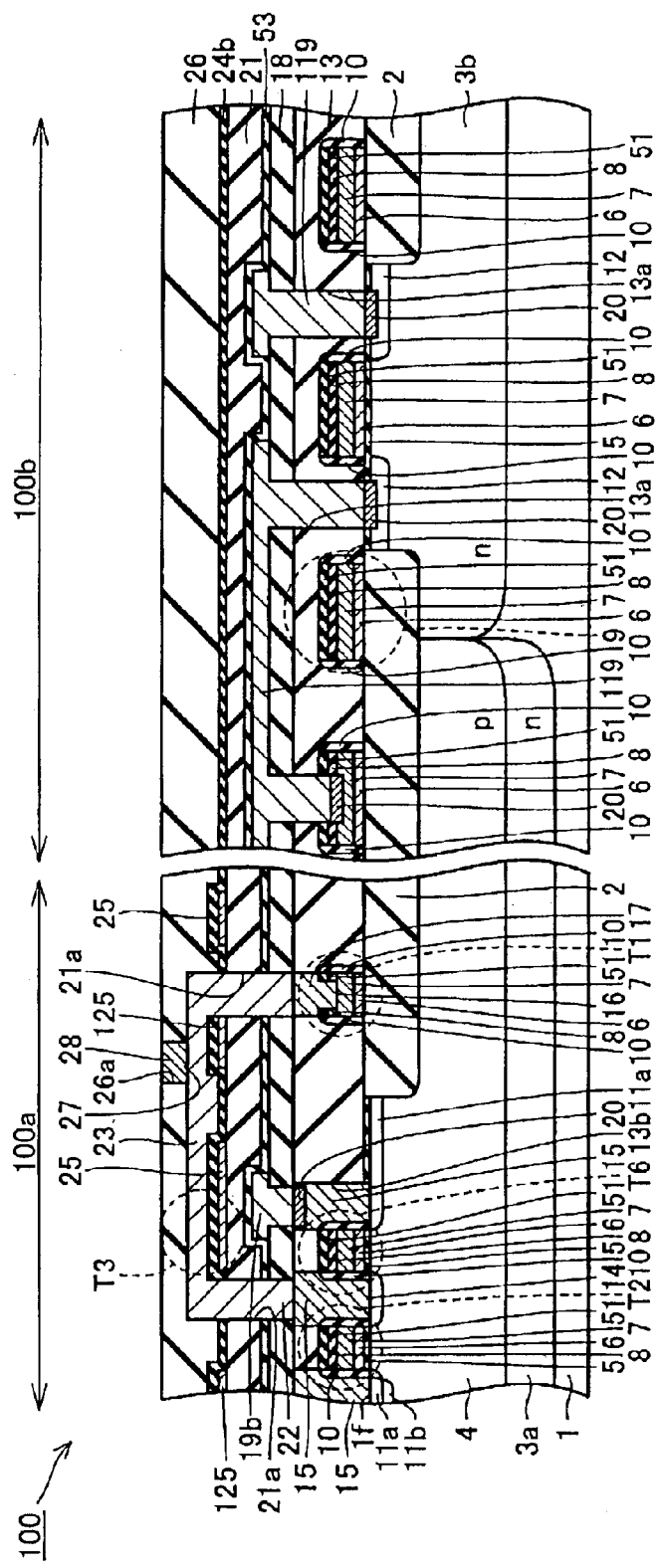
FIG. 31 is a sectional view of the semiconductor device of FIG. 30 taken along line XXXI—XXXI.

Referring to FIGS. 30 and 31, interlayer insulation film 26 is vapor-deposited, and then etched to form contact hole 26a. Doped polysilicon is deposited so as to fill contact hole 26a. Accordingly, buried contact 27 is generated between the doped polysilicon and TFT gate electrode 23. Also, the exposed doped polysilicon on interlayer insulation film 26 is etched to form polypad 28.

The subsequent steps are similar to those of the first embodiment. A capacitor and the like are formed.

The semiconductor device of the fourth embodiment offers the same advantages of the semiconductor device of the first embodiment. The semiconductor device of the fourth embodiment is further advantageous in that, since TFT polycrystalline silicons 25 and 125 forming a TFT channel are covered with TFT gate electrode 23, TFT polycrystalline silicons 25 and 125 are relatively unsusceptible to the effect of the cell plate potential of capacitor C1 located above.

Fifth Embodiment

Figure 32:
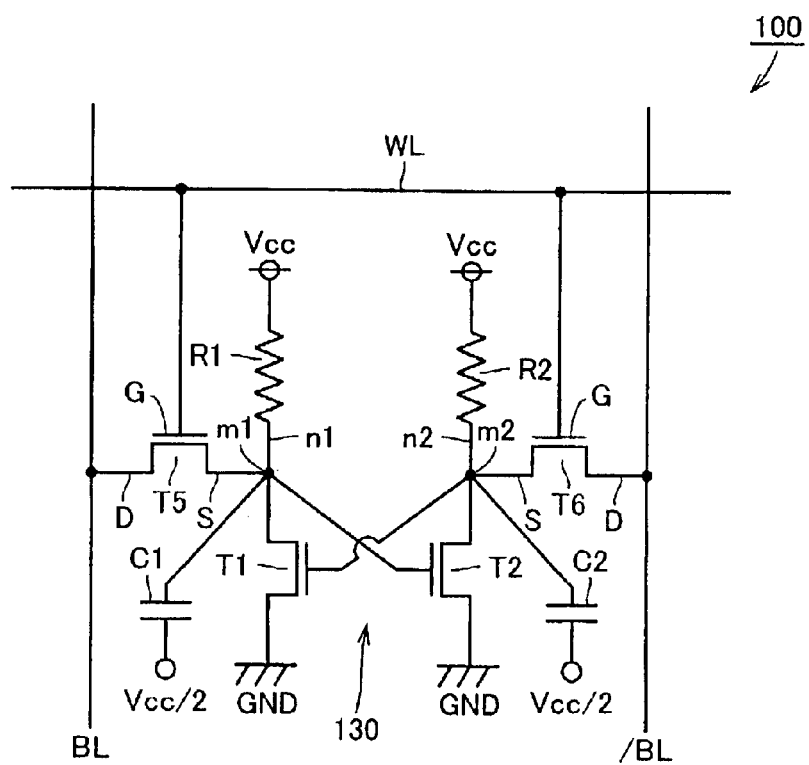
FIG. 32 is an equivalent circuit diagram of a semiconductor device according to a fifth embodiment of the present invention.
Figure 33:
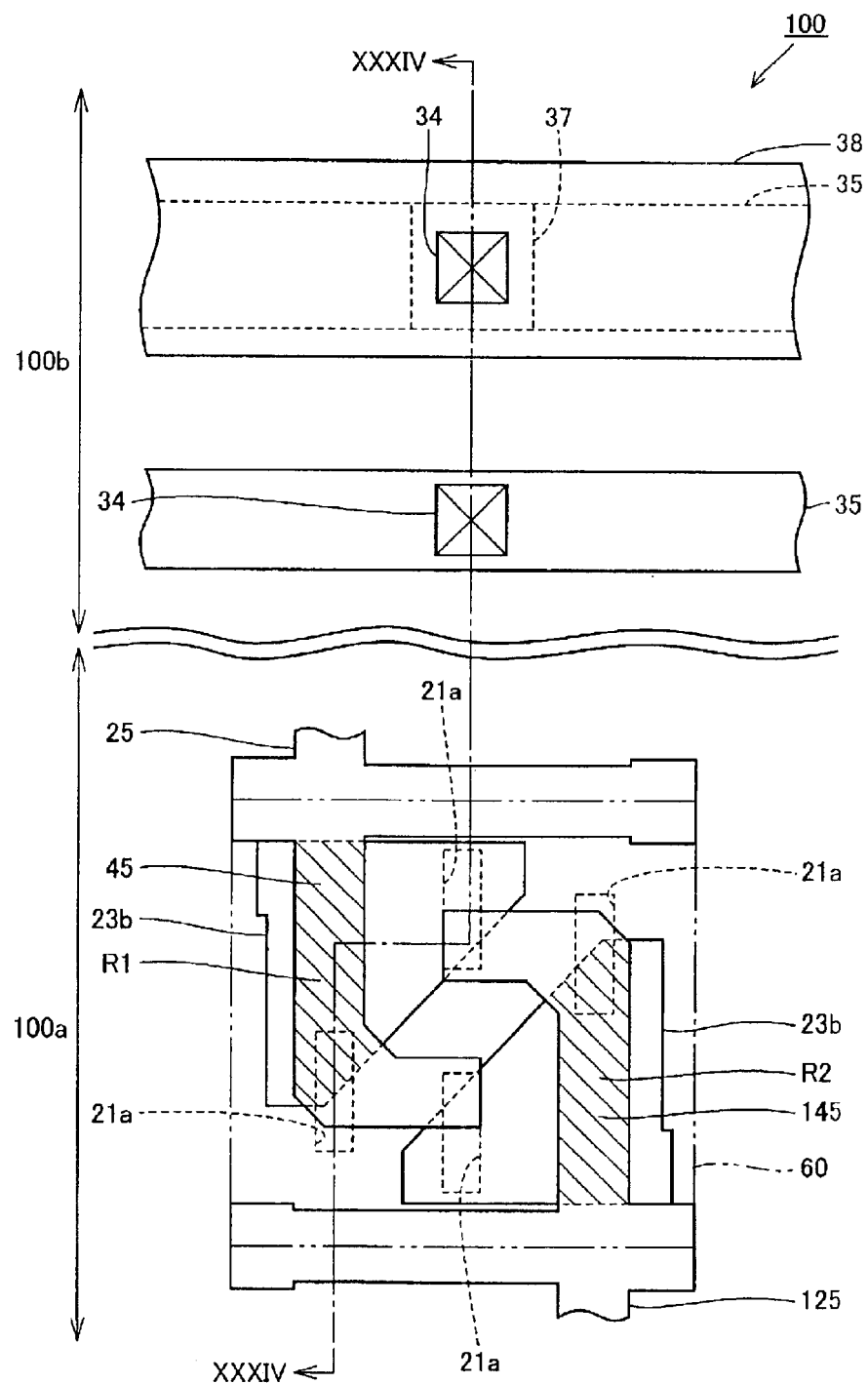
FIG. 33 is a plan view of the semiconductor device of FIG. 32.
Figure 34:
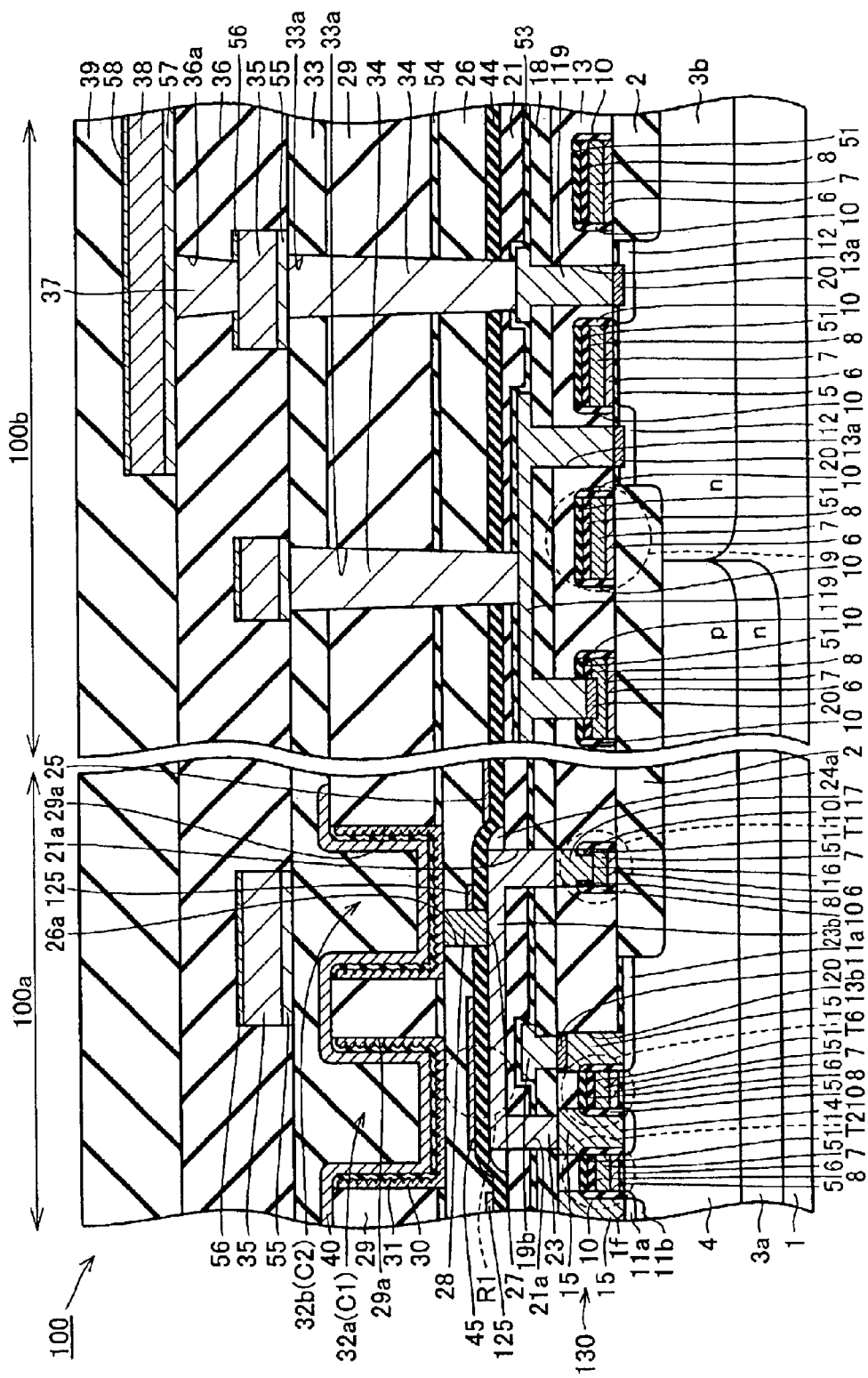
FIG. 34 is a sectional view of the semiconductor device of FIG. 33 taken along line XXXIV—XXXIV.

Referring to FIGS. 32–34, semiconductor device 100 according to a fifth embodiment of the present invention differs from the semiconductor device of FIG. 3 in that TFT gate oxide film 24b and TFT polycrystalline silicon 25 identified as a TFT body are replaced with an interlayer insulation film 44 formed of an interlayer silicon oxide film and a load resistance element 45 identified as a low resistance element formed of polycrystalline silicon. As shown in FIG. 34, access transistor T6 is formed on silicon substrate 1, and capacitor 32b (C2) is formed thereon. Conduction is established between impurity region 11a that is the source and drain regions of access transistor T6 and storage node 30 of capacitor 32b (C2) through polypad 28 and TFT gate electrode 23 piercing interlayer insulation films 26, 44, 21 and 18 and silicon nitride film 53. Gate electrode 9 of driver transistor T1 is electrically connected to load resistance element 45 (drain region D) formed of high resistance polycrystalline silicon.

As shown in FIG. 32, drain region D of access transistor T5 is connected to bit line BL. The source region (S) of access transistor T5 is electrically connected to storage node 30 of capacitor C1, which form the portion corresponding to a conventional DRAM memory cell. Drain region D of access transistor T6 is connected to complementary bit line /BL. Source region S of access transistor T6 is electrically connected to storage node 30 of capacitor C2. This constitutes the portion corresponding to a conventional DRAM memory cell.

Driver transistor T1 and load resistance element R1 of high resistance polysilicon form one storage node and n1, whereas driver transistor T2 and load resistance element R2 of high resistance polysilicon form the other storage node n2. A flip-flop circuit formed of these two nodes constitute the latch circuit for the above-described DRAM memory cell. By forming an inverter of the flip-flop circuit by the combination of electrical resistance and transistors, the fabrication step is simplified as compared to an inverter formed of two CMOS transistors. Thus, an economic semiconductor memory device can be provided.

The signal writing and reading operations of the above-described memory cell circuit will be described hereinafter. Bit line BL and complementary bit line /BL are connected to memory cell 60. In a writing mode, opposite signals are applied to bit line BL and complementary bit line /BL with the potential of word line WL at the level of, for example, super Vcc (at least Vcc+threshold voltage Vth of driver transistor). When potential High (for example Vcc potential) is applied to bit line BL, for example, the potential of connection node m1 attains the potential level of High. Therefore, capacitor C1 is charged. A minus potential or zero potential is applied from complementary bit line /BL to connection node m2. Therefore, connection node m2 attains the potential level of Low, so that capacitor C2 is not charged. In the flip-flop circuit, connection node m1 attains the level of internal Vcc potential whereas connection node m2 attains the zero potential or ground potential. Although leakage will occur at the junction or driver transistors T1 and access transistor T5, the potential of connection node m1 will not be reduced since charge is supplied from load resistance element R1. Therefore, the potential level of High can be maintained stably.

In a read out mode, the potential difference between bit lines BL and /BL is sensed by a sense amplifier and amplified for data readout. Since the potential at connection nodes m1 and m2 are maintained at the predetermined level, leakage from capacitors C1 and C2 can be prevented. Therefore, a refresh operation is dispensable.

The aforementioned high resistance element (load resistance element) 45 is arranged above other driver transistors T1 and T2, constituting a three dimensional structure. Therefore, the semiconductor device can be reduced significantly in size as compared to the case where an SRAM memory cell is formed.

The problem of built-in potential (Vbi) caused by pn junction cited in the first embodiment is eliminated. Operation can be conducted stably. Load resistance element 45 formed of high resistance polycrystalline silicon identified as a load resistance element and polypad 28 include impurities of the same conductivity type.

In the semiconductor device of the fifth embodiment, latch circuit 130 is a flip-flop circuit including load resistance element 45. Load resistance element 45 is arranged above bit line 19b. Polypad 28 may be replaced with a plug layer such as of metal. In this case, storage node 30 is connected to load resistance element 45 with a plug layer therebetween. The plug layer portion connected to load resistance element 45 includes metal.

The method of fabricating the semiconductor device of FIG. 34 will be described here. The processing steps up to formation of interlayer insulation film 21 are similar to those of the first embodiment. Then, contact hole 21a is formed in interlayer insulation film 21, silicon nitride film 53, and interlayer insulation film 18. In the step of forming contact hole 21a, a silicon nitride film can be vapor-deposited in contact hole 21a and then etched to reduce the dimension of the contact hole. Doped polysilicon is then deposited so as to fill contact hole 21a. A buried contact is generated at the interface between the doped polysilicon and polypads 15 and 17. The doped polysilicon is etched to form polysilicon interconnection 23b. Then, a silicon oxide film is vapor-deposited and then etched back entirely to form sidewall insulation film 24a. A silicon oxide film is deposited thereon to form interlayer insulation film 44. In this step, interlayer insulation film 44 is preferably set to a thickness to 50–500 nm, thicker than TFT gate oxide film 34b of the first embodiment, in order to avoid the influence of polysilicon interconnection 23b.

Undoped polysilicon is vapor-deposited there and then etched to form load resistance element 45 of high resistance polysilicon. In this step, phosphorus or the like may be implanted to attain a desired high resistance. Then, arsenic ions are selectively implanted into the interconnection region of load resistance element 45 in order to form an intermediate resistance region. By this processing step, load resistance elements R1 and R2 connected to the gate of driver transistor T1 or T2 respectively is formed (refer to FIG. 33). It is to be noted that phosphorus and arsenic are both n type impurities. The problem of built-in potential (Vbi) caused by pn junction as described in the first embodiment is eliminated. In the above-described formation of high resistance polysilicon, the process of annealing or the like is not required. The processing step is more simplified than the processing steps of a CMOS transistor. Therefore, the fabrication cost can be reduced. It is to be that load resistance elements R1 and R2 of high resistance polycrystalline silicon have little, if any, impurities doped, whereas TFT polycrystalline silicons 25 and 125 identified as other interconnection regions are heavily doped with n type impurities.

Then, a silicon oxide film is deposited to generate interlayer insulation film 26. Contact hole 26a is formed so as to pierce interlayer insulation films 26 and 44 and to come into contact with polysilicon interconnection 23b. Doped polysilicon is deposited so as to fill contact hole 26a. Accordingly, a contact 27 is formed at the interface between the doped polysilicon and polysilicon interconnection 23b. Doped polysilicon is etched to form polypad 28. The subsequent processing steps are similar to those of the first embodiment.

The above-described fabrication method includes the step of forming a latch circuit by coupling one pair of inverters configured by electrical resistance formed of high resistance polycrystalline silicon and driver transistors in the conventional step of forming an access transistor and a capacitor constituting a DRAM memory cell. The above-described fabrication method can be realized by slightly modifying the conventional DRAM fabrication line. Therefore, a semiconductor memory device corresponding to the circuitry shown in FIG. 32 can be fabricated based on the step shown in FIG. 34.

Sixth Embodiment

Figure 35:
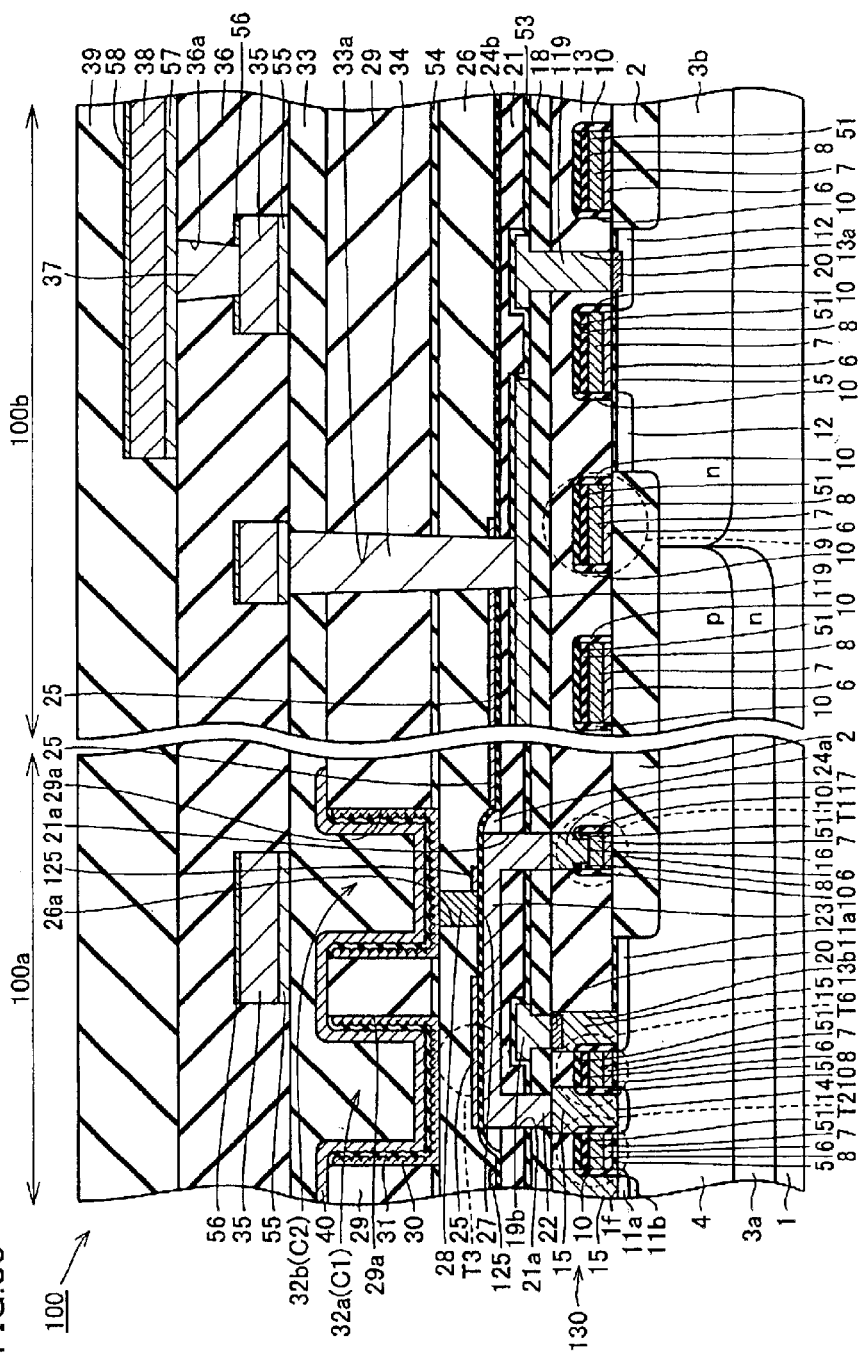
FIGS. 35–38 are sectional views of a semiconductor device according to a sixth embodiment of the present invention.
Figure 36:
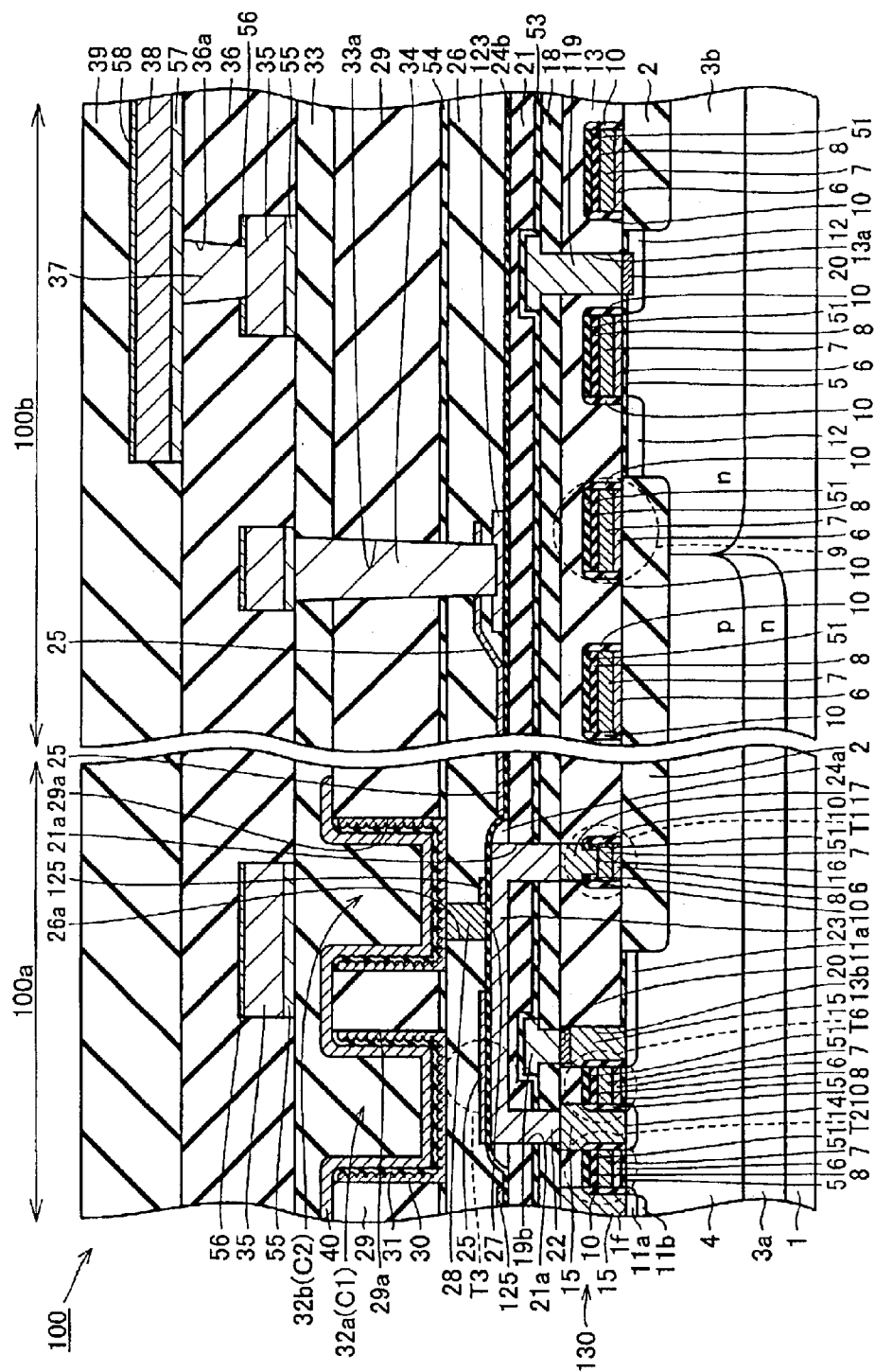
Figure 37:
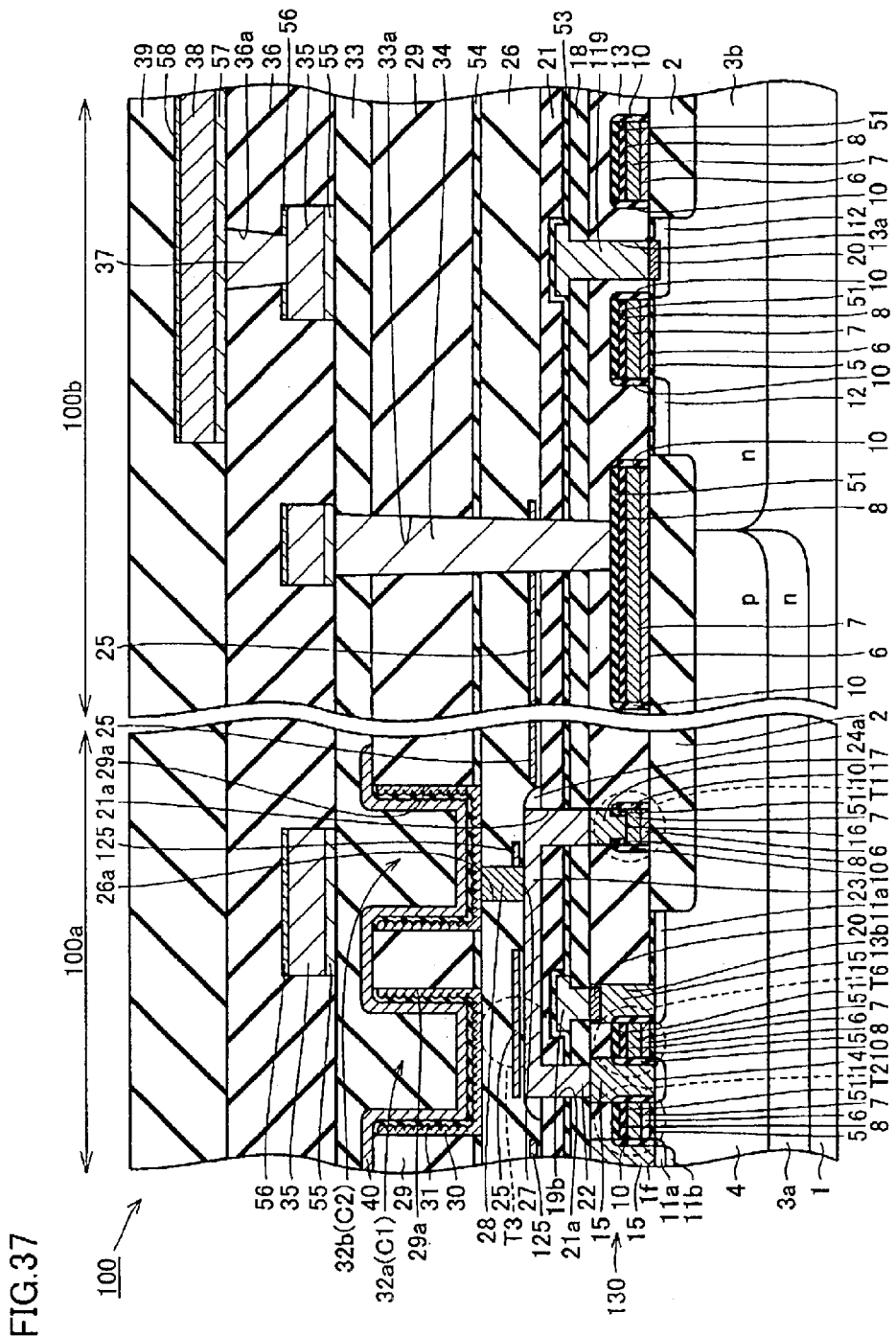
Figure 38:
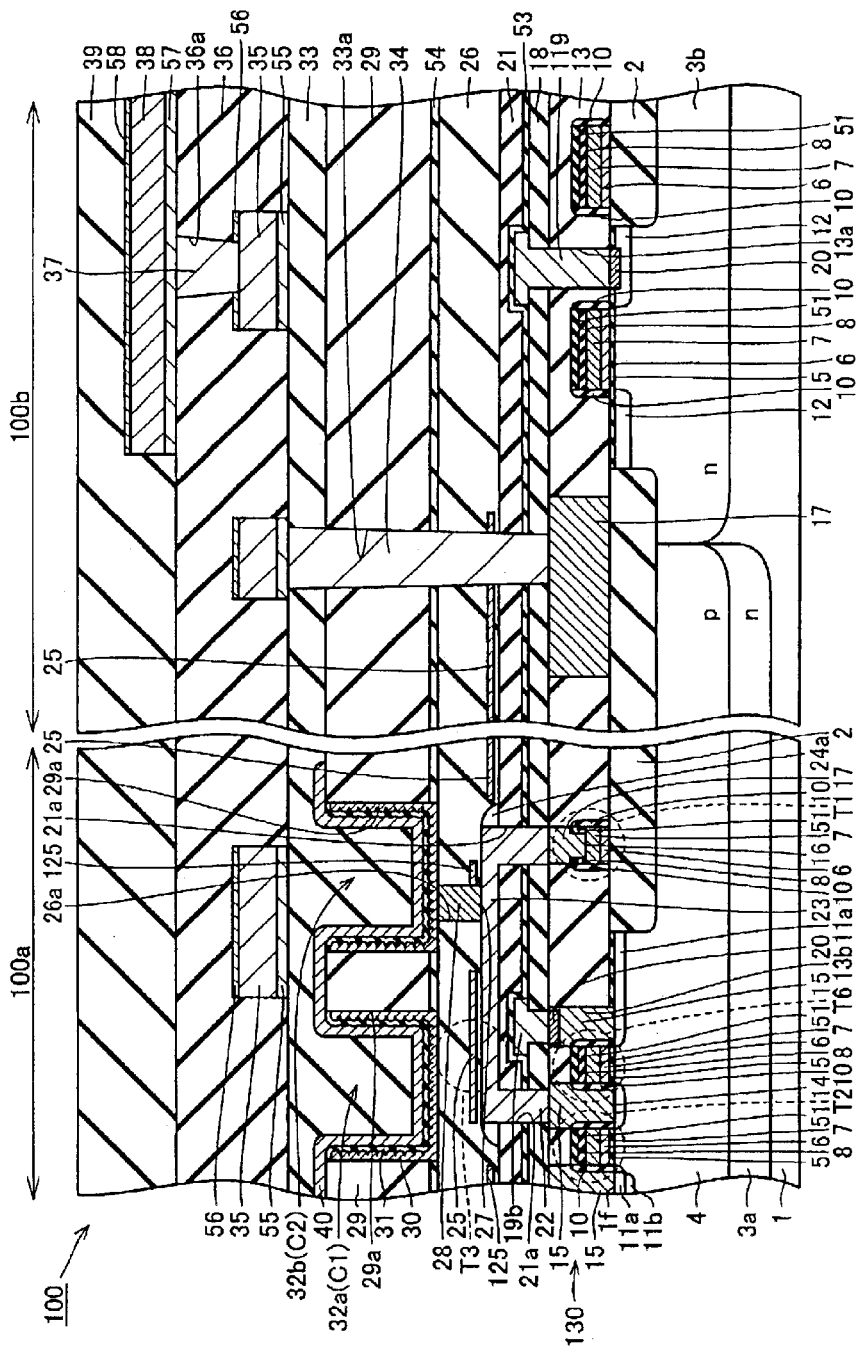

Semiconductor device 100 shown in FIGS. 35–38 is a modification of the semiconductor device according to the first embodiment shown in FIG. 3. Referring to FIG. 35, semiconductor device 100 of the sixth embodiment has metal contact 34 extending up to tungsten interconnection 119. Referring to FIG. 36, metal contact 34 extends up to polysilicon electrode 123. Referring to FIG. 37, metal contact 34 extends up to gate electrode 9. Referring to FIG. 38, metal contact 34 extends up to polypad 17 through TFT polycrystalline silicon 25.

The semiconductor device of the above-described structure offers advantages similar to those of the semiconductor device of the first embodiment.

Seventh Embodiment

Figure 39:
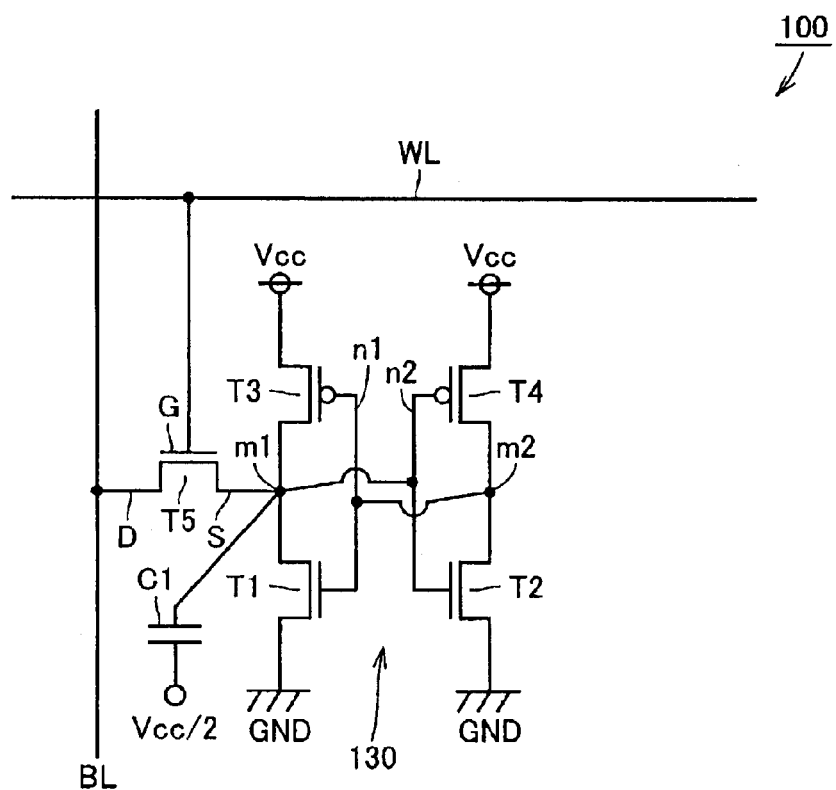
FIG. 39 is an equivalent circuit diagram of a semiconductor device according to a seventh embodiment of the present invention.

Referring to FIG. 39, semiconductor device 100 according to a seventh embodiment of the present invention differs from the semiconductor device of the first embodiment including two capacitors C1 and C2 in that only one capacitor C1 is provided. In this case, the equivalent circuit includes one bit line and one capacitor. The precharge potential of the bit line is preferably set to Vcc/2.

The above embodiment is described based on a structure in which a TFT of high resistance is employed as the load of a flip-flop circuit forming a latch circuit. However, a latch circuit or a flip-flop circuit formed of any element may be employed as long as the potential of the storage node can be maintained for a predetermined cycle. For example, a latch circuit may be formed with four inverters connected in series or in combination with other logic gates. Particularly, from the standpoint of reducing the size of the semiconductor memory device of the present invention, at least one of the circuit elements constituting the latch circuit is to be located above the access transistor. In other words, the size in plane can be reduced by providing a three dimensional structure.

Furthermore, the access transistor is disposed at the surface layer of the semiconductor substrate, and the capacitor is disposed within an interlayer insulation film located upper of the semiconductor substrate with at least one layer of an interlayer insulation film therebetween. The latch circuit is preferably formed lower than the upper interlayer insulation film. According to the present structure, each component of the semiconductor memory device can be provided in a three dimensional structure such as in the order of a silicon substrate, an access transistor, a latch circuit, and a capacitor upwards from the lower side with partial overlapping. Since some of the circuit elements are disposed upper than the bit line and ground line in the intermediate interlayer insulation film, the degree of freedom in arranging the circuit elements can be increased. Specifically, the gate dimension of a TFT device can be increased. Furthermore, sufficient resistance length of a high resistance element can be ensured, and variation in the device characteristics caused by deviation in the mask alignment can be reduced. Thus, the latch circuit reliability can be improved.

Thus, a refresh operation can be eliminated, and the size in plane can be reduced. Also, a conventional fabrication method can be adapted to the fabrication method of the present invention and form a latch circuit that can readily be electrically connected to a conduction path establishing connection between the source and drain regions of an access transistor and a storage node. The site electrically connected to the latch circuit may be any region in the conduction path that includes the storage node and the source and drain regions of the access transistor.

The electrical resistance in the inverter forming the flip-flop circuit can be achieved readily by fabrication of polycrystalline silicon including impurities. The electrical resistance may be generated with a material other than silicon.

Eighth Embodiment

Figure 40:
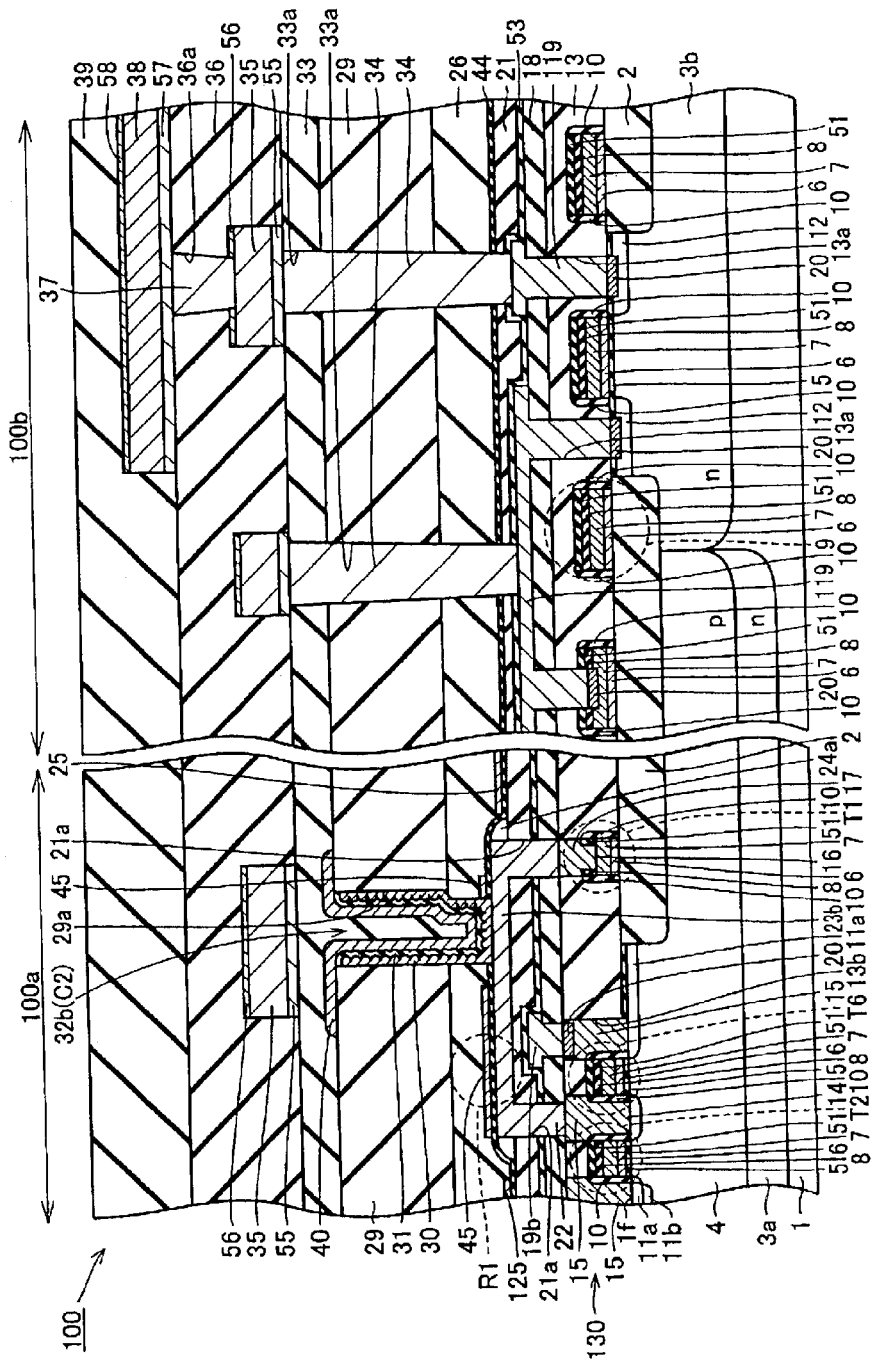
FIG. 40 is a sectional view of a semiconductor device according to an eighth embodiment of the present invention.

Referring to FIG. 40, semiconductor device 100 according to an eighth embodiment of the present invention has storage node 30 directly in contact with polysilicon interconnection 23b. A hole 29a in contact with polysilicon interconnection 23b and load resistance element 45 is formed. Storage node 30 is formed in this hole 29a. The sidewall of storage node 30 is directly in contact with load resistance element 45.

Semiconductor device 100 of the eighth embodiment provides advantages similar to those of semiconductor device 100 of FIG. 34. Semiconductor device 100 of the eighth embodiment is further advantageous in that the fabrication step can be simplified since a plug layer is not formed.

Ninth Embodiment

Figure 41:
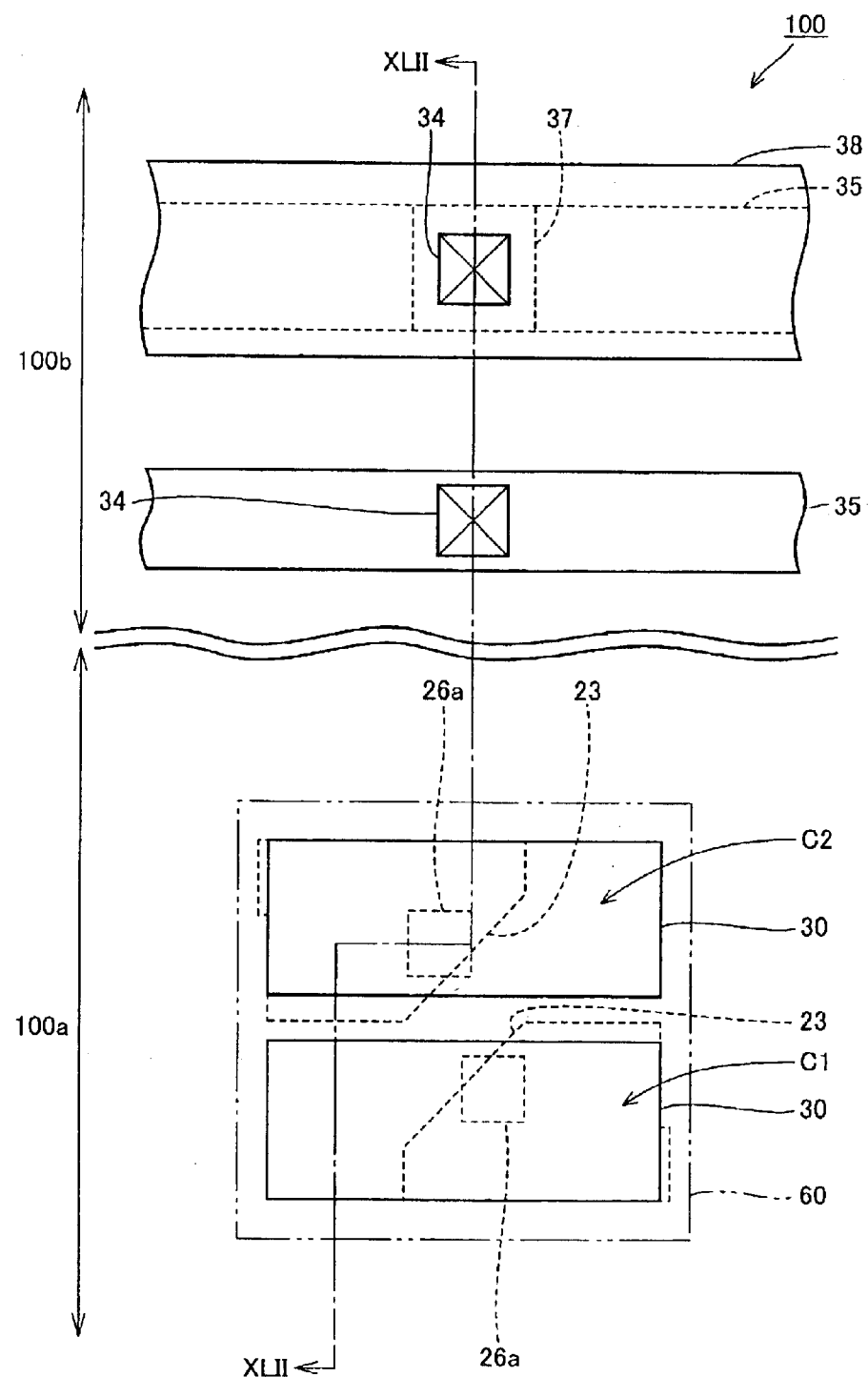
FIG. 41 is a plan view of a semiconductor device according to a ninth embodiment of the present invention.
Figure 42:
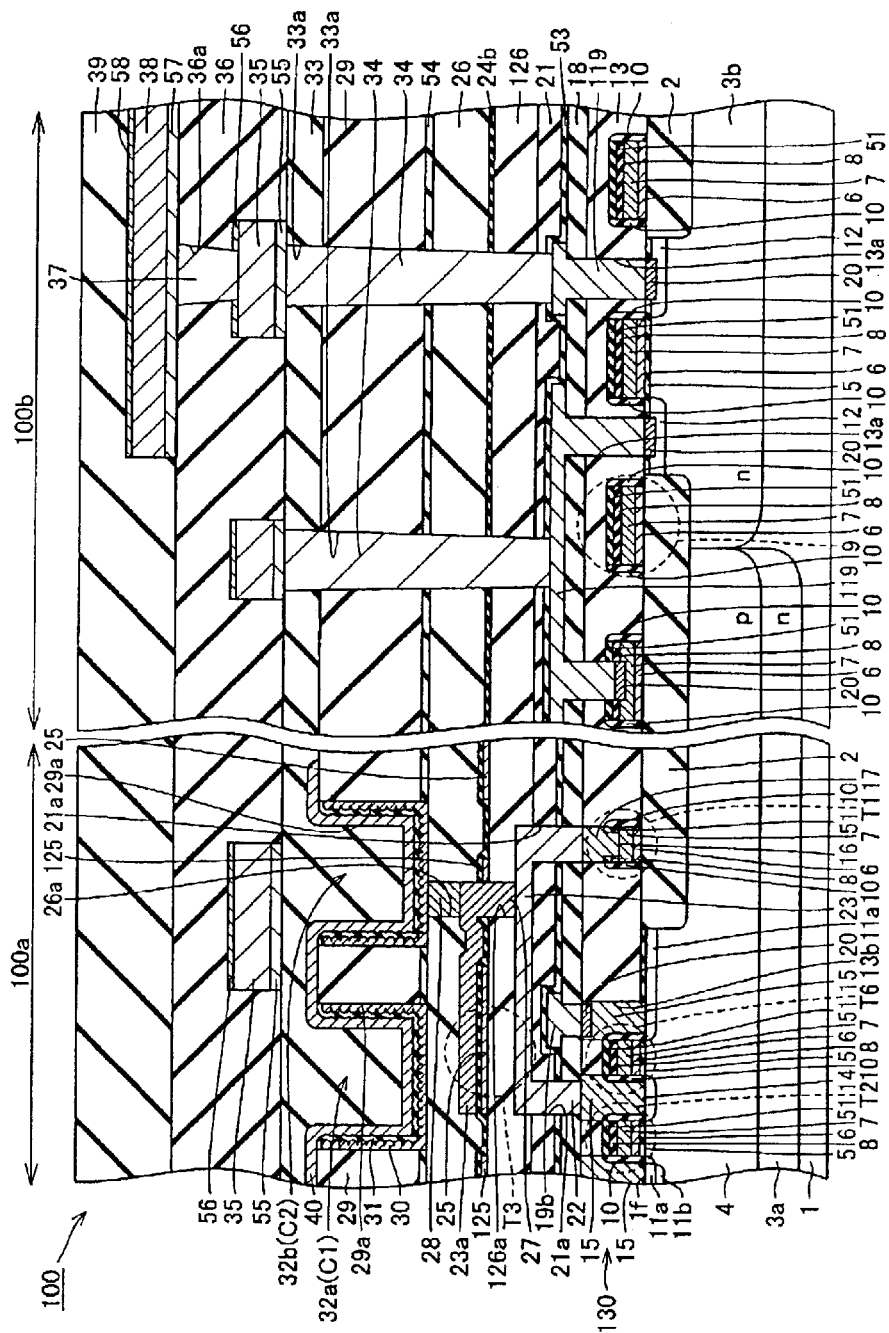
FIG. 42 is a sectional view of the semiconductor device of FIG. 41 taken along line XLII—XLII.

Referring to FIGS. 41 and 42, a semiconductor device according to a ninth embodiment of the present invention differs from the semiconductor device of the first embodiment in that an upper TFT gate electrode 23a is provided in addition to TFT gate electrode 23 provided in the first embodiment. TFT gate electrode 23 corresponds to a lower gate electrode. A double gate structure is established with TFT polycrystalline silicon 25 sandwiched between TFT gate electrode 23 and upper TFT gate electrode 23a. Buried contact 27a pierces TFT polycrystalline silicon 125 to connect TFT gate electrode 23 and upper TFT gate electrode 23a together. A capacitor is connected to upper TFT gate electrode 23a. Intermediate interlayer insulation film 126 is provided on silicon nitride film 53. Contact hole 126a is provided in intermediate interlayer insulation film 126. Contact hole 126a is filled with upper TFT gate electrode 23a. Accordingly, TFT gate electrode 23 is brought into contact with upper TFT gate electrode 23a.

Figure 43:
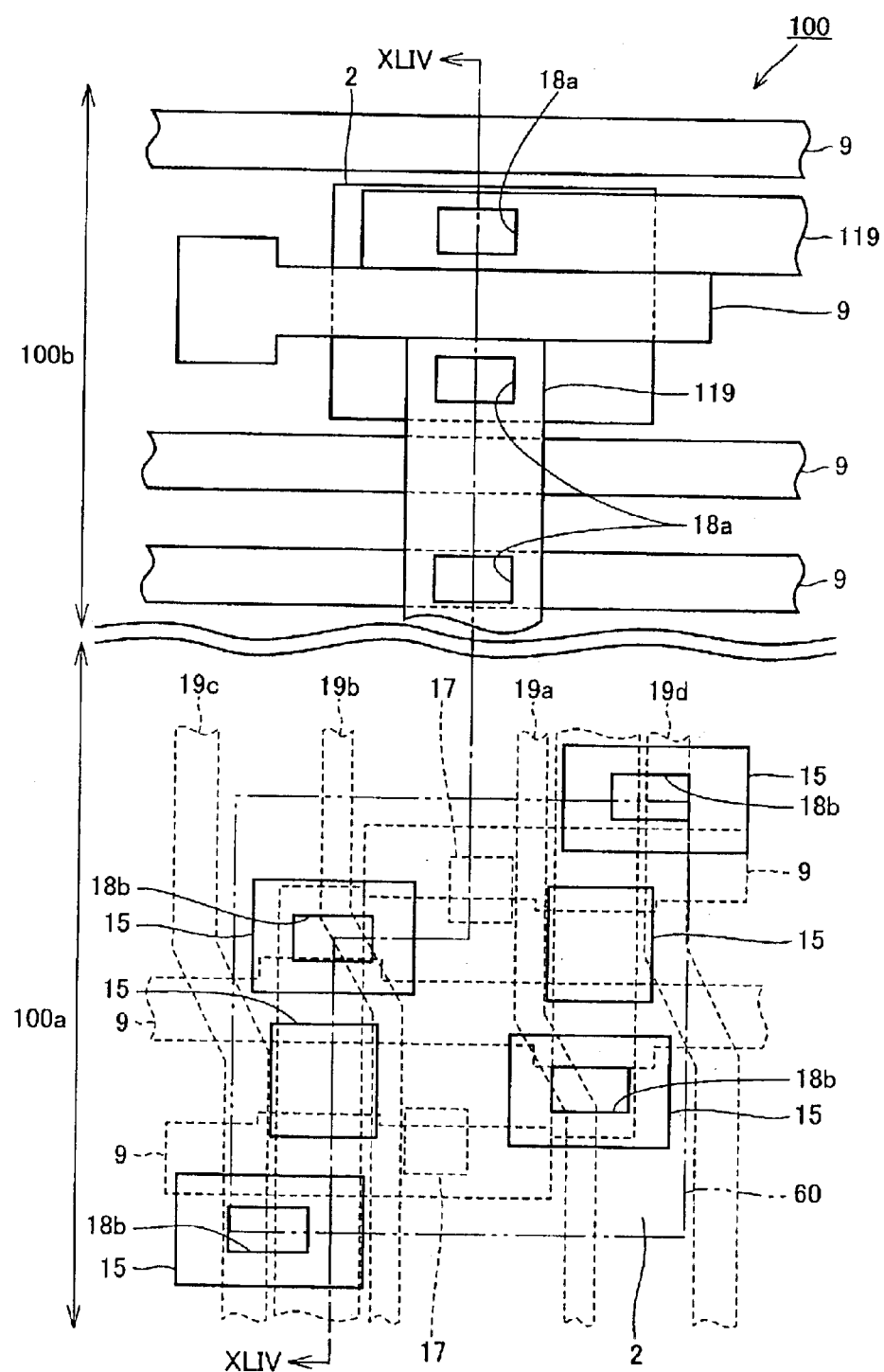
FIG. 43 is a plan view of the semiconductor device of FIG. 41 corresponding to a first step of a fabrication method thereof.
Figure 44:
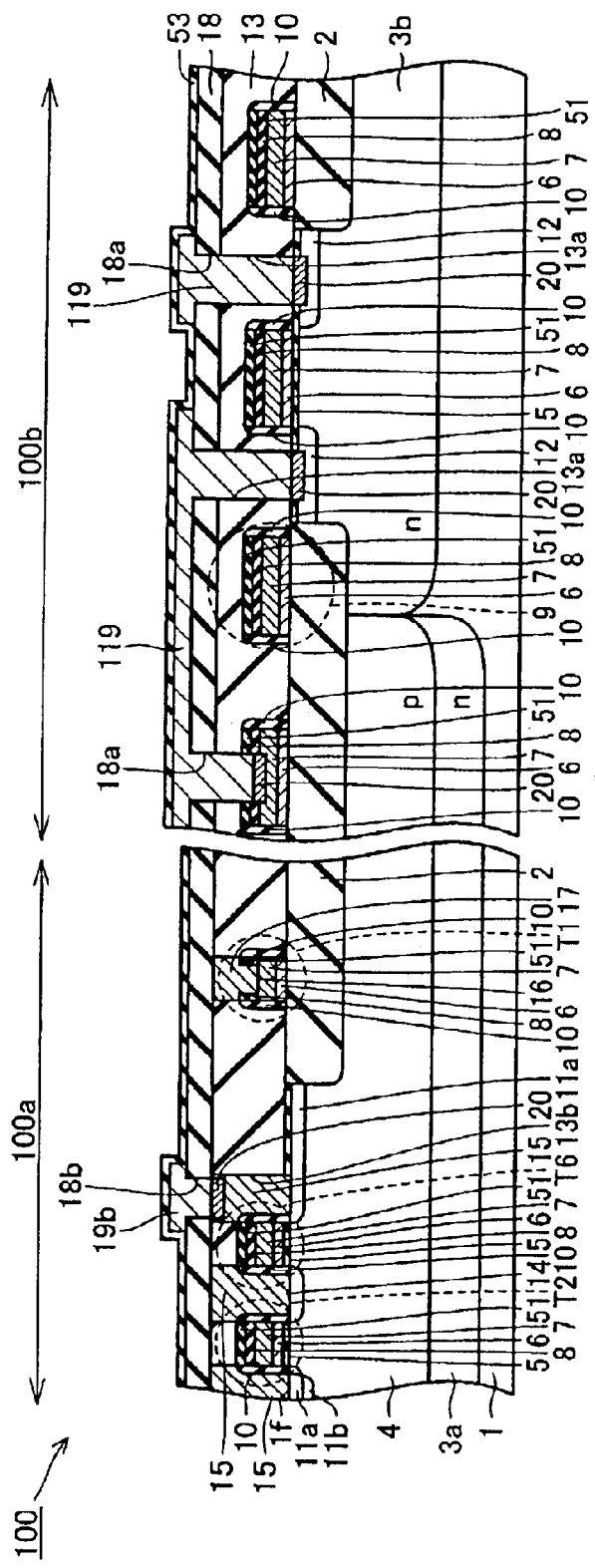
FIG. 44 is a sectional view of the semiconductor device of FIG. 43 taken along line XLIV—XLIV.

A method of fabricating the semiconductor device of FIGS. 41 and 42 will be described here. Referring to FIGS. 43 and 44, a semiconductor device of a structure up to silicon nitride film 53 is fabricated according to steps shown in FIGS. 4–11 in the first embodiment.

Figure 45:
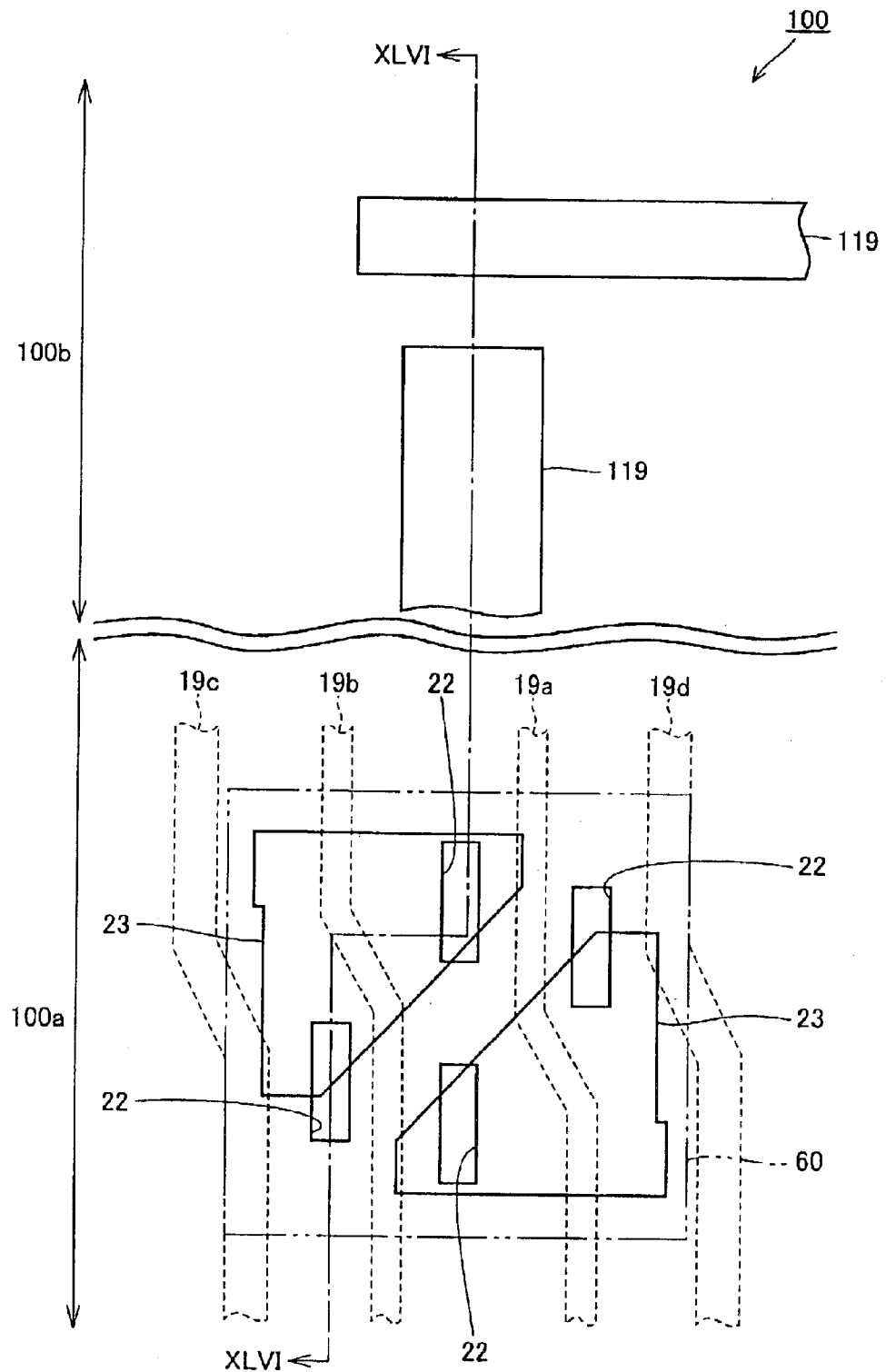
FIG. 45 is a plan view of the semiconductor device of FIG. 41 corresponding to a second step of a fabrication method thereof.
Figure 46:
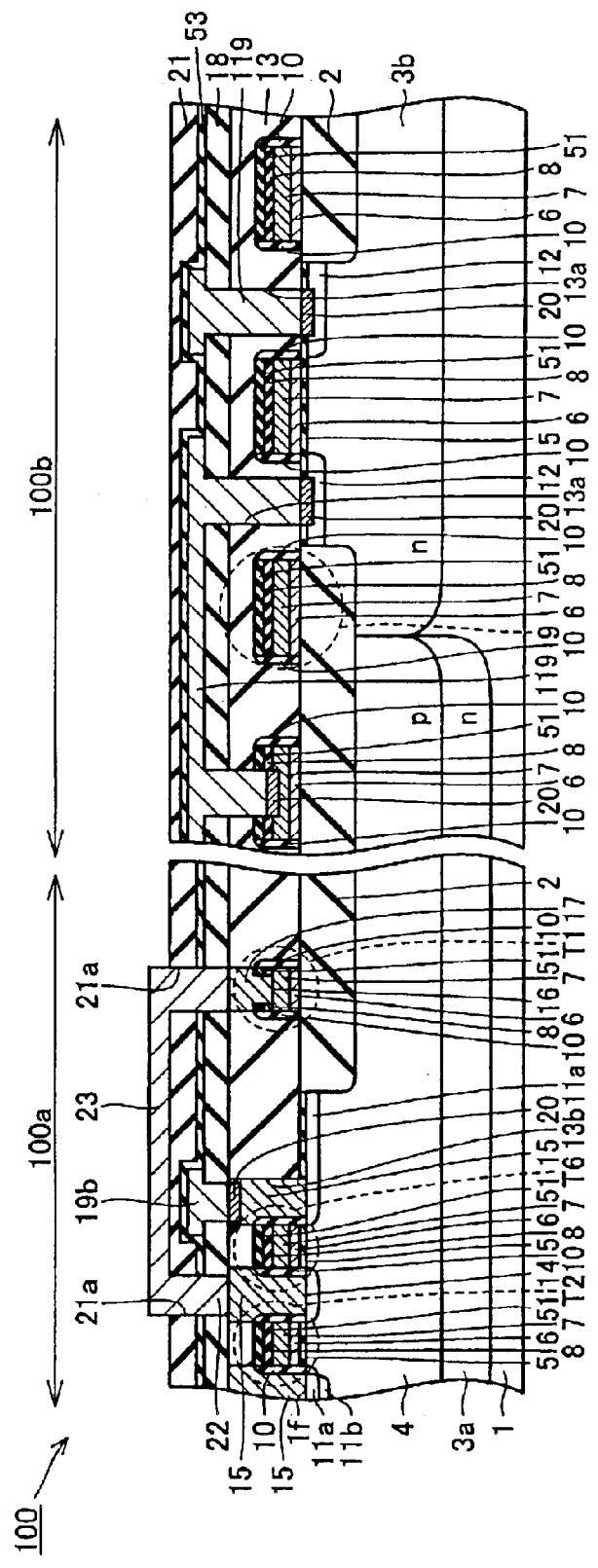
FIG. 46 is a sectional view of the semiconductor device of FIG. 45 taken along line XLVI—XLVI.

Referring to FIGS. 45 and 46, a resist pattern (not shown) is formed on interlayer insulation film 21. Using this resist pattern as a mask, interlayer insulation film 21, silicon nitride film 53 and interlayer insulation film 18 are etched. As a result, contact hole 21a is formed. TFT gate electrode 23 is disposed so as to fill contact hole 21a and cover the surface of interlayer insulation film 21 partially.

Figure 47:
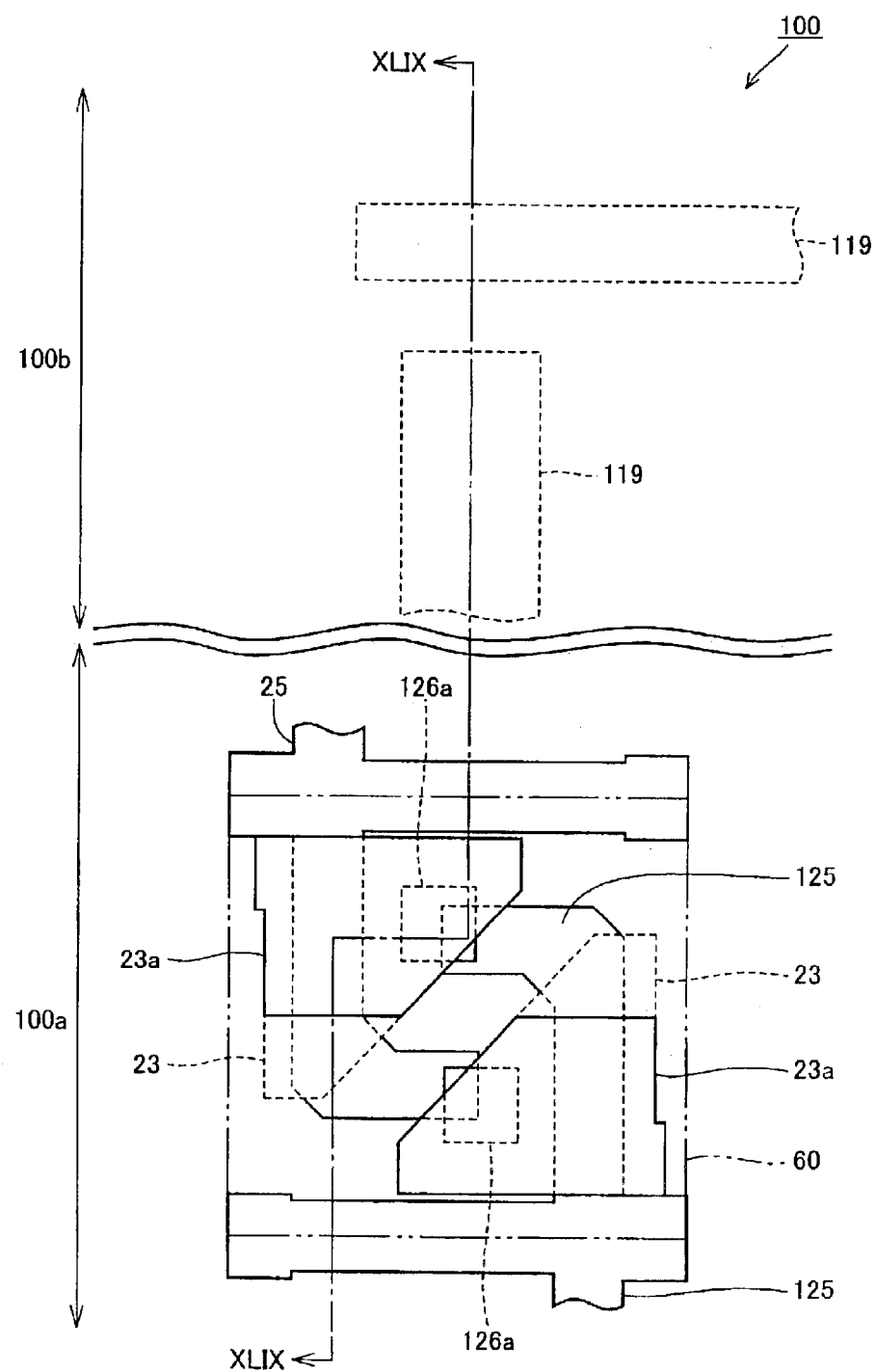
FIG. 47 is a plan view of the semiconductor device of FIG. 41 corresponding to a third step of a fabrication method thereof.
Figure 48:
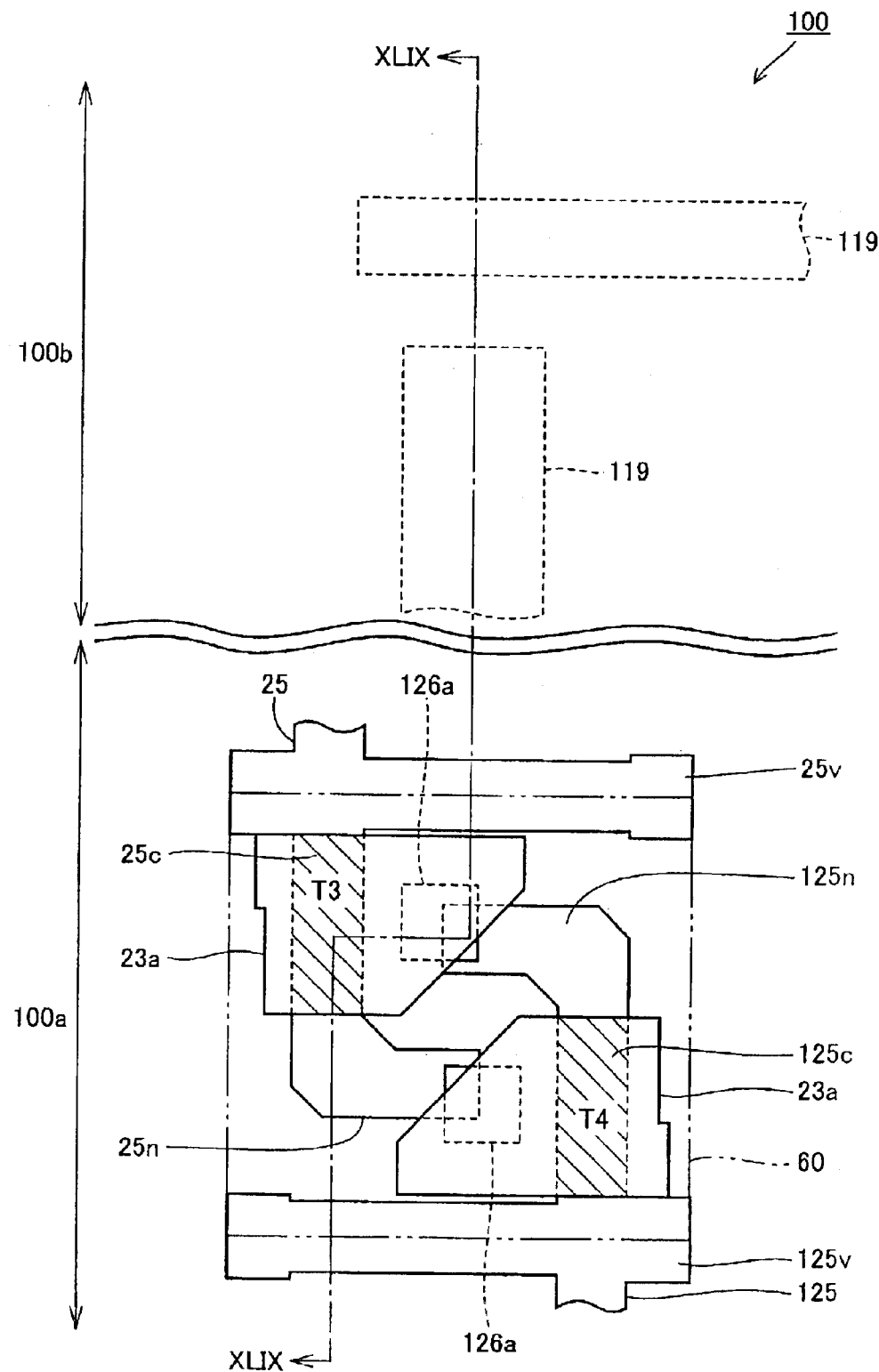
FIG. 48 is a plan view of load transistors T3 and T4 of FIG. 47.
Figure 49:
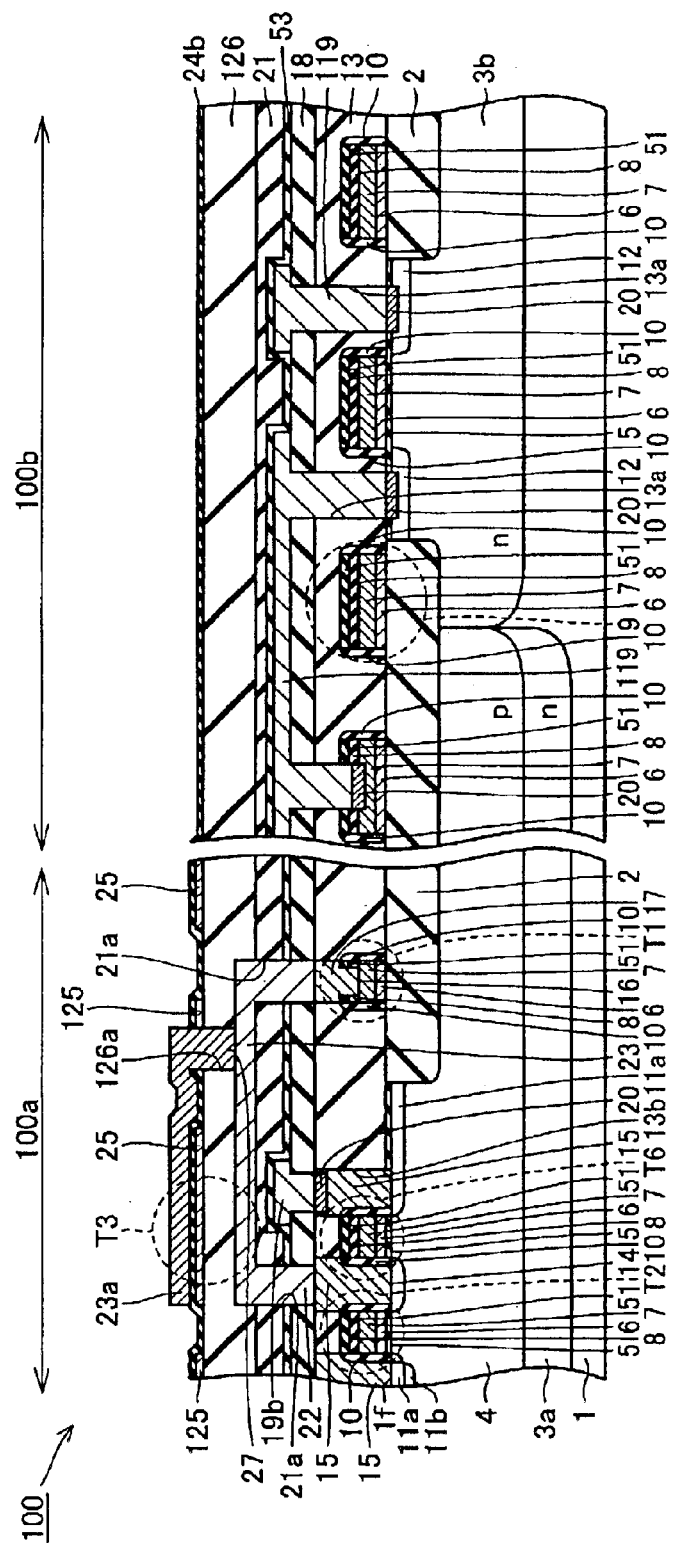
FIG. 49 is a sectional view of the semiconductor device of FIG. 47 taken along line XLIX—XLIX.

Referring to FIGS. 47–49, intermediate interlayer insulation film 126 is deposited on interlayer insulation film 21 so as to cover TFT gate electrode 23. TFT polycrystalline silicons 25 and 125 identified as the TFT body are formed on intermediate interlayer insulation film 126. TFT gate oxide film 24b is formed so as to cover TFT polycrystalline silicons 25 and 125. A resist pattern is formed on TFT gate oxide film 24b. Using the resist pattern as a mask, TFT gate oxide film 24b, TFT polycrystalline silicons 25 and 125, and intermediate interlayer insulation film 126 are etched. Accordingly, contact hole 126a extending to TFT gate electrode 23 is formed. Upper TFT gate electrode 23a is formed so as to cover contact hole 126a and partially cover TFT gate oxide film 24b. The interface region between upper TFT gate electrode 23a and TFT gate 23 correspond to buried contact 27.

Figure 50:
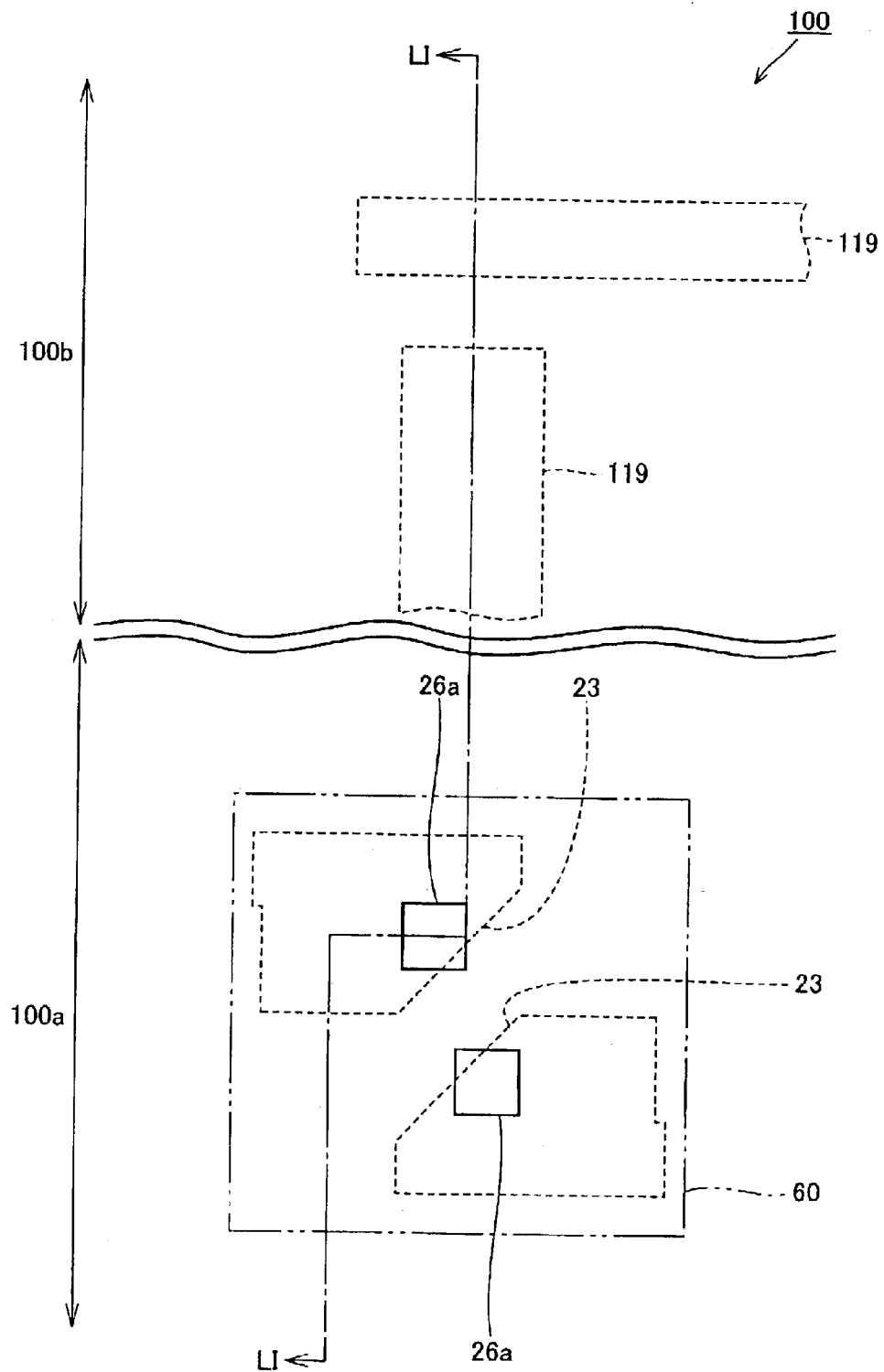
FIG. 50 is a plan view of the semiconductor device of FIG. 41 corresponding to a fourth step of a fabrication method thereof.
Figure 51:
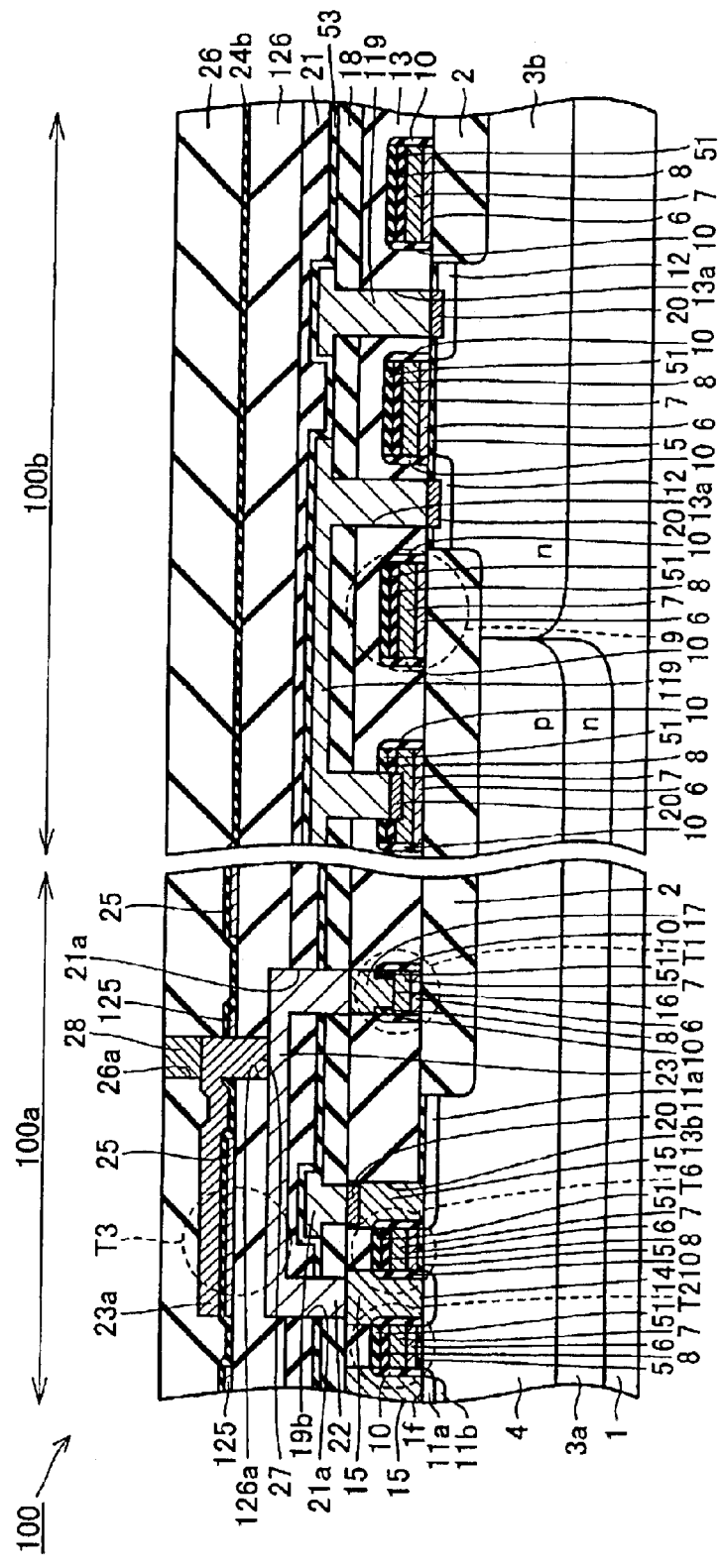
FIG. 51 is a sectional view of the semiconductor device of FIG. 50 taken along line LI—LI.

Referring to FIGS. 50 and 51, interlayer insulation film 26 is formed so as to cover upper TFT gate electrode 23a. A resist pattern is formed on interlayer insulation film 26. Using this resist pattern as a mask, interlayer insulation film 26 is etched to form contact hole 26a. Polypad 28 is formed so as to fill in contact hole 26a. Then, processing steps similar to those of the first embodiment are carried out, resulting in the semiconductor device of the ninth embodiment.

Semiconductor device 100 of the ninth embodiment offers the advantage of the double gate described in the third embodiment and the advantage of the top gate described in the fourth embodiment.

FIG. 51 shows contact hole 126a piercing through TFT polycrystalline silicone 125. Alternatively, a structure that does not pierce through TFT polycrystalline silicon 125 can be employed as long as sufficient connection to TFT gate electrode 23 is established.

In the present embodiment, intermediate interlayer insulation film 126 corresponding to the lower gate insulation film is set thicker than TFT gate oxide film 24b. From the standpoint of improving the TFT performance, the film thickness is preferably set to substantially the same level.

In the present invention, the failure rate was identified based on 100 semiconductor devices of FIG. 3 used for $10^6$ hours. The failure rate was measured corresponding to the case where the capacitance (femtoFarad:fF) of capacitors C1 and C2. The results are shown in FIG. 52.

Figure 52:
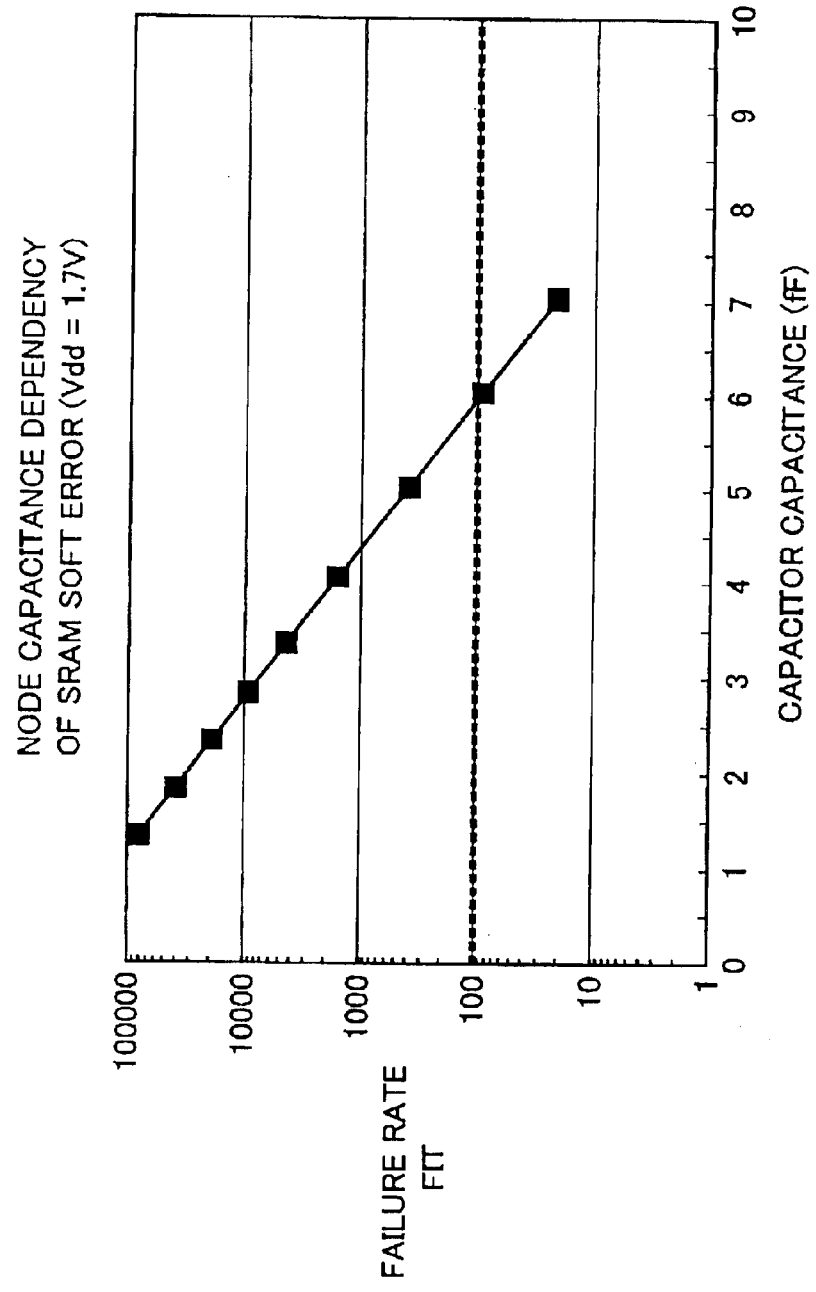
FIG. 52 is a graph representing the relationship between the capacitance of a capacitor and the failure rate.

The vertical axis FIT in FIG. 52 is represented by the following equation:

$$1 FIT = 10^9 \times [(\text{number of disabled devices})/\{(\text{number of operating devices}) \times (\text{operating time(hour)})\}]$$

For example, when one out of a hundred devices used for $10^6$ hours fails, the failure rate is 10FIT.

It is appreciated from FIG. 52 that the capacitance of the capacitor is preferably set to at least 6fF in view of soft error.

It is to be understood that the above embodiments of the present invention are illustrative and not restrictive. The embodiments described here can be subjected to various modification.

For example, the potential of cell plate 40 can be set to the level of power supply potential or ground, instead of ½Vcc (power supply potential). The embodiment of the present invention has at least one of the structural elements of latch circuit 130 formed above access transistor T6, whereby the area of semiconductor device 100 is reduced. Other structural elements such as a driver transistor can be located above the latch circuit.

From the standpoint of microminiaturization, the dimension of each transistor is preferably set to, but not exclusively, to a gate length and a gate width of not more than 0.2 μm for access transistors T5 and T6, a gate length and a gate width of not more than 0.2 μm for driver transistors T1 and T2, and a gate length of not more than 0.5 μm and a gate width of not more than 0.3 μm for load transistors T3 and T4 (thin film transistor).

According to the present invention, a semiconductor device capable of being reduced in size, and dispensable with a refresh operation can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a capacitor storing charge according to a logic level of binary information, located above a semiconductor substrate, and including a storage node;
   an access transistor controlling input and output of charge stored in said capacitor, located at a surface of said semiconductor substrate, and including a pair of impurity regions, one of said pair of impurity regions being electrically connected to said capacitor;

a latch circuit located on said semiconductor substrate, retaining a potential of said storage node of said capacitor; and a bit line connected to the other of said pair of impurity regions of said access transistor;

said latch circuit having at least a portion formed above said bit line.

2. The semiconductor memory device according to claim 1, wherein said latch circuit comprises a flip-flop circuit including a load element, said load element formed of a thin film transistor and disposed above said bit line.

3. The semiconductor memory device according to claim 1, further comprising:

a driver transistor formed on said semiconductor substrate;

a first interlayer insulation film covering said driver transistor, said bit line being formed on said first interlayer insulation film; and a second interlayer insulation film formed on said first interlayer insulation film so as to cover said bit line.

4. The semiconductor memory device according to claim 1, wherein said latch circuit comprises a flip-flop circuit including a load element, said load element being formed of a high resistance element, and formed above said bit line.

5. The semiconductor memory device according to claim 4, wherein said storage node is connected to said load element with a plug layer therebetween, and a portion of said plug layer connected to said load element includes metal.

6. The semiconductor memory device according to claim 4, wherein said storage node and said high resistance element include impurities of a same conductivity type.

7. The semiconductor memory device according to claim 4, further comprising an interlayer insulation film covering said semiconductor substrate, and including a hole, wherein a portion of said storage node includes a sidewall, said portion of said storage node being buried in said hole, and said load element forms contact with the sidewall of said storage node.

8. The semiconductor memory device according to claim 1, further comprising a ground line connected to said latch circuit, wherein said ground line and said bit line are fabricated in the same step.

9. The semiconductor memory device according to claim 1, further comprising an interlayer insulation film covering said semiconductor substrate, and having a hole, said capacitor being formed in said hole.

10. The semiconductor memory device according to claim 1, wherein said capacitor is formed above said latch circuit.

11. The semiconductor memory device according to claim 10, wherein said access transistor has a gate electrode connected to a word line, said capacitor includes two of said capacitors, said two capacitors being provided substantially axially symmetrical to said word lines.

12. The semiconductor memory device according to claim 11, wherein said bit line includes two bit lines, said capacitor being formed so as to overlap with said two bit lines in plane.

13. The semiconductor memory device according to claim 1, wherein said latch circuit further includes a driver transistor, wherein a gate length of said driver transistor, a gate width of said driver transistor, a gate length of said access transistor, and a gate width of said access transistor are substantially identical.

14. The semiconductor memory device according to claim 1, wherein said capacitor has a capacitance of at least 6fF (femtoFarad).

15. A semiconductor device comprising:

a latch circuit located on a semiconductor substrate;

an access transistor located at a surface of said semiconductor substrate, and including a pair of impurity regions, one of said pair of impurity regions being connected to said latch circuit; and a bit line connected to the other of said impurity regions of said access transistor, said latch circuit having at least a portion formed above said bit line.

16. The semiconductor device according to claim 15, wherein said latch circuit comprises a flip-flop circuit including a load transistor as a load element, said load transistor being configured with a thin film transistor, and formed above said bit line.

17. The semiconductor device according to claim 15, wherein said latch circuit comprises a flip-flop circuit including a low resistance element as a load element, said low resistance element being formed above said bit line.

* * * * *